US009786126B2

(12) United States Patent
Arnone et al.

(10) Patent No.: US 9,786,126 B2
(45) Date of Patent: Oct. 10, 2017

(54) SKILL-BASED PROGRESSIVE INTERLEAVED WAGERING SYSTEM

(71) Applicant: Gamblit Gaming, LLC, Glendale, CA (US)

(72) Inventors: Miles Arnone, Sherborn, MA (US); Eric Meyerhofer, Pasadena, CA (US); Frank Cire, Pasadena, CA (US)

(73) Assignee: Gamblit Gaming, LLC, Glendale, CA (US)

( * ) Notice: Subject to any disclaimer, the term of this patent is extended or adjusted under 35 U.S.C. 154(b) by 139 days.

(21) Appl. No.: 14/815,764

(22) Filed: Jul. 31, 2015

(65) Prior Publication Data

US 2016/0035190 A1 Feb. 4, 2016

Related U.S. Application Data

(60) Provisional application No. 62/068,587, filed on Oct. 24, 2014, provisional application No. 62/031,814, filed on Jul. 31, 2014.

(51) Int. Cl.
*G07F 17/00* (2006.01)
*G07F 17/32* (2006.01)

(52) U.S. Cl.
CPC ...... *G07F 17/3258* (2013.01); *G07F 17/3223* (2013.01); *G07F 17/3248* (2013.01); *G07F 17/3267* (2013.01)

(58) Field of Classification Search
CPC ...................................................... G07F 17/32
See application file for complete search history.

(56) References Cited

U.S. PATENT DOCUMENTS 5,413,357 A 5/1995 Schulze et al.
5,718,429 A 2/1998 Keller
5,785,592 A 7/1998 Jacobsen
(Continued)

OTHER PUBLICATIONS

U.S. Appl. No. 14/586,645, Arnone, et al., filed Dec. 30, 2014.
(Continued)

*Primary Examiner* — Reginald Renwick
(74) *Attorney, Agent, or Firm* — Caitlyn Ross

(57) ABSTRACT

A skill-based progressive interleaved wagering system is disclosed, including an interactive controller connected to an application controller, and configured to: communicate application telemetry; receive application credit (AC) information and a wager outcome; communicate an indication to purchase a ticket; display ticket information; communicate an indication to use the ticket; provide the secondary application; communicate secondary telemetry; receive and display certificate information; a wager controller connected to the application controller, and constructed to: receive wager request instructions; determine and communicate the wager outcome; and the application controller connecting the interactive controller and the wager controller, connected to a session controller, and constructed to: receive application telemetry and the wager outcome; receive indication to purchase the ticket; communicate ticket purchase; receive ticket; receive indication to use the ticket; communicate ticket consumption; receive the secondary telemetry; determine whether AC should be awarded from a progressive pool of AC; receive the certificate.

20 Claims, 27 Drawing Sheets

(56) References Cited

U.S. PATENT DOCUMENTS

| | | |
|---|---|---|
| 5,853,324 A | 12/1998 | Kami et al. |
| 5,963,745 A | 10/1999 | Collins et al. |
| 6,050,895 A | 4/2000 | Luciano |
| 6,165,071 A | 12/2000 | Weiss |
| 6,227,974 B1 | 5/2001 | Eilat |
| 6,267,669 B1 | 7/2001 | Luciano |
| 6,685,563 B1 | 2/2004 | Meekins et al. |
| 6,712,693 B1 | 3/2004 | Hettinger |
| 6,761,632 B2 | 7/2004 | Bansemer et al. |
| 6,761,633 B2 | 7/2004 | Riendeau |
| 6,764,397 B1 | 7/2004 | Robb |
| 6,811,482 B2 | 11/2004 | Letovsky |
| 7,118,105 B2 | 10/2006 | Benevento |
| 7,294,058 B1 | 11/2007 | Slomiany |
| 7,326,115 B2 | 2/2008 | Baerlocher |
| 7,361,091 B2 | 4/2008 | Letovsky |
| 7,517,282 B1 | 4/2009 | Pryor |
| 7,575,517 B2 | 8/2009 | Parham et al. |
| 7,682,239 B2 | 3/2010 | Friedman et al. |
| 7,720,733 B2 | 5/2010 | Jung |
| 7,753,770 B2 | 7/2010 | Walker et al. |
| 7,753,790 B2 | 7/2010 | Nguyen |
| 7,766,742 B2 | 8/2010 | Bennett et al. |
| 7,775,885 B2 | 8/2010 | Van Luchene |
| 7,798,896 B2 | 9/2010 | Katz |
| 7,828,657 B2 | 11/2010 | Booth |
| 7,917,371 B2 | 3/2011 | Jung et al. |
| 7,938,727 B1 | 5/2011 | Konkle |
| 7,967,674 B2 | 6/2011 | Baerlocher |
| 7,980,948 B2 | 7/2011 | Rowe |
| 7,996,264 B2 | 8/2011 | Kusumoto et al. |
| 8,012,023 B2 | 9/2011 | Gates |
| 8,047,908 B2 | 11/2011 | Walker |
| 8,047,915 B2 | 11/2011 | Lyle |
| 8,060,829 B2 | 11/2011 | Jung et al. |
| 8,075,383 B2 | 12/2011 | Friedman et al. |
| 8,087,999 B2 | 1/2012 | Oberberger |
| 8,113,938 B2 | 2/2012 | Friedman et al. |
| 8,118,654 B1 | 2/2012 | Nicolas |
| 8,128,487 B2 | 3/2012 | Hamilton et al. |
| 8,135,648 B2 | 3/2012 | Oram |
| 8,137,193 B1 | 3/2012 | Kelly et al. |
| 8,142,272 B2 | 3/2012 | Walker |
| 8,157,653 B2 | 4/2012 | Buhr |
| 8,167,699 B2 | 5/2012 | Inamura |
| 8,177,628 B2 | 5/2012 | Manning |
| 8,182,338 B2 | 5/2012 | Thomas |
| 8,182,339 B2 | 5/2012 | Anderson |
| 8,187,068 B2 | 5/2012 | Slomiany |
| 8,206,210 B2 | 6/2012 | Walker |
| 8,308,544 B2 | 11/2012 | Friedman |
| 8,475,266 B2 | 7/2013 | Arnone |
| 8,480,470 B2 | 7/2013 | Napolitano et al. |
| 8,622,809 B1 | 1/2014 | Arora et al. |
| 2001/0004609 A1 | 6/2001 | Walker et al. |
| 2001/0019965 A1 | 9/2001 | Ochi |
| 2002/0022509 A1 | 2/2002 | Nicastro et al. |
| 2002/0090990 A1 | 7/2002 | Joshi et al. |
| 2002/0175471 A1 | 11/2002 | Faith |
| 2003/0060286 A1 | 3/2003 | Walker et al. |
| 2003/0078103 A1* | 4/2003 | LeMay ............ A63F 13/12 463/43 |
| 2003/0119576 A1 | 6/2003 | McClintic et al. |
| 2003/0139214 A1 | 7/2003 | Wolf et al. |
| 2003/0171149 A1 | 9/2003 | Rothschild |
| 2003/0204565 A1 | 10/2003 | Guo et al. |
| 2003/0211879 A1 | 11/2003 | Englman |
| 2004/0092313 A1 | 5/2004 | Saito |
| 2004/0102238 A1 | 5/2004 | Taylor |
| 2004/0121839 A1 | 6/2004 | Webb |
| 2004/0225387 A1 | 11/2004 | Smith |
| 2005/0003878 A1 | 1/2005 | Updike |
| 2005/0096124 A1 | 5/2005 | Stronach |
| 2005/0116411 A1 | 6/2005 | Herrmann et al. |
| 2005/0192087 A1 | 9/2005 | Friedman et al. |
| 2005/0233791 A1 | 10/2005 | Kane |
| 2005/0233806 A1 | 10/2005 | Kane et al. |
| 2005/0239538 A1 | 10/2005 | Dixon |
| 2005/0269778 A1 | 12/2005 | Samberg |
| 2005/0288101 A1 | 12/2005 | Lockton et al. |
| 2006/0003823 A1 | 1/2006 | Zhang |
| 2006/0003830 A1 | 1/2006 | Walker et al. |
| 2006/0035696 A1 | 2/2006 | Walker |
| 2006/0040735 A1 | 2/2006 | Baerlocher |
| 2006/0068913 A1 | 3/2006 | Walker et al. |
| 2006/0084499 A1 | 4/2006 | Moshal |
| 2006/0084505 A1 | 4/2006 | Yoseloff |
| 2006/0135250 A1 | 6/2006 | Rossides |
| 2006/0154710 A1 | 7/2006 | Serafat |
| 2006/0166729 A1 | 7/2006 | Saffari et al. |
| 2006/0189371 A1 | 8/2006 | Walker et al. |
| 2006/0223611 A1 | 10/2006 | Baerlocher |
| 2006/0234791 A1 | 10/2006 | Nguyen et al. |
| 2006/0240890 A1 | 10/2006 | Walker |
| 2006/0246403 A1 | 11/2006 | Monpouet et al. |
| 2006/0258433 A1 | 11/2006 | Finocchio et al. |
| 2007/0026924 A1 | 2/2007 | Taylor |
| 2007/0035548 A1 | 2/2007 | Jung et al. |
| 2007/0038559 A1 | 2/2007 | Jung et al. |
| 2007/0064074 A1 | 3/2007 | Silverbrook et al. |
| 2007/0087799 A1 | 4/2007 | Van Luchene |
| 2007/0093299 A1 | 4/2007 | Bergeron |
| 2007/0099696 A1 | 5/2007 | Nguyen et al. |
| 2007/0117641 A1 | 5/2007 | Walker et al. |
| 2007/0129149 A1 | 6/2007 | Walker |
| 2007/0142108 A1 | 6/2007 | Linard |
| 2007/0156509 A1 | 7/2007 | Jung et al. |
| 2007/0167212 A1 | 7/2007 | Nguyen |
| 2007/0167239 A1 | 7/2007 | O'Rourke |
| 2007/0173311 A1 | 7/2007 | Morrow et al. |
| 2007/0191104 A1 | 8/2007 | Van Luchene |
| 2007/0202941 A1* | 8/2007 | Miltenberger .......... G07F 17/32 463/25 |
| 2007/0203828 A1 | 8/2007 | Jung et al. |
| 2007/0207847 A1 | 9/2007 | Thomas |
| 2007/0259717 A1 | 11/2007 | Mattice |
| 2007/0293306 A1 | 12/2007 | Nee et al. |
| 2008/0004107 A1 | 1/2008 | Nguyen et al. |
| 2008/0014835 A1 | 1/2008 | Weston et al. |
| 2008/0015004 A1 | 1/2008 | Gatto et al. |
| 2008/0064488 A1 | 3/2008 | Oh |
| 2008/0070659 A1 | 3/2008 | Naicker |
| 2008/0070690 A1 | 3/2008 | Van Luchene |
| 2008/0070702 A1 | 3/2008 | Kaminkow |
| 2008/0096665 A1 | 4/2008 | Cohen |
| 2008/0108406 A1 | 5/2008 | Oberberger |
| 2008/0108425 A1 | 5/2008 | Oberberger |
| 2008/0113704 A1 | 5/2008 | Jackson |
| 2008/0119283 A1 | 5/2008 | Baerlocher |
| 2008/0146308 A1 | 6/2008 | Okada |
| 2008/0161081 A1 | 7/2008 | Berman |
| 2008/0176619 A1 | 7/2008 | Kelly |
| 2008/0191418 A1 | 8/2008 | Lutnick et al. |
| 2008/0195481 A1 | 8/2008 | Lutnick |
| 2008/0234050 A1* | 9/2008 | Joshi ................ G07F 17/32 463/42 |
| 2008/0248850 A1 | 10/2008 | Schugar |
| 2008/0254893 A1 | 10/2008 | Patel |
| 2008/0274796 A1 | 11/2008 | Lube |
| 2008/0274798 A1 | 11/2008 | Walker et al. |
| 2008/0311980 A1 | 12/2008 | Cannon |
| 2008/0318668 A1 | 12/2008 | Ching |
| 2009/0011827 A1 | 1/2009 | Englman |
| 2009/0023489 A1 | 1/2009 | Toneguzzo |
| 2009/0023492 A1 | 1/2009 | Erfanian |
| 2009/0061974 A1 | 3/2009 | Lutnick et al. |
| 2009/0061975 A1 | 3/2009 | Ditchev |
| 2009/0061991 A1 | 3/2009 | Popovich |
| 2009/0061997 A1 | 3/2009 | Popovich |
| 2009/0061998 A1 | 3/2009 | Popovich |
| 2009/0061999 A1 | 3/2009 | Popovich |
| 2009/0082093 A1 | 3/2009 | Okada |
| 2009/0088239 A1 | 4/2009 | Iddings |
| 2009/0098934 A1 | 4/2009 | Amour |

(56) References Cited

U.S. PATENT DOCUMENTS

| | | |
|---|---|---|
| 2009/0118006 A1 | 5/2009 | Kelly et al. |
| 2009/0124344 A1 | 5/2009 | Mitchell et al. |
| 2009/0131158 A1 | 5/2009 | Brunet De Courssou et al. |
| 2009/0131175 A1 | 5/2009 | Kelly et al. |
| 2009/0143141 A1 | 6/2009 | Wells |
| 2009/0149233 A1 | 6/2009 | Strause et al. |
| 2009/0156297 A1 | 6/2009 | Andersson et al. |
| 2009/0176560 A1 | 7/2009 | Herrmann et al. |
| 2009/0176566 A1 | 7/2009 | Kelly |
| 2009/0181777 A1 | 7/2009 | Christiani |
| 2009/0221355 A1 | 9/2009 | Dunaevsky et al. |
| 2009/0239610 A1 | 9/2009 | Olive |
| 2009/0247272 A1 | 10/2009 | Abe |
| 2009/0270164 A1 | 10/2009 | Seelig |
| 2009/0275393 A1 | 11/2009 | Kisenwether |
| 2009/0291755 A1 | 11/2009 | Walker et al. |
| 2009/0309305 A1 | 12/2009 | May |
| 2009/0312093 A1 | 12/2009 | Walker et al. |
| 2009/0325686 A1 | 12/2009 | Davis |
| 2010/0004058 A1 | 1/2010 | Acres |
| 2010/0016056 A1 | 1/2010 | Thomas et al. |
| 2010/0029373 A1 | 2/2010 | Graham et al. |
| 2010/0035674 A1 | 2/2010 | Slomiany |
| 2010/0056247 A1 | 3/2010 | Nicely |
| 2010/0056260 A1 | 3/2010 | Fujimoto |
| 2010/0062836 A1 | 3/2010 | Young |
| 2010/0093420 A1 | 4/2010 | Wright |
| 2010/0093444 A1 | 4/2010 | Biggar et al. |
| 2010/0105454 A1 | 4/2010 | Weber |
| 2010/0120525 A1 | 5/2010 | Baerlocher et al. |
| 2010/0124983 A1 | 5/2010 | Gowin et al. |
| 2010/0137047 A1 | 6/2010 | Englman et al. |
| 2010/0174593 A1 | 7/2010 | Cao |
| 2010/0184509 A1 | 7/2010 | Sylla et al. |
| 2010/0203940 A1 | 8/2010 | Alderucci et al. |
| 2010/0210344 A1 | 8/2010 | Edidin et al. |
| 2010/0227672 A1 | 9/2010 | Amour |
| 2010/0227688 A1 | 9/2010 | Lee |
| 2010/0240436 A1 | 9/2010 | Wilson et al. |
| 2010/0304825 A1 | 12/2010 | Davis |
| 2010/0304839 A1 | 12/2010 | Johnson |
| 2010/0304842 A1 | 12/2010 | Friedman et al. |
| 2011/0009177 A1 | 1/2011 | Katz |
| 2011/0009178 A1 | 1/2011 | Gerson |
| 2011/0045896 A1 | 2/2011 | Sak et al. |
| 2011/0077087 A1 | 3/2011 | Walker et al. |
| 2011/0082571 A1 | 4/2011 | Murdock et al. |
| 2011/0105206 A1 | 5/2011 | Rowe et al. |
| 2011/0107239 A1 | 5/2011 | Adoni |
| 2011/0109454 A1 | 5/2011 | McSheffrey |
| 2011/0111820 A1 | 5/2011 | Filipour |
| 2011/0111837 A1 | 5/2011 | Gagner |
| 2011/0111841 A1 | 5/2011 | Tessmer |
| 2011/0118011 A1 | 5/2011 | Filipour et al. |
| 2011/0201413 A1 | 8/2011 | Oberberger |
| 2011/0207523 A1 | 8/2011 | Filipour et al. |
| 2011/0212766 A1 | 9/2011 | Bowers |
| 2011/0212767 A1 | 9/2011 | Barclay |
| 2011/0218028 A1 | 9/2011 | Acres |
| 2011/0218035 A1 | 9/2011 | Thomas |
| 2011/0230258 A1 | 9/2011 | Van Luchene |
| 2011/0230260 A1 | 9/2011 | Morrow et al. |
| 2011/0230267 A1 | 9/2011 | Van Luchene |
| 2011/0244944 A1 | 10/2011 | Baerlocher |
| 2011/0263312 A1 | 10/2011 | De Waal |
| 2011/0269522 A1 | 11/2011 | Nicely et al. |
| 2011/0275440 A1 | 11/2011 | Faktor |
| 2011/0287828 A1 | 11/2011 | Anderson et al. |
| 2011/0287841 A1 | 11/2011 | Watanabe |
| 2011/0312408 A1 | 12/2011 | Okuaki |
| 2011/0319169 A1 | 12/2011 | Lam |
| 2012/0004747 A1 | 1/2012 | Kelly |
| 2012/0028718 A1 | 2/2012 | Barclay et al. |
| 2012/0058814 A1 | 3/2012 | Lutnick |
| 2012/0077569 A1 | 3/2012 | Watkins |
| 2012/0108323 A1 | 5/2012 | Kelly |
| 2012/0135793 A1 | 5/2012 | Antonopoulos |
| 2012/0202587 A1 | 8/2012 | Allen |
| 2012/0302311 A1 | 11/2012 | Luciano |
| 2012/0322545 A1 | 12/2012 | Arnone et al. |
| 2013/0029760 A1 | 1/2013 | Wickett |
| 2013/0131848 A1 | 5/2013 | Arnone et al. |
| 2013/0190074 A1 | 7/2013 | Arnone et al. |
| 2013/0260869 A1 | 10/2013 | Basallo et al. |
| 2014/0087801 A1 | 3/2014 | Nicely et al. |
| 2014/0087808 A1 | 3/2014 | Basallo et al. |
| 2014/0087809 A1 | 3/2014 | Leupp et al. |

OTHER PUBLICATIONS

U.S. Appl. No. 14/598,151, Arnone, et al., filed Jan. 15, 2015.
U.S. Appl. No. 14/601,063, Arnone, et al., filed Jan. 20, 2015.
U.S. Appl. No. 14/601,108, Arnone, et al., filed Jan. 20, 2015.
U.S. Appl. No. 14/608,000, Arnone, et al., filed Jan. 28, 2015.
U.S. Appl. No. 14/608,087, Arnone, et al., filed Jan. 28, 2015.
U.S. Appl. No. 14/608,093, Arnone, et al., filed Jan. 28, 2015.
U.S. Appl. No. 14/610,897, Arnone, et al., filed Jan. 30, 2015.
U.S. Appl. No. 14/611,077, Arnone, et al., filed Jan. 30, 2015.
U.S. Appl. No. 14/604,629, Arnone, et al., filed Jan. 23, 2015.
U.S. Appl. No. 14/625,475, Arnone, et al., filed Feb. 18, 2015.
U.S. Appl. No. 14/617,852, Arnone, et al., filed Feb. 9, 2015.
U.S. Appl. No. 14/627,428, Arnone, et al., filed Feb. 20, 2015.
U.S. Appl. No. 14/642,427, Arnone, et al., filed Mar. 9, 2015.
U.S. Appl. No. 14/665,991, Arnone, et al., filed Mar. 23, 2015.
U.S. Appl. No. 14/666,010, Arnone, et al., filed Mar. 23, 2015.
U.S. Appl. No. 14/666,022, Arnone, et al., filed Mar. 23, 2015.
U.S. Appl. No. 14/642,623, Arnone, et al., filed Mar. 9, 2015.
U.S. Appl. No. 14/663,337, Arnone, et al., filed Mar. 19, 2015.
U.S. Appl. No. 14/666,284, Arnone, et al., filed Mar. 23, 2015.
U.S. Appl. No. 14/679,885, Arnone, et al., filed Apr. 6, 2015.
U.S. Appl. No. 14/685,378, Arnone, et al., filed Apr. 13, 2015.
U.S. Appl. No. 14/686,675, Arnone, et al., filed Apr. 14, 2015.
U.S. Appl. No. 14/686,678, Arnone, et al., filed Apr. 14, 2015.
U.S. Appl. No. 14/701,430, Arnone, et al., filed Apr. 30, 2015.
U.S. Appl. No. 14/703,721, Arnone, et al., filed May 4, 2015.
U.S. Appl. No. 14/708,138, Arnone, et al., filed May 8, 2015.
U.S. Appl. No. 14/708,141, Arnone, et al., filed May 8, 2015.
U.S. Appl. No. 14/708,160, Arnone, et al., filed May 8, 2015.
U.S. Appl. No. 14/708,161, Arnone, et al., filed May 8, 2015.
U.S. Appl. No. 14/708,162, Arnone, et al., filed May 8, 2015.
U.S. Appl. No. 14/710,483, Arnone, et al., filed May 12, 2015.
U.S. Appl. No. 14/714,084, Arnone, et al., filed May 15, 2015.
U.S. Appl. No. 14/715,463, Arnone, et al., filed May 18, 2015.
U.S. Appl. No. 14/720,620, Arnone, et al., filed May 22, 2015.
U.S. Appl. No. 14/720,624, Arnone, et al., filed May 22, 2015.
U.S. Appl. No. 14/720,626, Arnone, et al., filed May 22, 2015.
U.S. Appl. No. 14/727,726, Arnone, et al., filed Jun. 1, 2015.
U.S. Appl. No. 14/730,183, Arnone, et al., filed Jun. 3, 2015.
U.S. Appl. No. 14/731,321, Arnone, et al., filed Jun. 4, 2015.
U.S. Appl. No. 14/740,078, Arnone, et al., filed Jun. 15, 2015.
U.S. Appl. No. 14/742,517, Arnone, et al., filed Jun. 17, 2015.
U.S. Appl. No. 14/743,708, Arnone, et al., filed Jun. 18, 2015.
U.S. Appl. No. 14/746,731, Arnone, et al., filed Jun. 22, 2015.
U.S. Appl. No. 14/748,122, Arnone, et al., filed Jun. 23, 2015.
U.S. Appl. No. 14/788,581, Arnone, et al., filed Jun. 30, 2015.
U.S. Appl. No. 14/793,685, Arnone, et al., filed Jul. 7, 2015.
U.S. Appl. No. 14/793,704, Arnone, et al., filed Jul. 7, 2015.
U.S. Appl. No. 14/797,016, Arnone, et al., filed Jul. 10, 2015.
U.S. Appl. No. 14/799,481, Arnone, et al., filed Jul. 14, 2015.
U.S. Appl. No. 14/205,303, Arnone, et al., filed Mar. 11, 2014.
U.S. Appl. No. 14/205,306, Arnone, et al., filed Mar. 11, 2014.
U.S. Appl. No. 14/209,485, Arnone, et al., filed Mar. 13, 2014.
U.S. Appl. No. 14/214,310, Arnone, et al., filed Mar. 14, 2014.
U.S. Appl. No. 14/222,520, Arnone, et al., filed Mar. 21, 2014.
U.S. Appl. No. 14/253,813, Arnone, et al., filed Apr. 15, 2014.
U.S. Appl. No. 14/255,253, Arnone, et al., filed Apr. 17, 2014.
U.S. Appl. No. 14/255,919, Arnone, et al., filed Apr. 17, 2014.
U.S. Appl. No. 14/263,988, Arnone, et al., filed Apr. 28, 2014.

(56) References Cited

OTHER PUBLICATIONS

U.S. Appl. No. 14/270,335, Arnone, et al., filed May 5, 2014.
U.S. Appl. No. 14/271,360, Arnone, et al., filed May 6, 2014.
U.S. Appl. No. 13/961,849, Arnone, et al., filed Aug. 7, 2013.
U.S. Appl. No. 13/746,850, Arnone, et al., filed Jan. 22, 2013.
U.S. Appl. No. 14/288,169, Arnone, et al., filed May 27, 2014.
U.S. Appl. No. 14/304,027, Arnone, et al., filed Jun. 13, 2014.
U.S. Appl. No. 14/306,187, Arnone, et al., filed Jun. 16, 2014.
U.S. Appl. No. 14/312,623, Arnone, et al., filed Jun. 23, 2014.
U.S. Appl. No. 14/330,249, Arnone, et al., filed Jul. 14, 2014.
U.S. Appl. No. 14/339,142, Arnone, et al., filed Jul. 23, 2014.
U.S. Appl. No. 14/458,206, Arnone, et al., filed Aug. 12, 2014.
U.S. Appl. No. 14/461,344, Arnone, et al., filed Aug. 15, 2014.
U.S. Appl. No. 14/462,516, Arnone, et al., filed Aug. 18, 2014.
U.S. Appl. No. 14/467,646, Meyerhofer, et al., filed Aug. 25, 2014.
U.S. Appl. No. 14/474,023, Arnone, et al., filed Aug. 29, 2014.
U.S. Appl. No. 14/486,895, Arnone, et al., filed Sep. 15, 2014.
U.S. Appl. No. 14/507,206, Arnone, et al., filed Oct. 6, 2014.
U.S. Appl. No. 14/521,338, Arnone, et al., filed Oct. 22, 2014.
U.S. Appl. No. 14/535,808, Arnone, et al., filed Nov. 7, 2014.
U.S. Appl. No. 14/535,816, Arnone, et al., filed Nov. 7, 2014.
U.S. Appl. No. 14/536,231, Arnone, et al., filed Nov. 7, 2014.
U.S. Appl. No. 14/536,280, Arnone, et al., filed Nov. 7, 2014.
U.S. Appl. No. 14/549,137, Arnone, et al., filed Nov. 20, 2014.
U.S. Appl. No. 14/550,802, Arnone, et al., filed Nov. 21, 2014.
U.S. Appl. No. 14/555,401, Arnone, et al., filed Nov. 26, 2014.
U.S. Appl. No. 14/559,840, Arnone, et al., filed Dec. 3, 2014.
U.S. Appl. No. 14/564,834, Arnone, et al., filed Dec. 9, 2014.
U.S. Appl. No. 14/570,746, Arnone, et al., filed Dec. 15, 2014.
U.S. Appl. No. 14/570,857, Arnone, et al., filed Dec. 15, 2014.
U.S. Appl. No. 14/586,626, Arnone, et al., filed Dec. 30, 2014.
U.S. Appl. No. 14/586,639, Arnone, et al., filed Dec. 30, 2014.
U.S. Appl. No. 14/185,847, Arnone, et al., filed Feb. 20, 2014.
U.S. Appl. No. 14/203,459, Arnone, et al., filed Mar. 10, 2014.
U.S. Appl. No. 14/205,272, Arnone, et al., filed Mar. 11, 2014.
U.S. Appl. No. 13/854,658, Arnone, et al., filed Apr. 1, 2013.
U.S. Appl. No. 13/855,676, Arnone, et al., filed Apr. 2, 2013.
U.S. Appl. No. 13/872,946, Arnone, et al., filed Apr. 29, 2013.
U.S. Appl. No. 13/886,245, Arnone, et al., filed May 2, 2013.
U.S. Appl. No. 13/888,326, Arnone, et al., filed May 6, 2013.
U.S. Appl. No. 13/890,207, Arnone, et al., filed May 8, 2013.
U.S. Appl. No. 13/896,783, Arnone, et al., filed May 17, 2013.
U.S. Appl. No. 13/898,222, Arnone, et al., filed May 20, 2013.
U.S. Appl. No. 13/900,363, Arnone, et al., filed May 22, 2013.
U.S. Appl. No. 13/903,895, Arnone, et al., filed May 28, 2013.
U.S. Appl. No. 13/917,513, Arnone, et al., filed Jun. 13, 2013.
U.S. Appl. No. 13/917,529, Arnone, et al., filed Jun. 13, 2013.
U.S. Appl. No. 13/920,031, Arnone, et al., filed Jun. 17, 2013.
U.S. Appl. No. 13/928,166, Arnone, et al., filed Jun. 26, 2013.
U.S. Appl. No. 13/935,410, Arnone, et al., filed Jul. 3, 2013.
U.S. Appl. No. 13/935,468, Arnone, et al., filed Jul. 3, 2013.
U.S. Appl. No. 13/686,876, Arnone, et al., filed Nov. 27, 2012.
U.S. Appl. No. 13/944,662, Arnone, et al., filed Jul. 17, 2013.
U.S. Appl. No. 13/962,815, Arnone, et al., filed Aug. 8, 2013.
U.S. Appl. No. 13/962,839, Meyerhofer, et al., filed Aug. 8, 2013.
U.S. Appl. No. 14/018,315, Arnone, et al., filed Sep. 4, 2013.
U.S. Appl. No. 14/019,384, Arnone, et al., filed Sep. 5, 2013.
U.S. Appl. No. 14/023,432, Arnone, et al., filed Sep. 10, 2013.
U.S. Appl. No. 13/600,671, Arnone, et al., filed Aug. 31, 2012.
U.S. Appl. No. 13/582,408, Arnone, et al., filed Sep. 26, 2012.
U.S. Appl. No. 13/849,458, Arnone, et al., filed Mar. 22, 2013.
U.S. Appl. No. 14/135,562, Arnone, et al., filed Dec. 19, 2013.
U.S. Appl. No. 14/080,767, Arnone, et al., filed Nov. 14, 2013.
U.S. Appl. No. 14/043,838, Arnone, et al., filed Oct. 1, 2013.
U.S. Appl. No. 14/162,735, Arnone, et al., filed Jan. 23, 2014.
U.S. Appl. No. 14/161,230, Arnone, et al., filed Jan. 22, 2014.
U.S. Appl. No. 14/083,331, Arnone, et al., filed Nov. 18, 2013.
U.S. Appl. No. 14/014,310, Arnone, et al., filed Aug. 29, 2013.
U.S. Appl. No. 14/152,953, Arnone, et al., filed Jan. 10, 2014.
U.S. Appl. No. 14/162,724, Arnone, et al., filed Jan. 23, 2014.
U.S. Appl. No. 14/104,897, Arnone, et al., filed Dec. 12, 2013.
U.S. Appl. No. 14/174,813, Arnone, et al., filed Feb. 6, 2014.
U.S. Appl. No. 14/175,986, Arnone, et al., filed Feb. 7, 2014.
U.S. Appl. No. 14/176,014, Arnone, et al., filed Feb. 7, 2014.
U.S. Appl. No. 14/179,487, Arnone, et al., filed Feb. 12, 2014.
U.S. Appl. No. 14/179,492, Arnone, et al., filed Feb. 12, 2014.
U.S. Appl. No. 14/181,190, Arnone, et al., filed Feb. 14, 2014.
U.S. Appl. No. 14/186,393, Arnone, et al., filed Feb. 21, 2014.
U.S. Appl. No. 14/188,587, Arnone, et al., filed Feb. 24, 2014.

* cited by examiner

SKILL-BASED PROGRESSIVE INTERLEAVED WAGERING SYSTEM

CROSS REFERENCE TO RELATED APPLICATIONS

This application claims the benefit of U.S. Provisional Patent Application No. 62/031,814, filed Jul. 31, 2014 and U.S. Provisional Patent Application No. 62/068,587, filed Oct. 24, 2014, the disclosures of each of which are incorporated by reference herein in their entirety.

FIELD OF THE INVENTION

Embodiments of the present invention are generally related to communications within data processing systems. More particularly, the present invention relates to the communication and processing of wagering data.

BACKGROUND

The gaming industry has traditionally developed electronic gaming machines that present simple gambling games to a user. The communication and processing needs for these simple gambling games are easily met using conventional processing systems.

For example, U.S. Pat. No. 6,905,405 to McClintic describes a conventional gaming device provided with a central processor (CPU) operably coupled to input logic circuitry and output logic circuitry. The input logic circuitry is employed to operably couple CPU to input devices such as, for example, a touch screen segment or physical button, a coin acceptor, a bill acceptor, a player tracking card reader or a credit/debit card reader. The output logic circuitry is employed to operably couple the CPU with output devices such as, for example, a hopper, a video monitor, meter displays, and a printer. The CPU is also operably coupled to controlling software memory, which includes assigned memory locations storing game software and system software. Such controlling software memory dictates when selected graphics or messages are displayed to a player, as well as when play sequences begin and end and management of wager input and award output. The CPU is also operably coupled to a second memory, which is employed to store data indicative of game statistics, number of plays, number of wins, etc. Controlling software memory, a second memory, or other, ancillary memory store data indicative of winning results, such as data representative of one or more symbol combinations, including winning combinations. Second memory may also be used, for example, to store a bit map of the symbol pattern depicted as a matrix display on video monitor. In operation of the gaming device the CPU carries out instructions of the system software to implement an initial display pattern on the video monitor and to enable the input devices. After a wager is received a player activates an initiator element such as a handle, the physical button or the touch screen to initiate a play sequence. At this point, the game software, in conjunction with a random number generator, generates a random symbol configuration at for a random final outcome comprised of a pattern of symbols for depiction on video monitor. System software then animates the video monitor by simulating the movement of visible representations of symbol carriers including symbols thereon so that the player perceives symbol carrier rotational "movement" of each symbol carrier as well as, optionally, rotational movement of the entire group of symbol carriers about a common axis. Once the visible representations of the symbol carriers have stopped, all of the generated, displayed symbols comprising a winning combination or combinations in the matrix display are identified or flagged. The displayed results (pattern of symbols depicted on the video monitor, which may include symbols received from a remote location, is compared with data stored in game software representing winning combinations to determine if any displayed combination on an active pay line is a winning combination. Any identified winning combination or combinations of symbols are then associated with winnings to be distributed to the player according to a paytable of the game software associated with the various possible winning combinations. The various pay line configurations and required combinations of the various indicia for a winning combination within each pay line reside within the game software and are retrieved for comparison to the randomly generated pattern of indicia depicted on the video monitor.

Operation of another conventional computer gaming system is described in U.S. Pat. No. 6,409,602 issued to Wiltshire et al. A game program is executed on server/host computer. It is then determined whether an image is to be displayed on a screen of a client/terminal computer. If so, an image is sent from the server/host computer to client/terminal computer. The image may include any type of graphical information including a bitmap, a JPEG file, a TIFF file or even an encoded audio/video stream such as a compressed video MPEG stream. The image is generated by game computer program and passed to server/host interface program. In turn, the image is transferred over communication pathways to client/terminal computer via the network services provided by server operating system. The image is received by a client/terminal program executing on the client/terminal computer via the network services provided by client operating system. The client/terminal program then causes the image to be displayed on a screen of the client/terminal computer. It is then determined whether an input command has been entered by the patron using the client/terminal computer. The input command may be a keystroke, movement or clicking of the mouse, a voice activated command or even the clicking of a "virtual button" on a touch screen. The client/terminal program causes the input command to be transmitted back to server/host computer via communication pathways, again using network services provided by the client operating system on one end and server operating system on the other. The command is thus received by the server/host interface program, that, in turn, passes the command back to the game program. The game program processes the input command and updates the state of the game accordingly.

However, more complicated gambling games need communication and processing systems that are better suited for implementing these more complicated gambling games. Various aspects of embodiments of the present invention meet such a need.

SUMMARY OF THE INVENTION

Systems and methods in accordance with embodiments of the invention provide a communication and data processing system constructed for a skill-based progressive interleaved wagering system.

An embodiment includes an interactive controller operatively connected to an application controller, the interactive controller configured to: communicate, to the application controller, application telemetry associated with an interactive application provided by the interactive controller, the application telemetry associated with a user; receive, from the application controller, application credit (AC) information and a wager outcome, wherein AC is awarded based on the application telemetry, and wherein determining of the wager outcome is triggered by the application telemetry; communicate, to the application controller, an indication to purchase a ticket, wherein the ticket is associated with an AC value and redeemable for a secondary application session; receive, from the application controller, ticket display instructions; display ticket information associated with the ticket based on the ticket display instructions; communicate, to the application controller, an indication to use the ticket; provide, to the user, the secondary application; communicate, to the application controller, secondary telemetry associated with the secondary application; receive, from the application controller, certificate display instructions, wherein a certificate is associated with an AC award based on the secondary telemetry; and display certificate information based on the certificate display instructions; a wager controller operatively connected to the application controller, the wager controller constructed to: receive, from the application controller, wager request instructions; determine the wager outcome based on the wager request instructions; communicate, to the application controller, wager outcome data comprising the wager outcome; and the application controller operatively connecting the interactive controller and the wager controller, and operatively connected to a session controller, the application controller constructed to: receive, from the interactive controller, the application telemetry; scan the application telemetry to determine whether to trigger a wager; when a wager is triggered, generate wager request instructions; instruct the wager controller by communicating the wager request instructions to the wager controller; receive, from the wager controller, the wager outcome data; scan the wager outcome data to determine the wager outcome; scan the application telemetry to determine whether to award AC to the user; when AC is awarded to the user, communicate, to the interactive controller, the AC information and the wager outcome; receive, from the interactive controller, the indication to purchase the ticket; scan the indication to purchase the ticket to determine ticket purchase information; generate ticket purchase instructions based on the ticket purchase information; instruct the session controller by communicating the ticket purchase instructions to the session controller; receive, from the session controller, the ticket; scan the ticket to determine ticket information; generate the ticket display instructions based on the ticket information; instruct the interactive controller by communicating the ticket display instructions to the interactive controller; receive, from the interactive controller, the indication to use the ticket; scan the indication to use the ticket to determine ticket consumption information; generate ticket consumption instructions based on the ticket consumption information; instruct the session controller by communicating, to the session controller, ticket consumption instructions; receive, from the interactive controller, the secondary telemetry; scan the secondary telemetry to determine whether AC should be awarded to the user from a progressive pool of AC; when AC should be awarded from the progressive pool of AC, generate certificate creation instructions; instruct the session controller by communicating the certificate creation instructions to the session controller; receive, from the session controller, the certificate; scan the certificate to determine certificate information; generate certificate display instructions based on the certificate information; and instruct the interactive controller by communicating the certificate display instructions to the interactive controller.

In a further embodiment, the interactive controller and the application controller are constructed from the same device, and the application controller is operatively connected to the wager controller using a communication link.

In a further embodiment, the wager controller and the application controller are constructed from the same device, and the application controller is operatively connected to the interactive controller using a communication link.

In a further embodiment, one or more users contribute to the progressive pool of AC.

In a further embodiment, the one or more users contribute a portion of AC awarded based on application telemetry, to the progressive pool of AC by communicating the portion to the session controller.

In a further embodiment, a sponsor contributes AC to the progressive pool of AC.

In a further embodiment, the ticket is associated with a jurisdiction.

In a further embodiment, the ticket is associated with an operator.

An embodiment includes a wager controller of the skill-based progressive interleaved wagering system operatively connected to an application controller, the wager controller constructed to: receive, from the application controller, wager request instructions; determine a wager outcome based on the wager request instructions; communicate, to the application controller, wager outcome data comprising the wager outcome; and the application controller of the skill-based progressive interleaved wagering system operatively connecting the wager controller to an interactive controller using a communication link, and operatively connected to a session controller, the application controller constructed to: receive, from the interactive controller, application telemetry associated with an interactive application provided by the interactive controller, the application telemetry associated with a user; scan the application telemetry to determine whether to trigger a wager; when a wager is triggered, generate wager request instructions; instruct the wager controller by communicating the wager request instructions to the wager controller; receive, from the wager controller, the wager outcome data; scan the wager outcome data to determine the wager outcome; scan the application telemetry to determine whether to award application credit (AC) to the user based on the application telemetry; when AC is awarded to the user, communicate, to the interactive controller, the AC information and the wager outcome; receive, from the interactive controller, an indication to purchase the ticket; scan the indication to purchase the ticket to determine ticket purchase information; generate ticket purchase instructions based on the ticket purchase information; instruct the session controller by communicating the ticket purchase instructions to the session controller; receive, from the session controller, the ticket; scan the ticket to determine ticket information; generate ticket display instructions based on the ticket information; instruct the interactive controller by communicating the ticket display instructions to the interactive controller; receive, from the interactive controller, an indication to use the ticket; scan the indication to use the ticket to determine ticket consumption information; generate ticket consumption instructions based on the ticket consumption information; instruct the session controller by communicating, to the session controller, ticket consumption instructions; receive, from the interactive controller, secondary telemetry associated with a secondary application provided by the interactive controller; scan the secondary telemetry to determine whether AC should be awarded to the user from a progressive pool of AC; when AC should be awarded from the progressive pool of AC, generate certificate creation instructions; instruct the session controller by communicating the certificate creation instructions to the session controller; receive, from the session controller, the certificate; scan the certificate to determine certificate information; generate certificate display instructions based on the certificate information; and instruct the interactive controller by communicating the certificate display instructions to the interactive controller.

An embodiment includes an interactive controller of the skill-based progressive interleaved wagering system operatively connected to an application controller, the interactive controller configured to: communicate, to the application controller, application telemetry associated with an interactive application provided by the interactive controller, the application telemetry associated with a user; receive, from the application controller, application credit (AC) information and a wager outcome, wherein AC is awarded based on the application telemetry, and determining of the wager outcome is triggered by the application telemetry; communicate, to the application controller, an indication to purchase a ticket, wherein the ticket is associated with an AC value and redeemable for a secondary application session; receive, from the application controller, ticket display instructions; display ticket information associated with the ticket based on the ticket display instructions; communicate, to the application controller, an indication to use the ticket; provide, to the user, the secondary application; communicate, to the application controller, secondary telemetry associated with the secondary application; receive, from the application controller, certificate display instructions, wherein a certificate is associated with an AC award based on the secondary telemetry; and display certificate information based on the certificate display instructions; and the application controller of the skill-based progressive interleaved wagering system operatively connecting the interactive controller to a wager controller, and operatively connected to a session controller, the application controller constructed to: receive, from the interactive controller, the application telemetry; scan the application telemetry to determine whether to trigger a wager; when a wager is triggered, generate wager request instructions; instruct the wager controller by communicating the wager request instructions to the wager controller; receive, from the wager controller, the wager outcome data; scan the wager outcome data to determine the wager outcome; scan the application telemetry to determine whether to award AC to the user; when AC is awarded to the user, communicate, to the interactive controller, the AC information and the wager outcome; receive, from the interactive controller, the indication to purchase the ticket; scan the indication to purchase the ticket to determine ticket purchase information; generate ticket purchase instructions based on the ticket purchase information; instruct the session controller by communicating the ticket purchase instructions to the session controller; receive, from the session controller, the ticket; scan the ticket to determine ticket information; generate ticket display instructions based on the ticket information; instruct the interactive controller by communicating the ticket display instructions to the interactive controller; receive, from the interactive controller, the indication to use the ticket; scan the indication to use the ticket to determine ticket consumption information; generate ticket consumption instructions based on the ticket consumption information; instruct the session controller by communicating, to the session controller, ticket consumption instructions; receive, from the interactive controller, the secondary telemetry; scan the secondary telemetry to determine whether AC should be awarded to the user from a progressive pool of AC; when AC should be awarded from the progressive pool of AC, generate certificate creation instructions; instruct the session controller by communicating the certificate creation instructions to the session controller; receive, from the session controller, the certificate; scan the certificate to determine certificate information; generate certificate display instructions based on the certificate information; and instruct the interactive controller by communicating the certificate display instructions to the interactive controller.

DETAILED DESCRIPTION

Figure 1A:
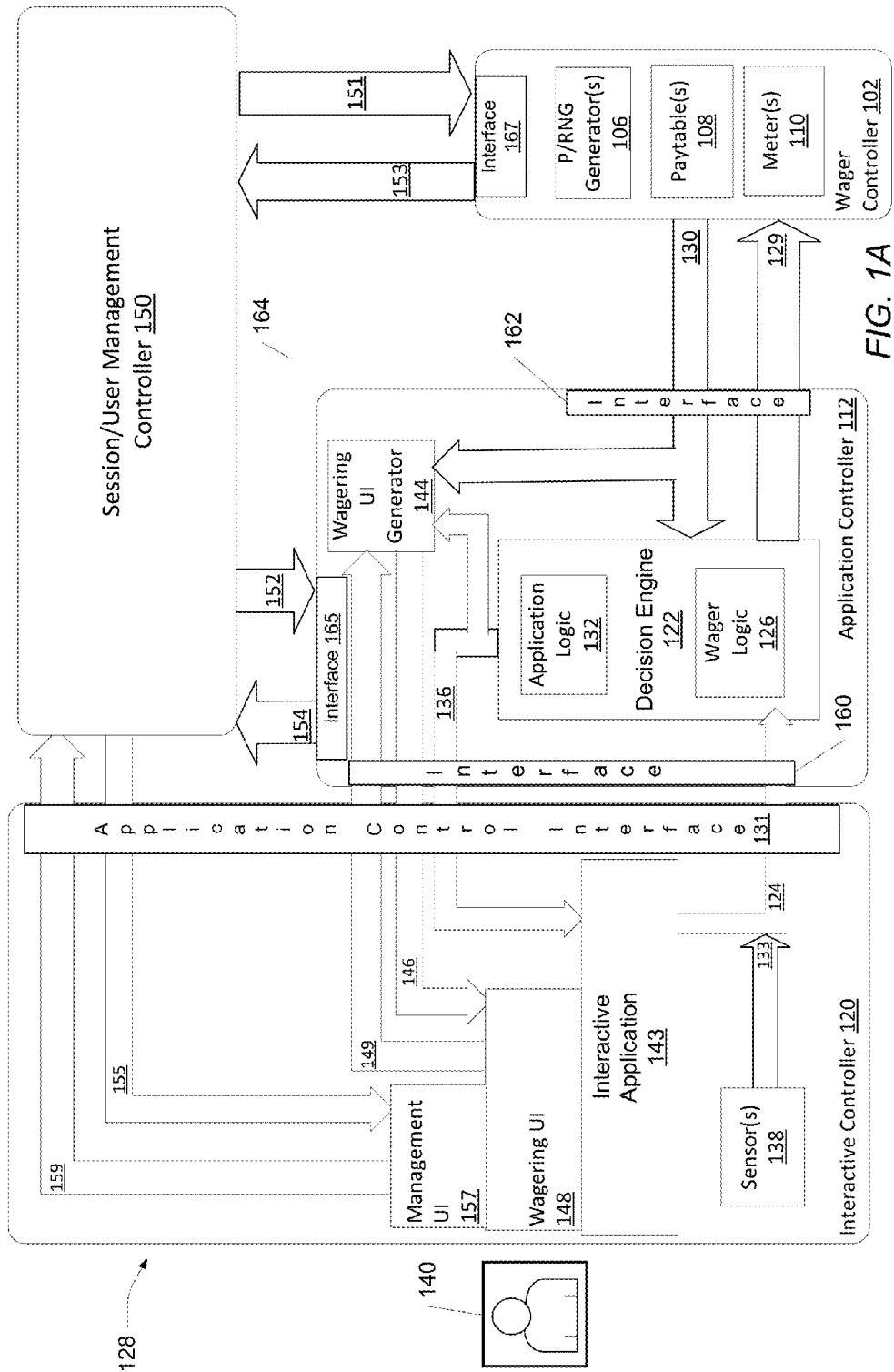
FIG. 1A is a diagram of a structure of a skill-based progressive interleaved wagering system in accordance with various embodiments of the invention.

A skill-based progressive interleaved wagering system interleaves wagering with non-wagering activities. In some embodiments of a skill-based progressive interleaved wagering system an interactive application executed by an interactive controller provides non-wagering components of the skill-based progressive interleaved wagering system. The interactive controller is operatively connected to an application controller that manages and configures the interactive controller and the interactive application, and determines when wagers should be interleaved with the operations of the interactive application. The application controller is further operatively connected to a wager controller that provides one or more wagering propositions for one or more wagers.

In some embodiments, the interactive controller also executes a wagering user interface that is used to display data about a wagering process, including but not limited a wager outcome of a wager made in accordance with a wagering proposition. The content of the wagering user interface is controlled by the application controller and includes content provided by the wager controller.

In various embodiments, the interactive controller executes a user management interface that a user uses to manage a user profile including an electronic wallet for deposit and withdrawals of credits used for wagering.

In several embodiments, a user or user interactions are represented in a skill-based progressive interleaved wagering system by the electronic representation of interactions between the user and the interactive application, typically received via a user interface of the interactive application, and a user profile of the skill-based progressive interleaved wagering system associated with the user.

Many different types of interactive applications may be utilized with the skill-based progressive interleaved wagering system. In some embodiments, the interactive application reacts to the physical activity of the user. In these embodiments, the user interacts with the interactive application through one or more sensors that monitor the user's physical activities. Such sensors may include, but are not limited to, physiological sensors that monitor the physiology of the user, environmental sensors that monitor the physical environment of the user, accelerometers that monitor changes in motion of the user, and location sensors that monitor the location of the user such as global positioning sensors.

In some embodiments, the interactive application is a skill-based interactive game that is played by the user.

In some embodiments, the interactive application is a tool used by the user to achieve some useful goal.

In operation, a user interacts with the interactive application using various types of elements of the interactive application in an interactive application environment. Elements are interactive application resources utilized by the user within the interactive application environment to provide an interactive experience for the user. Wagers of credits are made in accordance with a wagering proposition as triggered by the user's use of one or more of the elements of the interactive application. Wager outcomes of wagers of credits made in accordance with the wagering proposition can cause consumption, loss or accrual of credits.

In accordance with some embodiments, wager outcomes of wagering events can influence elements in the interactive application such as, but not limited to, providing one or more new elements, restoring one or more consumed elements, causing the loss of one or more elements, and restoration or placement of one or more fixed elements.

In various embodiments, the wagers may be made using one or more credits (Cr).

In some embodiments, Cr can be one or more credits that are purchased using, and redeemed in, a real world currency having a real world value.

In many embodiments, Cr can be one or more credits in a virtual currency. Virtual currency is an alternate currency that can be acquired, purchased or transferred by or to a user, but does not necessarily directly correlate to a real world currency. In many such embodiments, Cr in a virtual currency are allowed to be purchased using a real world currency but are prevented from being redeemed in a real world currency having a real world value.

In several embodiments, during interaction with the interactive application using the elements, a user can optionally consume and/or accrue application environment credit (AC) within the interactive application as a result of the user's use of the interactive application. AC can be in the form of, but is not limited to, application environment credits, experience points, and points generally.

In various embodiments, when the interactive application is a skill-based interactive game, AC is awarded to a player of the skill-based interactive game on the basis of the player's skillful play of the skill-based interactive game. In such embodiments, AC may be analogous to the score in a typical video game. The skill-based interactive game can have one or more scoring criteria, embedded within an application controller and/or an interactive controller that provides the skill-based interactive game, that reflect user performance against one or more goals of the skill-based interactive game.

In many embodiments, AC can be used to purchase in-application items, including but not limited to, application elements that have particular properties, power ups for existing items, and other item enhancements.

In some embodiments, AC may be used to earn entrance into a sweepstakes drawing, to earn entrance in a tournament with prizes, to score in the tournament, and/or to participate and/or score in any other game event.

In several embodiments, AC can be stored on a user-tracking card or in a network-based user tracking system where the AC is attributed to a specific user.

In many embodiments, a wagering proposition includes a wager of AC for a wager outcome of a randomly generated payout of interactive application AC, elements, and/or objects in accordance with a wagering proposition.

In a number of embodiments, a wager of an amount of Cr results in a wager outcome of a payout of AC, elements, and/or objects that have an Cr value if cashed out.

In some embodiments, such as when an interactive application is a skill-based interactive game, interactive application objects include in-application objects that may be used by a player of the skill-based interactive game to enhance the player's gameplay of the skill-based interactive game. Such objects include, but are not limited to, power-ups, enhanced in-application items, and the like. In some embodiments, the interactive application objects include objects that are detrimental to the player's play of the skill-based interactive game such as, but not limited to, obstructions in the game space, a temporary player handicap, an enhanced opponent, and the like.

In some embodiments, elements in an interactive application include, but are not limited to, enabling elements (EE) that are interactive application environment resources utilized during the user's use of the interactive application and whose utilization by the user while using the interactive application triggers execution of a wager in accordance with a wagering proposition. In another embodiment, elements in an interactive application include, but are not limited to, a reserve enabling element (REE), that is an element that converts into one or more enabling elements upon occurrence of a release event during an interactive user session. In yet another embodiment, elements in an interactive application include, but are not limited to, an actionable element (AE) that is an element that is acted upon during use of the interactive application to trigger a wager in accordance with a wagering proposition and may or may not be restorable during normal play of the interactive application. In yet another embodiment, elements in an interactive application include, but are not limited to, a common enabling element (CEE) that is an element that may be shared by two or more users and causes a wagering event and associated wager to be triggered in accordance with the wagering proposition when used by one of the users during use of the interactive application. In some embodiments, in progressing through interactive application use, a user can utilize elements during interactions with a controlled entity (CE). A CE is a character, entity, inanimate object, device or other object under control of a user.

In accordance with some embodiments of a skill-based progressive interleaved wagering system, the triggering of the wagering event and/or wager can be dependent upon an interactive application environment variable such as, but not limited to, a required object (RO), a required environmental condition (REC), or a controlled entity characteristic (CEC). A RO is a specific interactive application object in an interactive application acted upon for an AE to be completed. A non-limiting example of an RO is a specific key needed to open a door. An REC is an interactive application state present within an interactive application for an AE to be completed. A non-limiting example of an REC is daylight whose presence enables a character to walk through woods. A CEC is a status of the CE within an interactive application for an AE to be completed. A non-limiting example of a CEC is requirement that a CE have full health points before entering battle. Although various interactive application resources such as, but not limited to, the types of interactive application elements as discussed herein may be used to trigger a wager in accordance with a wagering proposition, one skilled in the art will recognize that any interactive application resource can be utilized in a skill-based progressive interleaved wagering system to trigger of a wager as appropriate to the specification of a specific application in accordance with various embodiments of the invention.

In several embodiments, a skill-based progressive interleaved wagering system can utilize an application controller to monitor use of the interactive application executed by an interactive controller for detecting a trigger of a wagering event. The trigger for the wagering event can be detected by the application controller from the utilization of the interactive application in accordance with at least one wagering event occurrence rule. The trigger of the wagering event can be communicated to a wager controller. In response to notification of the trigger, the wager controller executes a wager in accordance with a wagering proposition. In addition, use of an interactive application in a skill-based progressive interleaved wagering system can be modified by the application controller based upon the wager outcome.

In several embodiments, a wagering event occurrence can be determined from one or more application environment variables within an interactive application that are used to trigger a wager and/or associated wager in accordance with a wagering proposition. Application environment variables can include, but are not limited to, passage of a period of time during skill-based progressive interleaved wagering system interactive application use, a result from a skill-based progressive interleaved wagering system interactive application user session (such as, but not limited to, achieving a goal or a particular score), a user action that is a consumption of an element, or a user action that achieves a combination of elements to be associated with a user profile.

In numerous embodiments, an interactive application instruction is an instruction to an interactive controller and/or an interactive application to modify an interactive application state or modify one or more interactive application resources. In some embodiments, the interactive application instructions may be based upon one or more of a wager outcome and application environment variables. An interactive application instruction can modify any aspect of an interactive application, such as, but not limited to, an addition of a period of time available for a current interactive application user session for the interactive application of skill-based progressive interleaved wagering system, an addition of a period of time available for a future skill-based progressive interleaved wagering system interactive application user session or any other modification to the interactive application elements that can be utilized during interactive application use. In some embodiments, an interactive application instruction can modify a type of element whose consumption triggers a wagering event occurrence. In many embodiments, an interactive application instruction can modify a type of element whose consumption is not required in a wagering event occurrence.

In a number of embodiments, a user interface can be utilized that depicts a status of the interactive application in the skill-based progressive interleaved wagering system. A user interface can depict any aspect of an interactive application including, but not limited to, an illustration of skill-based progressive interleaved wagering system interactive application use advancement as a user uses the skill-based progressive interleaved wagering system.

In some embodiments, a skill-based progressive interleaved wagering system including an application controller operatively connected to a wager controller and operatively connected to an interactive controller may provide for interleaving entertainment content from an interactive application with wagering. The skill-based progressive interleaved wagering system provides for random wager outcomes in accordance with the wagering proposition that are independent of user skill while providing an interactive experience to the user that may be shaped by the user's skill.

In several embodiments, an application controller of a skill-based progressive interleaved wagering system may provide for a communications interface for asynchronous communications between a wager controller and an interactive application provided by an interactive controller, by operatively connecting the interactive controller, and thus the interactive controller's interactive application, with the wager controller. In some embodiments, asynchronous communications provided for by a skill-based progressive interleaved wagering system may reduce an amount of idle waiting time by an interactive controller of the skill-based progressive interleaved wagering system, thus increasing an amount of processing resources that the interactive controller may provide to an interactive application or other processes of the interactive controller. In many embodiments, asynchronous communications provided for by a skill-based progressive interleaved wagering system reduces an amount of idle waiting time by a wager controller, thus increasing an amount of processing resources that the wager controller may provide to execution of wagers to determine wager outcomes, and other processes provided by the wager controller. In some embodiments, a wager controller of a skill-based progressive interleaved wagering system may be operatively connected to a plurality of interactive controllers through one or more application controllers and the asynchronous communications provided for by the one or more application controllers allows the wager controller to operate more efficiently and provide wager outcomes to a larger number of interactive controllers than would be achievable without the one or more application controllers of the skill-based progressive interleaved wagering system.

In some embodiments, a skill-based progressive interleaved wagering system including an application controller operatively connected to a wager controller and operatively connected to an interactive controller may provide for simplified communication protocols for communications of the interactive controller as the interactive controller may communicate user interactions with an interactive application provided by the interactive controller to the application controller without regard to a nature of a wagering proposition to be interleaved with processes of the interactive application.

In various embodiments, a skill-based progressive interleaved wagering system including an application controller operatively connected to a wager controller and operatively connected to an interactive controller may provide for simplified communication protocols for communications of the wager controller as the wager controller may receive wager requests and communicate wager outcomes without regard to a nature of an interactive application provided by the interactive controller.

Skill-Based Progressive Wagering Interleaved Systems

FIG. 1A is a diagram of a structure of a skill-based progressive interleaved wagering system in accordance with various embodiments of the invention. The skill-based progressive interleaved wagering system 128 includes an interactive controller 120, an application controller 112, and a wager controller 102. The interactive controller 120 is operatively connected to, and communicates with, the application controller 112. The application controller 112 is also operatively connected to, and communicates with, the wager controller 102.

In several embodiments, the wager controller 102 is a controller for providing one or more wagering propositions provided by the skill-based progressive interleaved wagering system 128 and executes wagers in accordance with the wagering propositions. Types of value of a wager can be one or more of several different types. Types of value of a wager can include, but are not limited to, a wager of an amount of Cr corresponding to a real currency or a virtual currency, a wager of an amount of AC earned by the player through use of an interactive application, a wager of an amount of elements of an interactive application, and a wager of an amount of objects used in an interactive application. A wager outcome determined for a wager in accordance with a wagering proposition can increase or decrease an amount of the type of value used in the wager, such as, but not limited to, increasing or decreasing an amount of Cr for a wager of Cr. In various embodiments, a wager outcome determined for a wager in accordance with a wagering proposition can increase or decrease an amount of a type of value that is different than a type of value of the wager, such as, but not limited to, increasing an amount of an object of an interactive application for a wager of Cr.

In many embodiments, the wager controller 120 includes one or more pseudo random or random number generators (P/RNG) 106 for generating random results, one or more paytables 108 for determining a wager outcome from the random results, and one or more credit or value meters 110 for storing amounts of wagered and won credits.

In operation, the one or more P/RNG generators 106 execute processes that generate random or pseudo random results. The one or more paytables 108 are tables that map the random or pseudo random results a wager outcome including an amount of Cr, AC, elements or objects won as a function of multiuser interleaved wagering system use. There can be one or more paytables 108 in the wager controller 102. The paytables 108 are used to implement one or more wagering propositions in conjunction with a random output of the random or pseudo random results. For example, in one embodiment of a wager controller, the wager controller continuously generates pseudo random numbers using P/RNG generators 106. A most current pseudo random number is stored in a buffer. When the wager controller receives a request for a wager outcome, the wager controller uses the stored pseudo random number along with a paytable selected from paytables 108. The paytable includes a mapping of values in the range of values of the pseudo random number to specified multipliers to be applied to the number of credits wagered. The multiplier is applied to an amount of wagered elements and the resultant product is a wagering outcome for a wagering proposition.

In some embodiments, a range of the value of the pseudo random number is mapped to a symbol representing a random element of a traditional gambling game, and the mapped to symbol is used in conjunction with the paytable. In one such embodiment, the pseudo random number is mapped to a card of a deck of cards. In another such embodiment, the pseudo random number is mapped to a face of a die. In yet another such embodiment, the pseudo random number is mapped to symbol of a reel strip on a reel slot machine. In yet another such embodiment, the pseudo random number is mapped to a pocket of a roulette wheel. In some embodiments, two or more pseudo numbers are mapped to appropriate symbols to represent a completed gambling proposition. In one such embodiment, two pseudo numbers are mapped to faces of a die to simulate a random outcome generated by throwing two dice, such as in a game of craps. In another such embodiment, multiple pseudo random numbers are mapped to cards from a deck of cards without replacement such that the drawing of cards from a deck of playing cards is achieved for creating a user's hand in a card game. In yet another such embodiment, two or more pseudo random numbers are mapped to a reel strip to create stop positions for a multi-reel slot machine.

In some embodiments, selection of a paytable to use to execute a wager can be based on factors including, but not limited to, interactive application progress a user has achieved through use of the interactive application, user identification, and eligibility of the user for bonus rounds.

In some embodiments, wager controller executes a wager in accordance with a wagering proposition by executing wager execution instructions that define processes of a wagering proposition where the wager execution instructions are formatted in a scripting language. In operation, a decision engine of an application controller generates the wager execution instructions in the form of a script written in the scripting language. The script includes the wager execution instructions that describe how the wager controller is to execute the wagering proposition. The completed script is encoded as wager execution instruction data and communicated to the wager controller by the application controller. The wager controller receives the wager execution instruction data and parses the script encoded in the wager execution instruction data and executes the instructions included in the script to execute the wager.

In some embodiments, a wager controller executes a wager in accordance with a wagering proposition by executing wager execution instructions that define processes of the wagering user interface. In operation, a decision engine of an application controller generates the wager execution instructions and encodes the wager execution instructions into wager execution instruction data that are communicated to the wager controller by the application controller. The wager controller receives the wager execution instruction data and executes the instructions encoded in the wager execution instruction data to execute the wager.

In various embodiments, the interactive controller 120 provides an interactive application 143 and provides human input devices (HIDs) and output devices for interacting with the user 140. The interactive controller 120 provides for user interactions 142 with the interactive application 143 by receiving input from a user through the HIDs and providing outputs such as video, audio and/or other sensory output to the user using the output devices.

The interactive controller 120 is operatively connected to, and communicates with, the application controller 112. The interactive controller communicates application telemetry data 124 to the application controller 112 and receives application instructions and resources 136 from the application controller 112. Via the communication of application instructions and resources 136, the application controller 112 can communicate certain interactive application resources including control parameters to the interactive application 143 to affect the interactive application's execution by the interactive controller 120. In various embodiments, these interactive application control parameters can be based on a wager outcome of a wager that was triggered by an element in the interactive application being utilized or acted upon by the user.

In some embodiments, execution of the interactive application by the interactive controller 120 communicates user interactions with the interactive application to the application controller 112. The application telemetry data 124 includes, but is not limited to, the user's utilization of the elements in the interactive application.

In some embodiments, the interactive application 143 is a skill-based interactive game. In such embodiments, execution of the skill-based interactive game by the interactive controller 120 is based on the user's skillful play of the skill-based interactive game. The interactive controller 120 can also communicate user choices made in the skill-based interactive game to the application controller 112 included in the application telemetry data 124 such as, but not limited to, the user's utilization of the elements of the skill-based interactive game during the user's skillful play of the skill-based interactive game. In such an embodiment, the application controller is interfaced to the interactive controller 120 in order to allow the coupling of the skill-based interactive game to wagers made in accordance with a wagering proposition.

In some embodiments, the interactive controller 120 includes one or more sensors 138 that sense various aspects of the physical environment of the interactive controller 120. Examples of sensors include, but are not limited to: global positioning sensors (GPSs) for sensing communications from a GPS system to determine a position or location of the interactive controller; temperature sensors; accelerometers; pressure sensors; and the like. Sensor telemetry data 133 is communicated by the interactive controller to the application controller 112 as part of the application telemetry data 124. The application controller 112 receives the sensor telemetry data 133 and uses the sensor telemetry data to make wager decisions.

In many embodiments, the interactive controller includes a wagering user interface 148 used to display wagering data to the user.

In various embodiments, an application control interface 131 resident in the interactive controller 120 provides an interface between the interactive controller 120 and the application controller 112. The application control interface 131 implements an interactive controller to application controller communication protocol employing a device-to-device communication protocol.

In some embodiments, the application controller 112 includes an interactive controller interface 160 to an interactive controller. The interactive controller interface 160 provides for the communication of data between the interactive controller and the application controller, including but not limited to wager telemetry data 146, application instructions and resources 136, application telemetry data 124, and sensor telemetry data 133.

In some embodiments, the application controller 112 includes a user management and session controller interface 165 to a user management and session controller. The user management and session controller interface 165 provides for communication of data between the application controller 112 and the user management and session controller, including but not limited to user session control data 152 and user session telemetry data 154.

In many embodiments, application controller 112 provides an interface between the interactive application 143 provided by the interactive controller 120 and a wagering proposition provided by the wager controller 102.

In various embodiments, the application controller 112 includes a wager controller interface 162 to a wager controller. The wager controller interface 162 provides for communication of data between the application controller 112 and the wager controller, including but not limited to wager outcome data 130 and wager execution instructions 129.

The application controller 112 includes a rule-based decision engine 122 that receives telemetry data, such as application telemetry data 124 and sensor telemetry data 133, from the interactive controller 120. The rule-based decision engine 122 uses the telemetry data, along with wager logic 126 to generate wager execution instructions 129 that are used by the application controller 112 to instruct the wager controller 102 to execute a wager. The wager execution instruction data is communicated by the application controller 112 to the wager controller 102. The wager controller 102 receives the wager execution instruction data 129 and executes a wager in accordance with the wager execution instruction data.

In an embodiment, application telemetry data used by a decision engine encodes data about the operation of an interactive application executed by the interactive controller. In some embodiments, the application telemetry data encodes operations taken by a user, such as a user's selection of an object within a game world. In many embodiments, the application telemetry data includes a state of the interactive application, such as values of variables that change as the interactive application is executed. The decision engine includes one or more rules as part of wager logic used by the decision engine to determine when a wager should be triggered. Each rule includes one or more variable values constituting a pattern that is to be matched to one or more variable values encoded in the application telemetry data. Each rule also includes one or more actions that are to be taken if the pattern is matched. Actions can include generating wager execution instruction data and using the wager execution instruction data to instruct a wager controller to execute a wager as described herein. During operation, the decision engine receives application telemetry data from an interactive controller via an interface. The decision engine compares the variable values encoded in the application telemetry data to one or more patterns of one or more rules. If a match between the variable values and a pattern of a rule is found, then the decision engine performs the action of the matched rule.

In some embodiments, the application telemetry data 124 includes, but is not limited to, application environment variables that indicate the state of the interactive application 143 being used by a user 140, interactive controller data indicating the state of the interactive controller 120, and user actions and interactions 142 between the user and the interactive application 143 provided by the interactive controller 120. The wager execution instruction data 129 may include, but are not limited to, an amount and type of the wager, a trigger of the wager, and a selection of a paytable to be used when executing the wager.

In some embodiments, the rule-based decision engine 122 also receives wager outcome data 130 from the wager controller 102. The decision engine 122 uses the wager outcome data 130, in conjunction with the telemetry data and application logic 132, to generate interactive application instruction and resource data 136 that the application controller 112 communicates to the interactive controller 120 via interfaces 160 and 131.

In an embodiment, wager outcome data used by a decision engine encodes data about the execution of a wager executed by a wager controller. In some embodiments, the wager outcome data encodes values of variables including an amount of credits wagered, an amount of credits won and values of credits stored in one or more meters of the wager controller. In many embodiments, the wager outcome data includes a state of the wager controller, such as values of variables that change as the wager controller executes wagers. The decision engine includes one or more rules as part of application logic used by the decision engine to generate interactive application instruction and resource data. Each rule includes one or more variable values constituting a pattern that is to be matched to one or more variable values encoded in the wager outcome data. Each rule also includes one or more actions that are to be taken if the pattern is matched. Actions can include generating interactive application instruction and resource data and using the interactive application instruction and resource data to instruct an interactive controller to affect execution of an interactive application as described herein. During operation, the decision engine receives wager outcome data from a wager controller via an interface. The decision engine compares the variable values encoded in the wager outcome data to one or more patterns of one or more rules. If a match between the variable values and a pattern of a rule is found, then the decision engine performs the action of the matched rule. In some embodiments, the decision engine uses application telemetry data received from an interactive controller in conjunction with the wager outcome data to generate interactive application instruction and resource data.

The interactive controller receives the interactive application instructions and resource data 136 and uses the interactive application instruction and resource data 136 to configure and instruct the interactive application 143.

In some embodiments, an interactive application operates utilizing a scripting language. The interactive application parses scripts written in the scripting language and executes instructions encoded in the scripts and sets variable values as defined in the scripts. In operation of such embodiments, an application controller generates interactive application instruction and resource data in the form of scripts written in the scripting language that are communicated to an interactive controller. The interactive controller receives the scripts and passes them to the interactive application. The interactive application receives the scripts, parses the scripts and executes the instructions and sets the variable values as encoded in the scripts.

In many embodiments, an interactive application can perform operations as instructed by commands communicated from an application controller. The commands instruct the interactive controller to perform specified operations such as executing specified instructions and/or setting the values of variables utilized by the interactive application. In operation of such embodiments, an application controller generates commands that are encoded into interactive application instruction and resource data that are communicated to an interactive controller. The interactive controller passes the application instruction and resource data to the interactive application. The interactive application parses the application instruction and resource data and performs operations in accordance with the commands encoded in the interactive application instruction and resource data.

In many embodiments, the application controller 112 includes a pseudo random or random result generator used to generate random results that are used by the decision engine to generate portions of the interactive application instruction and resource data 136.

In various embodiments, the rule-based decision engine 122 also determines an amount of AC to award to the user 140 based at least in part on the user's use of the interactive application of the <type of> interleaved wagering system as determined from the application telemetry data 124. In some embodiments, wager outcome data 130 may also be used to determine the amount of AC that should be awarded to the user.

In numerous embodiments, the interactive application is a skill-based interactive game and the AC is awarded to the user for the user's skillful play of the skill-based interactive game.

In addition, the interactive application instruction and resource data 136 are communicated to a wagering user interface generator 144. The wagering user interface generator 144 also receives wager outcome data 130. The wagering user interface generator 144 uses the interactive application instruction and resource data 136 and the wager outcome data 130 to generate wager telemetry instructions 146 used by the application controller 112 to instruct the interactive controller to generate a wagering user interface 148 describing the state of wagering and credit accumulation and loss for the <type of> interleaved wagering system. In some embodiments, the wager telemetry data 146 may include, but is not limited to, amounts of AC and elements earned, lost or accumulated by the user through use of the interactive application as determined from the application decisions, and Cr amounts won, lost or accumulated as determined from the wager outcome data 130 and the one or more meters 110.

In some embodiments, the wager outcome data 130 also includes data about one or more game states of a gambling game executed in accordance with a wagering proposition by the wager controller 102. In various such embodiments, the wagering user interface generator 144 generates a gambling game process display and/or gambling game state display using the one or more game states of the gambling game. The gambling game process display and/or gambling game state display is included in the wager telemetry data 146 that is communicated to the interactive controller 120. The gambling game process display and/or a gambling game state display is displayed by the wagering user interface 148 to the user 140. In other such embodiments, the one or more game states of the gambling game are communicated to the interactive controller 120 and the interactive controller 120 is instructed to generate the gambling game process display and/or gambling game state display of the wagering user interface 148 using the one or more game states of the gambling game for display to the user 140.

In some embodiments, the wager outcome data 130 includes game state data about execution of a gambling game that underlies a wagering proposition, including but not limited to a final state, intermediate state and/or beginning state of the gambling game. For example, in a gambling game that is a slot math-based game, the final state of the gambling game may be reel positions, in a gambling game that is a roulette wheel-based game, the final state may be a pocket where a ball may have come to rest, in a gambling game that is a card-based game, the beginning, intermediate and final states may represent a play of cards, etc.

In some embodiments, an interactive controller generates a wagering user interface by executing instructions that define processes of the wagering user interface where the instructions are formatted in a scripting language. In operation, a wagering user interface generator of an application controller generates instructions in the form of a script written in the scripting language. The script includes instructions that describe how the interactive controller is to display wagering outcome data to a user. The completed script is encoded as wager telemetry data and communicated to the interactive controller by the application controller. The interactive controller receives the wager telemetry data and parses the script encoded in the wager telemetry data and executes the instructions included in the script to generate the wagering user interface.

In many embodiments, an interactive controller generates a wagering user interface based on a document written in a document markup language that includes instructions that define processes of the wagering user interface. In operation, a wagering user interface generator of an application controller generates a document composed in the document markup language. The document includes instructions that describe how the interactive controller is to display wagering outcome data to a user. The completed document is encoded as wager telemetry data and communicated to the interactive controller by the application controller. The interactive controller receives the wager telemetry data and parses the document encoded in the wager telemetry data and executes the instructions encoded into the document to generate the wagering user interface.

In some embodiments, an interactive controller generates a wagering user interface by executing instructions that define processes of the wagering user interface. In operation, a wagering user interface generator of an application controller generates the instructions and encodes the instructions into wager telemetry data that is communicated to the interactive controller by the application controller. The interactive controller receives the wager telemetry data and executes the instructions encoded in the wager telemetry data to generate the wagering user interface.

In various embodiments, an interactive controller includes a data store of graphic and audio display resources that the interactive controller uses to generate a wagering user interface as described herein.

In many embodiments, an application controller communicates graphic and audio display resources as part of wager telemetry data to an interactive controller. The interactive controller uses the graphic and audio display resources to generate a wagering user interface as described herein.

When the user 140 interacts with the wagering user interface 148, wagering user interface telemetry data 149 is generated by the wagering user interface 148 and communicated by the interactive controller 120 to the application controller 112 using interfaces 131 and 160.

The application controller 112 can further operatively connect to the wager controller 102 to determine an amount of credit or elements available and other wagering metrics of a wagering proposition. Thus, the application controller 112 may potentially affect an amount of Cr in play for participation in the wagering events of a gambling game provided by the wager controller 102 in some embodiments. The application controller 112 may additionally include various audit logs and activity meters. In some embodiments, the application controller 112 can also couple to a centralized session and/or user management controller 150 for exchanging various data related to the user and the activities of the user during game play of a skill-based progressive interleaved wagering system.

In many embodiments, one or more users can be engaged in using the interactive application 143 executed by the interactive controller 120. In various embodiments, a skill-based progressive interleaved wagering system can include an interactive application 143 that provides a skill-based interactive game that includes head-to-head play between a single user and a computing device, between two or more users against one another, or multiple users playing against a computer device and/or each other. In some embodiments, the interactive application 143 can be a skill-based interactive game where the user is not skillfully playing against the computer or any other user such as skill-based interactive games where the user is effectively skillfully playing against himself or herself.

In some embodiments, the operation of the application controller 112 does not affect the provision of a wagering proposition by the wager controller 102 except for user choice parameters that are allowable in accordance with the wagering proposition. Examples of user choice parameters include, but are not limited to: wager terms such as but not limited to a wager amount; speed of game play (for example, by pressing a button or pulling a handle of a slot machine); and/or agreement to wager into a bonus round.

In various embodiments, wager outcome data 130 communicated from the wager controller 102 can also be used to convey a status operation of the wager controller 102.

In a number of embodiments, communication of the wager execution instructions 129 between the wager controller 102 and the application controller 112 can further be used to communicate various wagering control factors that the wager controller 102 uses as input. Examples of wagering control factors include, but are not limited to, an amount of Cr, AC, elements, or objects consumed per wagering event, and/or the user's election to enter a jackpot round.

In some embodiments, the application controller 112 utilizes the wagering user interface 148 to communicate certain interactive application data to the user, including but not limited to, club points, user status, control of the selection of choices, and messages which a user can find useful in order to adjust the interactive application experience or understand the wagering status of the user in accordance with the wagering proposition in the wager controller 102.

In some embodiments, the application controller 112 utilizes the wagering user interface 148 to communicate aspects of a wagering proposition to the user including, but not limited to, odds of certain wager outcomes, amount of Cr, AC, elements, or objects in play, and amounts of Cr, AC, elements, or objects available.

In a number of embodiments, the wager controller 102 can accept wager proposition factors including, but not limited to, modifications in the amount of Cr, AC, elements, or objects wagered on each individual wagering event, a number of wagering events per minute the wager controller 102 can resolve, entrance into a bonus round, and other factors. An example of a varying wager amount that the user can choose can include, but is not limited to, using a more difficult interactive application level associated with an amount of a wager. These factors can increase or decrease an amount wagered per individual wagering proposition in the same manner that a standard slot machine player can decide to wager more or less credits for each pull of the handle. In several embodiments, the wager controller 102 can communicate a number of factors back and forth to the application controller 112, via an interface, such that an increase/decrease in a wagered amount can be related to the change in user profile of the user in the interactive application. In this manner, a user can control a wager amount per wagering event in accordance with the wagering proposition with the change mapping to a parameter or component that is applicable to the interactive application experience.

In some embodiments, a user management and session controller 150 is used to authorize a skill-based progressive interleaved wagering system user session. The user management and session controller receives game user session data 152, that may include, but is not limited to, user, interactive controller, application controller and wager controller data from the application controller 112. The user management and session controller 150 uses the user, interactive controller, application controller and wager controller data to regulate a skill-based progressive interleaved wagering system user session. In some embodiments, the user management and session controller 150 may also assert control of a skill-based progressive interleaved wagering system game user session 154. Such control may include, but is not limited to, ending a skill-based progressive interleaved wagering system game user session, initiating wagering in a skill-based progressive interleaved wagering system game user session, ending wagering in a skill-based progressive interleaved wagering system game user session but not ending a user's play of the interactive application portion of the skill-based progressive interleaved wagering system, and changing from real credit wagering in a skill-based progressive interleaved wagering system to virtual credit wagering, or vice versa.

In many embodiments, the user management and session controller 150 manages user profiles for a plurality of users. The user management and session controller 150 stores and manages data about users in order to provide authentication and authorization of users of the skill-based progressive interleaved wagering system 128. In some embodiments, the user management and session controller 150 also manages geolocation information to ensure that the skill-based progressive interleaved wagering system i128 is only used by users in jurisdictions were gaming is approved. In various embodiments, the user management and session controller 150 stores application credits that are associated with the user's use of the interactive application of the skill-based progressive interleaved wagering system 128.

In some embodiments, the user management and session controller 150 communicates user and session management data 155 to the user using a management user interface 157. The user 140 interacts with the management user interface 157 and the management user interface generates management telemetry data 159 that is communicated to the user management and session controller 150.

In some embodiments, the wager controller 102 communicates wager session control data 153 and 151 to and from the user management and session controller 150 using interface 167.

In various embodiments, the application controller operates as an interface between the interactive controller and the wager controller. By virtue of this construction, the wager controller is isolated from the interactive controller allowing the interactive controller to operate in an unregulated environment will allowing the wager controller to operate in a regulated environment.

In some embodiments, a single wager controller may provide services to two or more interactive controllers and/or two or more application controllers, thus allowing a skill-based progressive interleaved wagering system to operate over a large range of scaling.

In various embodiments, multiple types of interactive controllers using different operating systems may be interfaced to a single type of application controller and/or wager controller without requiring customization of the application controller and/or the wager controller.

In many embodiments, an interactive controller may be provided as a user device under control of a user while maintaining the wager controller in an environment under the control of a regulated operator of wagering equipment.

In several embodiments, data communicated between the controllers may be encrypted to increase security of the skill-based progressive interleaved wagering system.

In some embodiments, the application controller isolates trigger logic and application logic as unregulated logic from a regulated wager controller, thus allowing errors in the application logic and/or trigger logic to be corrected, new application logic and/or trigger logic to be used, or modifications to be made to the application logic and/or trigger logic without a need for regulatory approval.

In various embodiments, an interactive application may require extensive processing resources from an interactive controller leaving few processing resources for the functions performed by an application controller and/or a wager controller. By virtue of the architecture described herein, processing loads may be distributed across multiple devices such that operations of the interactive controller may be dedicated to the interactive application and the processes of the application controller and/or wager controller are not burdened by the requirements of the interactive application.

In many embodiments, a skill-based progressive interleaved wagering system operates with its components being distributed across multiple devices. These devices can be connected by communication channels including, but not limited to, local area networks, wide area networks, local communication buses, and/or the like. The devices may communicate using various types of protocols, including but not limited to, networking protocols, device-to-device communications protocols, and the like.

In some embodiments, one or more components of a skill-based progressive interleaved wagering system are distributed in close proximity to each other and communicate using a local area network and/or a communication bus. In several embodiments, an interactive controller and an application controller of a skill-based progressive interleaved wagering system are in a common location and communicate with an external wager controller. In some embodiments, an application controller and a wager controller of a skill-based progressive interleaved wagering system are in a common location and communicate with an external interactive controller. In many embodiments, an interactive controller, an application controller, and a wager controller of a skill-based progressive interleaved wagering system are located in a common location. In some embodiments, a user management and session controller is located in a common location with an application controller and/or a wager controller.

In various embodiments, These multiple devices can be constructed from or configured using a single server or a plurality of servers such that a skill-based progressive interleaved wagering system is executed as a system in a virtualized space such as, but not limited to, where a wager controller and an application controller are large scale centralized servers in the cloud operatively connected to widely distributed interactive controllers via a wide area network such as the Internet or a local area network. In such embodiments, the components of a skill-based progressive interleaved wagering system may communicate using a networking protocol or other type of device-to-device communications protocol.

In many embodiments, a centralized wager controller is operatively connected to, and communicates with, one or more application controllers using a communication link. The centralized wager controller can generate wager outcomes for wagers in accordance with one or more wagering propositions. The centralized wager controller can execute a number of simultaneous or pseudo-simultaneous wagers in order to generate wager outcomes for a variety of wagering propositions that one or more distributed skill-based progressive interleaved wagering systems can use.

In several embodiments, a centralized application controller is operatively connected to one or more interactive controllers and one or more wager controllers using a communication link. The centralized application controller can perform the functionality of an application controller across various skill-based progressive interleaved wagering systems.

In a variety of embodiments, management of user profile data can be performed by a user management and session controller operatively connected to, and communicating with, one or more application controllers, wager controllers and interactive controllers using a communication link. A user management and session controller can manage data related to a user profile. The managed data in the user profile may include, but is not limited to, data concerning controlled entities (characters) in interactive application use, user performance metrics for a type or class of interactive application, interactive application elements acquired by a user; Cr and AC associated with a particular user, and tournament reservations.

Although a user management and session controller is discussed as being separate from an application controller server, a centralized application controller server may also perform the functions of a user management and session controller in some embodiments.

In numerous embodiments, an interactive application server provides a host for managing head-to-head play operating over a network of interactive controllers connected to the interactive application server using a communication link. The interactive application server provides an environment where users can compete directly with one another and interact with other users.

Processing devices connected using a communication link to construct skill-based progressive interleaved wagering systems in accordance with many embodiments of the invention can communicate with each other to provide services utilized by a skill-based progressive interleaved wagering system. In several embodiments, a wager controller can communicate with an application controller using a communication link. In some embodiments, the wager controller can communicate with an application controller to communicate any type of data as appropriate for a specific application. Examples of the data that may be communicated include, but are not limited to, data used to configure the various simultaneous or pseudo simultaneous wager controllers executing in parallel within the wager controller to accomplish skill-based progressive interleaved wagering system functionalities; data used to determine metrics of wager controller performance such as wagers run and/or wager outcomes for tracking system performance; data used to perform audits and/or provide operator reports; and data used to request the results of a wager outcome for use in one or more function(s) operating within the application controller such as, but not limited to, automatic drawings for prizes that are a function of interactive controller performance.

In several embodiments, an application controller can communicate with an interactive application server using a communication link when the interactive application server is also communicating with one or more interactive controllers using a communication link. An application controller can communicate with an interactive application server to communicate any type of data as appropriate for a specific application. The data that may be communicated between an application controller and an interactive application server includes, but is not limited to, the data for management of an interactive application server by an application controller server during a skill-based progressive interleaved wagering system tournament. In an example embodiment, an application controller may not be aware of the relationship of the application controller to the rest of a tournament since the actual tournament play may be managed by the interactive application server. Therefore, management of a skill-based progressive interleaved wagering system can include, but is not limited to tasks including, but not limited to, conducting tournaments according to system programming that can be coordinated by an operator of the skill-based progressive interleaved wagering system; allowing entry of a particular user into a tournament; communicating the number of users in a tournament; and the status of the tournament (such as, but not limited to the amount of surviving users, the status of each surviving user within the game, and time remaining on the tournament); communicating the performance of users within the tournament; communicating the scores of the various users in the tournament; and providing a synchronizing link to connect the application controllers in a tournament with their respective interactive controllers.

In several embodiments, an application controller can communicate with a user management and session controller using a communication link. An application controller can communicate with a user management and session controller to communicate any type of data as appropriate for a specific application. Examples of data communicated between an application controller and a user management and session controller include, but are not limited to, data for configuring tournaments according to system programming conducted by an operator of a skill-based progressive interleaved wagering system; data for exchange of data used to link a user's user profile to an ability to participate in various forms of skill-based progressive interleaved wagering system use (such as but not limited to the difficulty of play set by the application controller server for an interactive application that is a skill-based interactive game); data for determining a user's ability to participate in a tournament as a function of a user's characteristics (such as but not limited to a user's prowess or other metrics used for tournament screening); data for configuring application controller and interactive controller performance to suit preferences of a user on a particular skill-based progressive interleaved wagering system; and data for determining a user's use and wagering performance for the purposes of marketing intelligence; and data for logging secondary drawing awards, tournament prizes, Cr and/or AC into the user profile.

In many embodiments, a skill-based progressive interleaved wagering system can be distributed across one or more processing devices, with the actual location of where various process are executed being located either on an end device (user management and session controller, wager controller, application controller, interactive controller), on servers (user management and session controller, wager controller, application controller, or interactive application server), or a combination of both end devices and servers. In a number of embodiments, certain functions of a wager controller, application controller, and/or interactive application server can operate on a local wager controller, local application controller and/or local interactive controller used to construct a skill-based progressive interleaved wagering system being provided locally on a device. In some embodiments, a controller or server can be part of a server system including multiple servers, where applications can be run on one or more physical devices. Similarly, in particular embodiments, multiple servers can be combined on a single physical device.

In many embodiments, a skill-based progressive interleaved wagering system can be distributed across one or more processing devices that are in close proximity to each other, such as a common enclosure. In such an embodiment, the one or more processing devices can be operatively connected using communication links that incorporate an interdevice communication protocol over a serial or parallel physical link.

Figure 1B:
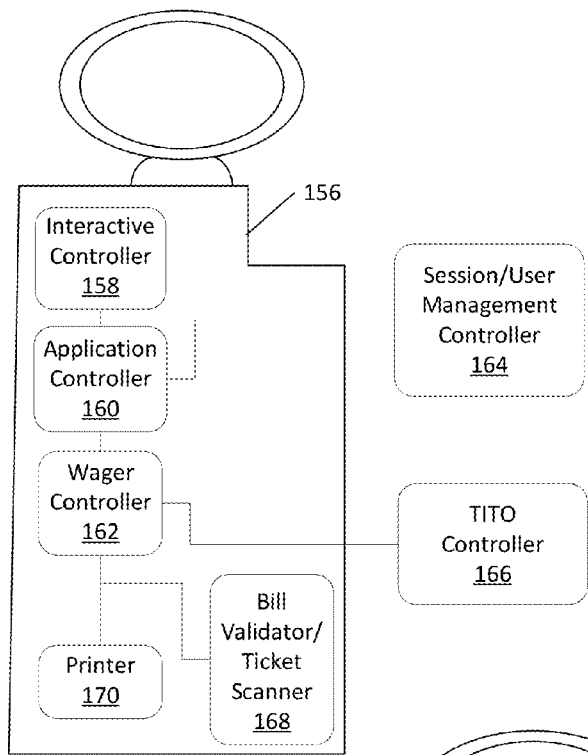
FIG. 1B is a diagram of a land-based configuration of a skill-based progressive interleaved wagering system in accordance with various embodiments of the invention.
Figure 1C:
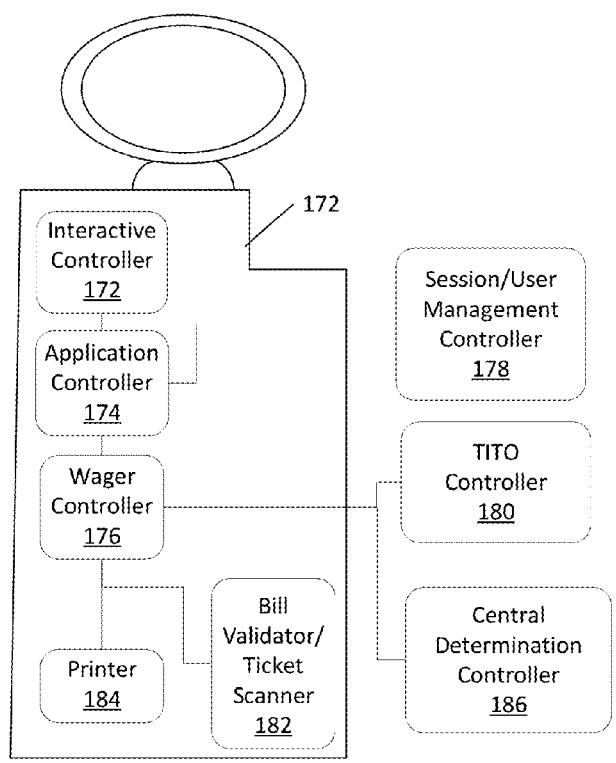
FIG. 1C is another diagram of a land-based configuration of a skill-based progressive interleaved wagering system in accordance with various embodiments of the invention.

FIG. 1B is a diagram of a land-based configuration of a skill-based progressive interleaved wagering system in accordance with various embodiments of the invention. Land-based configurations are suitable for deployment in a gaming establishment. A land-based configuration of a skill-based progressive interleaved wagering system 156 includes an interactive controller 158, an application controller 160 and a wager controller 162 housed in a common enclosure. The application controller 160 is operatively connected to an external session/user management controller 164. The wager controller 162 is operatively connected to a ticket-in-ticket-out (TITO) controller 166 or other type of credit controller. The wager controller 162 communicates with the TITO controller 166 to obtain amounts of credits used for wagering. In operation, the wager controller 162 uses a bill validator/ticket scanner 168 to scan a TITO ticket having indicia of credit account data of a credit account of the TITO controller 166. The wager controller 162 communicates the credit account data to the TITO controller 166. The TITO controller 166 uses the credit account data to determine an amount of credits to transfer to the wager controller 162. The TITO controller 166 communicates the amount of credits to the wager controller 162. The wager controller 162 credits the one or more credit meters with the amount of credits so that the credits can be used when a user makes wagers using the skill-based progressive interleaved wagering system 156. In addition, the wager controller 162 can use the TITO controller 166 along with a ticket printer 170 to generate a TITO ticket for a user. In operation, the wager controller 162 communicates an amount of credits for a credit account on the TITO controller 166. The TITO controller 166 receives the amount of credits and creates the credit account and credits the credit account with the amount of credits. The TITO controller 166 generates credit account data for the credit account and communicates the credit account data to the wager controller 162. The wager controller 162 uses the ticket printer 170 to print indicia of the credit account data onto a TITO ticket.

FIG. 1B is a diagram of another land-based configuration of a skill-based progressive interleaved wagering system in accordance with various embodiments of the invention. A land-based configuration of a skill-based progressive interleaved wagering system 172 includes an interactive controller 172, an application controller 174 and a wager controller 176 housed in a common enclosure. The application controller 174 is operatively connected to an external session/user management controller 178. The wager controller 176 is operatively connected to a ticket-in-ticket-out (TITO) controller 180 or other type of credit controller. The wager controller 176 communicates with the TITO controller 180 to obtain amounts of credits used for wagering. In operation, the wager controller 176 uses a bill validator/ticket scanner 182 to scan a TITO ticket having indicia of credit account data of a credit account of the TITO controller 180. The wager controller 176 communicates the credit account data to the TITO controller 180. The TITO controller 180 uses the credit account data to determine an amount of credits to transfer to the wager controller 176. The TITO controller 180 communicates the amount of credits to the wager controller 176. The wager controller 176 receives the amount of credits and credits the one or more credit meters with the amount of credits so that the credits can be used when a user makes wagers using the skill-based progressive interleaved wagering system 172. In addition, the wager controller 176 can use the TITO controller 180 along with a ticket printer 184 to generate a TITO ticket for a user. In operation, the wager controller 176 communicates an amount of credits for a credit account on the TITO controller 180. The TITO controller 180 receives the amount of credits and creates the credit account and credits the credit account with the amount of credits. The TITO controller 180 generates credit account data for the credit account and communicates the credit account data to the wager controller 176. The wager controller 176 uses the ticket printer 184 to print indicia of the credit account data onto a TITO ticket.

The wager controller 176 is operatively connected to a central determination controller 186. In operation, when the wager controller 176 needs to determine a wager outcome, the wager controller communicates a request to the central determination controller 186 for the wager outcome. The central determination controller 186 receives the wager outcome request and generates a wager outcome in response to the wager request. The central determination controller 186 communicates the wager outcome to the wager controller 176. The wager controller 176 receives the wager outcome and utilizes the wager outcome as described herein. In some embodiments, the wager outcome is drawn from a pool of pre-determined wager outcomes. In some embodiments, the wager outcome is a pseudo random result or random result that is utilized by the wager controller along with paytables to determine a wager outcome as described herein.

Figure 1D:
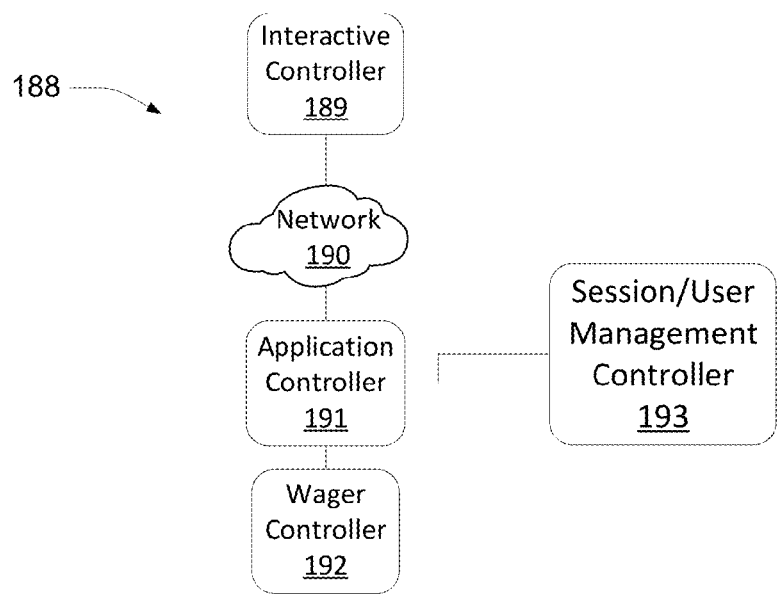
FIG. 1D is a diagram of an interactive configuration of a skill-based progressive interleaved wagering system in accordance with various embodiments of the invention.

FIG. 1D is a diagram of an interactive configuration of a skill-based progressive interleaved wagering system in accordance with various embodiments of the invention. An interactive configuration of a skill-based progressive interleaved wagering system is useful for deployment over a wide area network such as an internet. An interactive configuration of a skill-based progressive interleaved wagering system 188 includes an interactive controller 189 operatively connected by a network 190 to an application controller 191, and a wager controller 192. The application controller 191 is operatively connected to a session/user management controller 193.

Figure 1E:
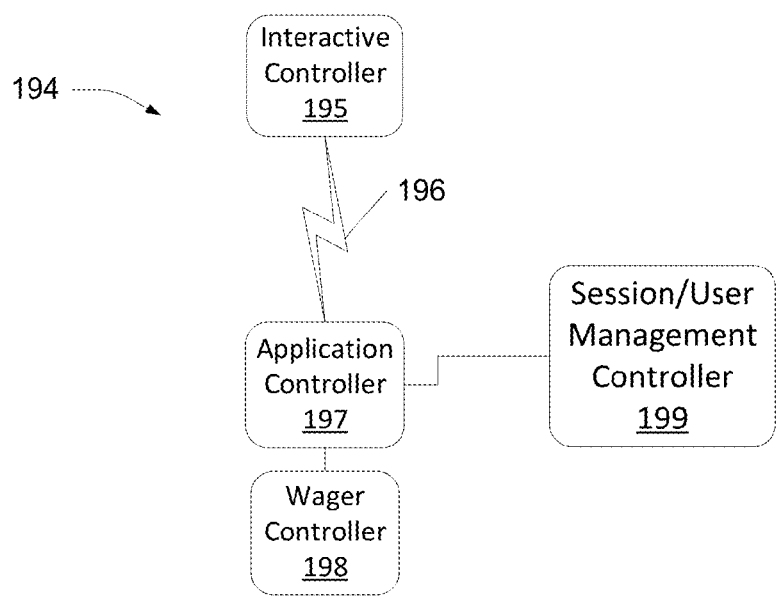
FIG. 1E is a diagram of a mobile configuration of a skill-based progressive interleaved wagering system in accordance with various embodiments of the invention.

FIG. 1E is a diagram of a mobile configuration of a skill-based progressive interleaved wagering system in accordance with various embodiments of the invention. A mobile configuration of a skill-based progressive interleaved wagering system is useful for deployment over wireless communication network, such as a wireless local area network or a wireless telecommunications network. An interactive configuration of a skill-based progressive interleaved wagering system 194 includes an interactive controller 195 operatively connected by a wireless network 196 to an application controller 197, and a wager controller 198. The application controller 197 is also operatively connected to a session/user management controller 199.

FIGS. 2A, 2B, 2C, and 2D are illustrations of interactive controllers of a skill-based progressive interleaved wagering system in accordance with various embodiments of the invention. An interactive controller, such as interactive controller 120 of FIG. 1A, may be constructed from or configured using one or more processing devices configured to perform the operations of the interactive controller. An interactive controller in a skill-based progressive interleaved wagering system may be constructed from or configured using any processing device having sufficient processing and communication capabilities that may be configured to perform the processes of an interactive controller in accordance with various embodiments of the invention. In some embodiments, the construction or configuration of the interactive controller may be achieved through the use of an application control interface, such as application control interface 131 of FIG. 1A, and/or through the use of an interactive application, such as interactive application 143 of FIG. 1A.

Figure 2A:
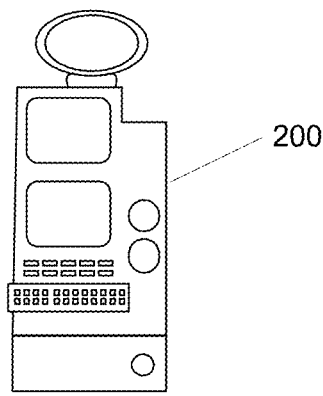
FIGS. 2A, 2B, 2C, and 2D are illustrations of interactive controllers of a skill-based progressive interleaved wagering system in accordance with various embodiments of the invention.

In some embodiments, an interactive controller may be constructed from or configured using an electronic gaming machine 200 as shown in FIG. 2A. The electronic gaming machine 200 may be physically located in various types of gaming establishments.

Figure 2B:
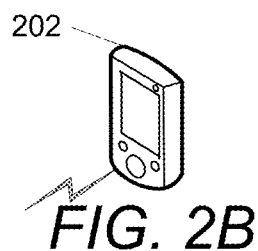

In many embodiments, an interactive controller may be constructed from or configured using a portable device 202 as shown in FIG. 2B. The portable device 202 is a device that may wirelessly connect to a network. Examples of portable devices include, but are not limited to, a tablet computer, a personal digital assistant, and a smartphone.

Figure 2C:
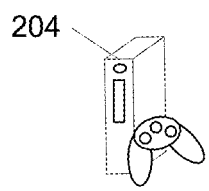

In some embodiments, an interactive controller may be constructed from or configured using a gaming console 204 as shown in FIG. 2C.

Figure 2D:
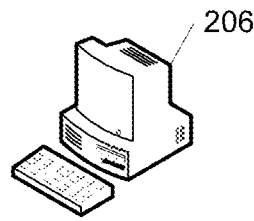

In various embodiments, an interactive controller may be constructed from or configured using a personal computer 206 as shown in FIG. 2D.

In some embodiments, a device, such as the devices of FIGS. 2A, 2B, 2C, and 2D, may be used to construct a complete skill-based progressive interleaved wagering system and may be operatively connected using a communication link to a session and/or user management controller, such as session and/or user management controller 150 of FIG. 1A.

Figure 3A:
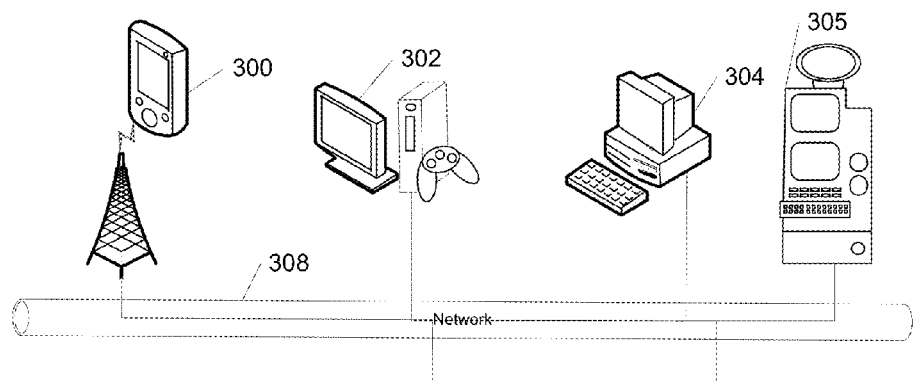
FIGS. 3A, 3B and 3C are diagrams of distributed skill-based progressive interleaved wagering systems in accordance with various embodiments of the invention.
Figure 3B:
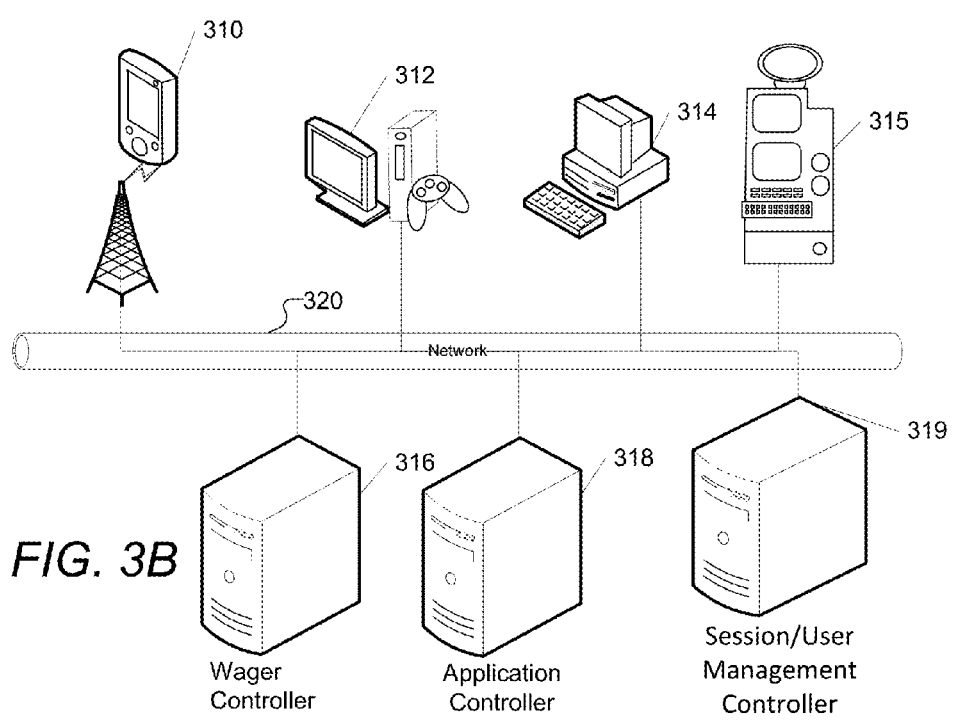
Figure 3C:
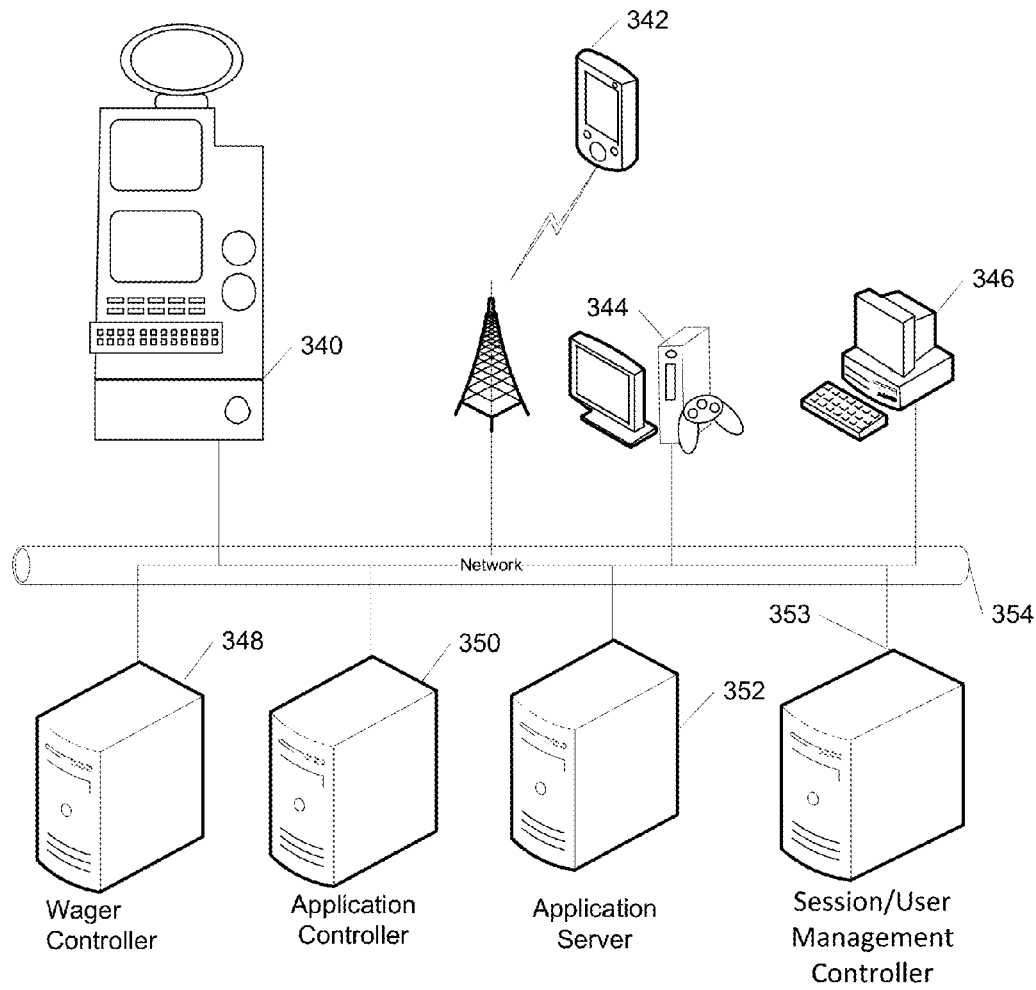

Some skill-based progressive interleaved wagering systems in accordance with many embodiments of the invention can be distributed across a plurality of devices in various configurations. FIGS. 3A, 3B and 3C are diagrams of distributed skill-based progressive interleaved wagering systems in accordance with various embodiments of the invention. Turning now to FIG. 3A, one or more interactive controllers of a distributed skill-based progressive interleaved wagering system, such as but not limited to, a mobile or wireless device 300, a gaming console 302, a personal computer 304, and an electronic gaming machine 305, are operatively connected with a wager controller 306 of a distributed skill-based progressive interleaved wagering system using a communication link 308. Communication link 308 is a communications link that allows processing systems to communicate with each other and to share data. Examples of the communication link 308 can include, but are not limited to: a wired or wireless interdevice communication link, a serial or parallel interdevice communication bus; a wired or wireless network such as a Local Area Network (LAN), a Wide Area Network (WAN), or the link; or a wired or wireless communication network such as a wireless telecommunications network or plain old telephone system (POTS). In some embodiments, one or more processes of an interactive controller and an application controller as described herein are executed on the individual interactive controllers 300, 302, 304 and 305 while one or more processes of a wager controller as described herein can be executed by the wager controller 306.

In many embodiments, a distributed skill-based progressive interleaved wagering system and may be operatively connected using a communication link to a session and/or user management controller 307, that performs the processes of a session and/or user management controller as described herein.

A distributed skill-based progressive interleaved wagering system in accordance with another embodiment of the invention is illustrated in FIG. 3B. As illustrated, one or more interactive controllers of a distributed skill-based progressive interleaved wagering system, such as but not limited to, a mobile or wireless device 310, a gaming console 312, a personal computer 314, and an electronic gaming machine 315, are operatively connected with a wager controller server 316 and an application controller 318 over a communication link 320. Communication link 320 is a communication link that allows processing systems to communicate and share data. Examples of the communication link 320 can include, but are not limited to: a wired or wireless interdevice communication link, a serial or parallel interdevice communication bus; a wired or wireless network such as a Local Area Network (LAN), a Wide Area Network (WAN), or the link; or a wired or wireless communication network such as a wireless telecommunications network or plain old telephone system (POTS). In some embodiments, the processes of an interactive controller as described herein are executed on the individual interactive controllers 310, 312, 314 and 315. One or more processes of a wager controller as described herein are executed by the wager controller 316, and one or more processes of an application controller as described herein are executed by the application controller 318.

In many embodiments, a distributed skill-based progressive interleaved wagering system and may be operatively connected using a communication link to a session and/or user management controller 319, that performs the processes of a session and/or user management controller as described herein.

A distributed skill-based progressive interleaved wagering systems in accordance with still another embodiment of the invention is illustrated in FIG. 3C. As illustrated, one or more interactive controllers of a distributed skill-based progressive interleaved wagering system, such as but not limited to, a mobile device 342, a gaming console 344, a personal computer 346, and an electronic gaming machine 340 are operatively connected with a wager controller 348 and an application controller 350, and an interactive application server 352 using a communication link 354. Communication link 354 is a communications link that allows processing systems to communicate and to share data. Examples of the communication link 354 can include, but are not limited to: a wired or wireless interdevice communication link, a serial or parallel interdevice communication bus; a wired or wireless network such as a Local Area Network (LAN), a Wide Area Network (WAN), or the link; or a wired or wireless communication network such as a wireless telecommunications network or plain old telephone system (POTS). In some embodiments, one or more processes of a display and user interface of an interactive controller as described herein are executed on the individual interactive controllers 340, 342, 344 and 346. One or more processes of a wager controller as described herein can be executed by the wager controller server 348. One or more processes of an application controller as described herein can be executed by the application controller server 350 and one or more processes of an interactive controller excluding the display and user interfaces can be executed by the interactive application server 352.

In many embodiments, a distributed skill-based progressive interleaved wagering system and may be operatively connected using a communication link to a session and/or user management controller 353, that performs the processes of a session and/or user management controller as described herein.

In various embodiments, a user management and session controller may be operatively connected to components of a skill-based progressive interleaved wagering system using a communication link. In other embodiments, a number of other peripheral systems, such as a user management system, a gaming establishment management system, a regulatory system, and/or hosting servers are also operatively connected with the skill-based progressive interleaved wagering systems using a communication link. Also, other servers can reside outside the bounds of a network within a firewall of the operator to provide additional services for network connected skill-based progressive interleaved wagering systems.

Although various distributed skill-based progressive interleaved wagering systems are described herein, skill-based progressive interleaved wagering systems can be distributed in any configuration as appropriate to the specification of a specific application in accordance with embodiments of the invention. In some embodiments, components of a distributed skill-based progressive interleaved wagering system, such as an application controller, wager controller, interactive controller, or other servers that perform services for an application controller, wager controller and/or interactive controller, can be distributed in different configurations for a specific distributed skill-based progressive interleaved wagering system application.

Figure 4A:
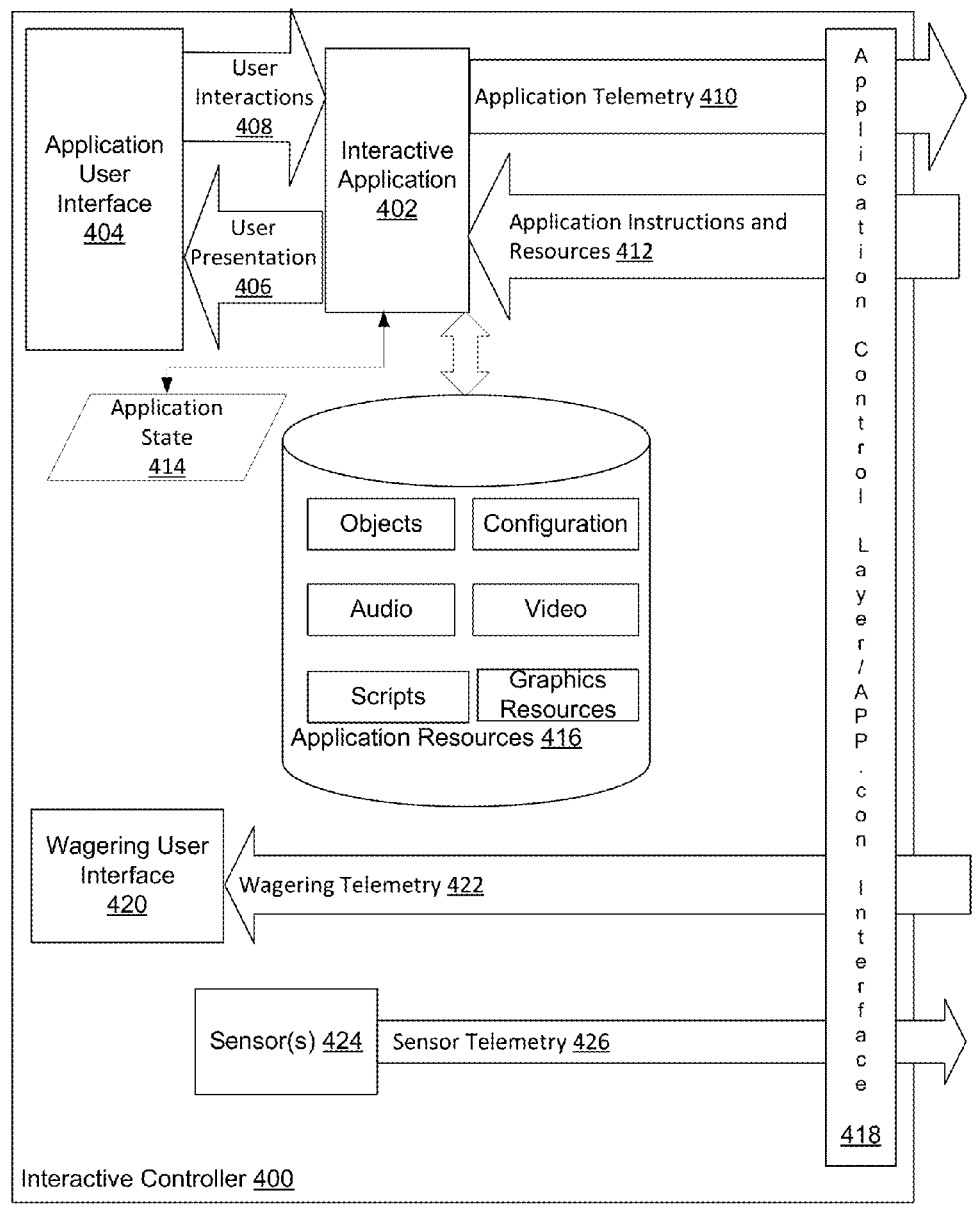
FIGS. 4A and 4B are diagrams of a structure of an interactive controller of a skill-based progressive interleaved wagering system in accordance with various embodiments of the invention.
Figure 4B:
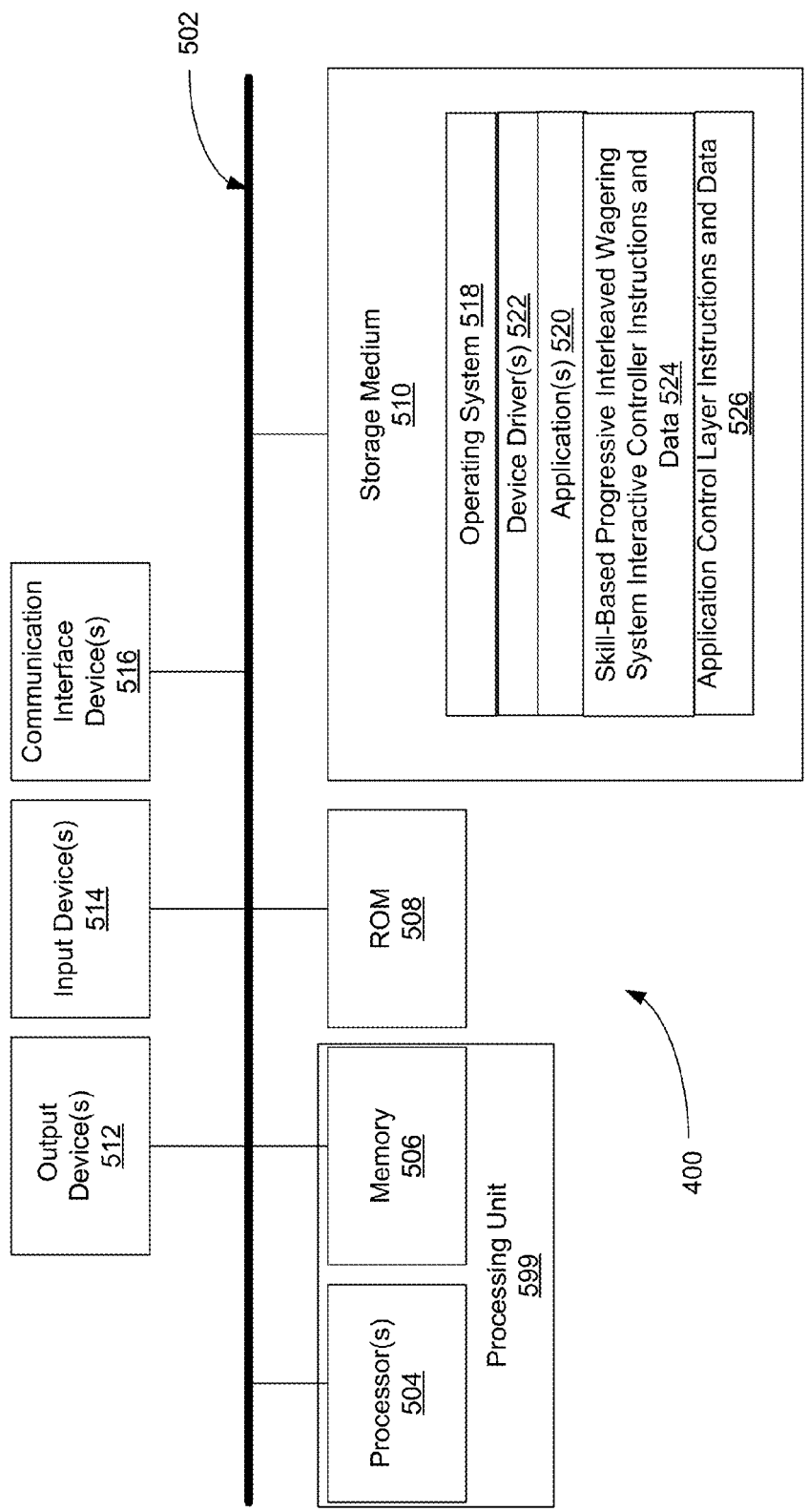

FIGS. 4A and 4B are diagrams of a structure of an interactive controller of a skill-based progressive interleaved wagering system in accordance with various embodiments of the invention. An interactive controller may be constructed from or configured using one or more processing devices configured to perform the operations of the interactive controller. In many embodiments, an interactive controller can be constructed from or configured using various types of processing devices including, but not limited to, a mobile device such as a smartphone or the like, a personal digital assistant, a wireless device such as a tablet computer or the like, an electronic gaming machine, a personal computer, a gaming console, a set-top box, a computing device, a controller, or the like.

Referring now to FIG. 4A, an interactive controller 400, suitable for use as interactive controller 120 of FIG. 1A, provides an execution environment for an interactive application 402 of a skill-based progressive interleaved wagering system. In several embodiments, an interactive controller 400 of a skill-based progressive interleaved wagering system provides an interactive application 402 that generates an application user interface 404 for interaction with by a user. The interactive application 402 generates a user presentation 406 that is presented to the user through the application user interface 404. The user presentation 406 may include audio features, visual features or tactile features, or any combination of these features. The application user interface 404 further includes one or more human input devices (HIDs) interfaces that communicate with one or more HIDs (e.g., the input devices 514 of FIG. 4b) that the user can use to interact with the skill-based progressive interleaved wagering system. The user's interactions 408 are included by the interactive application 402 in application telemetry data 410 that is communicated by interactive controller 400 to various other components of a skill-based progressive interleaved wagering system as described herein. The interactive application 402 receives application instructions and resources 412 communicated from various other components of a skill-based progressive interleaved wagering system as described herein.

In some embodiments, various components of the interactive application 402 can read data from an application state 414 in order to provide one or more features of the interactive application. In various embodiments, components of the interactive application 402 can include, but are not limited to, a physics engine, a rules engine, and/or a graphics engine. The physics engine is used to simulate physical interactions between virtual objects in the interactive application 402. The rules engine implements the rules of the interactive application and a P/RNG that may be used for influencing or determining certain variables and/or outcomes to provide a randomizing influence on the operations of the interactive application. The graphics engine is used to generate a visual representation of the interactive application state to the user. Furthermore, the components may also include an audio engine to generate audio outputs for the user interface.

During operation, the interactive application reads and writes application resources 416 stored on a data store of the interactive controller host. The application resources 416 may include objects having graphics and/or control logic used to provide application environment objects of the interactive application. In various embodiments, the resources may also include, but are not limited to, video files that are used to generate a portion of the user presentation 406; audio files used to generate music, sound effects, etc. within the interactive application; configuration files used to configure the features of the interactive application; scripts or other types of control code used to provide various features of the interactive application; and graphics resources such as textures, objects, etc. that are used by a graphics engine to render objects displayed in an interactive application.

In operation, components of the interactive application 402 read portions of the application state 414 and generate the user presentation 406 for the user that is presented to the user using the user interface 404. The user perceives the user presentation and provides user interactions 408 using the HIDs. The corresponding user interactions are received as user actions or inputs by various components of the interactive application 402. The interactive application 402 translates the user actions into interactions with the virtual objects of the application environment stored in the application state 414. Components of the interactive application use the user interactions with the virtual objects of the interactive application and the interactive application state 414 to update the application state 414 and update the user presentation 406 presented to the user. The process loops continuously while the user interacts with the interactive application of the skill-based progressive interleaved wagering system.

The interactive controller 400 provides one or more interfaces 418 between the interactive controller 400 and other components of a skill-based progressive interleaved wagering system, such as, but not limited to, an application controller. The interactive controller 400 and the other skill-based progressive interleaved wagering system components communicate with each other using the interfaces. The interface may be used to pass various types of data, and to communicate and receive messages, status data, commands and the like. In certain embodiments, the interactive controller 400 and an application controller communicate application instructions and environment resources 412 and application telemetry data 410. In some embodiments, the communications include requests by the application controller that the interactive controller 400 update the application state 414 using data provided by the application controller.

In many embodiments, a communication by an application controller includes a request that the interactive controller 400 update one or more resources 416 using data provided by the application controller. In a number of embodiments, the interactive controller 400 provides all or a portion of the application state to the application controller. In some embodiments, the interactive controller 400 may also provide data about one or more of the application resources 416 to the application controller. In some embodiments, the communication includes user interactions that the interactive controller 400 communicates to the application controller. The user interactions may be low level user interactions with the user interface 404, such as manipulation of a HID, or may be high level interactions with game objects as determined by the interactive application. The user interactions may also include resultant actions such as modifications to the application state 414 or game resources 416 resulting from the user's interactions taken in the skill-based progressive interleaved wagering system interactive application. In some embodiments, user interactions include, but are not limited to, actions taken by entities such as non-player characters (NPC) of the interactive application that act on behalf of or under the control of the user.

In some embodiments, the interactive controller 400 includes a wagering user interface 420 used to communicate skill-based progressive interleaved wagering system telemetry data 422 to and from the user. The skill-based progressive interleaved wagering system telemetry data 422 from the skill-based progressive interleaved wagering system include, but are not limited to, data used by the user to configure Cr, AC and element wagers, and data about the gambling game Cr, AC and element wagers such as, but not limited to, Cr, AC and element balances and Cr, AC and element amounts wagered.

In some embodiments, the interactive controller includes one or more sensors 424. Such sensors may include, but are not limited to, physiological sensors that monitor the physiology of the user, environmental sensors that monitor the physical environment of the interactive controller, accelerometers that monitor changes in motion of the interactive controller, and location sensors that monitor the location of the interactive controller such as global positioning sensors (GPSs). The interactive controller 400 communicates sensor telemetry data 426 to one or more components of the skill-based progressive interleaved wagering system.

Referring now to FIG. 4B, interactive controller 400 includes a bus 502 that provides an interface for one or more processors 504, random access memory (RAM) 506, read only memory (ROM) 508, machine-readable storage medium 510, one or more user output devices 512, one or more user input devices 514, and one or more communication interface devices 516.

The one or more processors 504 may take many forms, such as, but not limited to: a central processing unit (CPU); a multi-processor unit (MPU); an ARM processor; a controller; a programmable logic device; or the like.

In the example embodiment, the one or more processors 504 and the random access memory (RAM) 506 form an interactive controller processing unit 599. In some embodiments, the interactive controller processing unit includes one or more processors operatively connected to one or more of a RAM, ROM, and machine-readable storage medium; the one or more processors of the interactive controller processing unit receive instructions stored by the one or more of a RAM, ROM, and machine-readable storage medium via a bus; and the one or more processors execute the received instructions. In some embodiments, the interactive controller processing unit is an ASIC (Application-Specific Integrated Circuit). In some embodiments, the interactive controller processing unit is a SoC (System-on-Chip).

Examples of output devices 512 include, but are not limited to, display screens; light panels; and/or lighted displays. In accordance with particular embodiments, the one or more processors 504 are operatively connected to audio output devices such as, but not limited to: speakers; and/or sound amplifiers. In accordance with many of these embodiments, the one or more processors 504 are operatively connected to tactile output devices like vibrators, and/or manipulators.

Examples of user input devices 514 include, but are not limited to: tactile devices including but not limited to, keyboards, keypads, foot pads, touch screens, and/or trackballs; non-contact devices such as audio input devices; motion sensors and motion capture devices that the interactive controller can use to receive inputs from a user when the user interacts with the interactive controller; physiological sensors that monitor the physiology of the user; environmental sensors that monitor the physical environment of the interactive controller; accelerometers that monitor changes in motion of the interactive controller; and location sensors that monitor the location of the interactive controller such as global positioning sensors.

The one or more communication interface devices 516 provide one or more wired or wireless interfaces for communicating data and commands between the interactive controller 400 and other devices that may be included in a skill-based progressive interleaved wagering system. Such wired and wireless interfaces include, but are not limited to: a Universal Serial Bus (USB) interface; a Bluetooth interface; a Wi-Fi interface; an Ethernet interface; a Near Field Communication (NFC) interface; a plain old telephone system (POTS) interface, a cellular or satellite telephone network interface; and the like.

The machine-readable storage medium 510 stores machine-executable instructions for various components of the interactive controller, such as but not limited to: an operating system 518; one or more device drivers 522; one or more application programs 520 including but not limited to an interactive application; and skill-based progressive interleaved wagering system interactive controller instructions and data 524 for use by the one or more processors 504 to provide the features of an interactive controller as described herein. In some embodiments, the machine-executable instructions further include application control interface/application control interface instructions and data 526 for use by the one or more processors 504 to provide the features of an application control interface/application control interface as described herein.

In various embodiments, the machine-readable storage medium 510 is one of a (or a combination of two or more of) a hard drive, a flash drive, a DVD, a CD, a flash storage, a solid state drive, a ROM, an EEPROM, and the like.

In operation, the machine-executable instructions are loaded into memory 506 from the machine-readable storage medium 510, the ROM 508 or any other storage location. The respective machine-executable instructions are accessed by the one or more processors 504 via the bus 502, and then executed by the one or more processors 504. Data used by the one or more processors 504 are also stored in memory 506, and the one or more processors 504 access such data during execution of the machine-executable instructions. Execution of the machine-executable instructions causes the one or more processors 504 to control the interactive controller 400 to provide the features of a skill-based progressive interleaved wagering system interactive controller as described herein Although the interactive controller is described herein as being constructed from or configured using one or more processors and instructions stored and executed by hardware components, the interactive controller can be constructed from or configured using only hardware components in accordance with other embodiments. In addition, although the storage medium 510 is described as being operatively connected to the one or more processors through a bus, those skilled in the art of interactive controllers will understand that the storage medium can include removable media such as, but not limited to, a USB memory device, an optical CD ROM, magnetic media such as tape and disks. In some embodiments, the storage medium 510 can be accessed by the one or more processors 504 through one of the communication interface devices 516 or using a communication link. Furthermore, any of the user input devices or user output devices can be operatively connected to the one or more processors 504 via one of the communication interface devices 516 or using a communication link.

In some embodiments, the interactive controller 400 can be distributed across a plurality of different devices. In many such embodiments, an interactive controller of a skill-based progressive interleaved wagering system includes an interactive application server operatively connected to an interactive client using a communication link. The interactive application server and interactive application client cooperate to provide the features of an interactive controller as described herein.

In various embodiments, the interactive controller 400 may be used to construct other components of a skill-based progressive interleaved wagering system as described herein.

In some embodiments, components of an interactive controller and an application controller of a skill-based progressive interleaved wagering system may be constructed from or configured using a single device using processes that communicate using an interprocess communication protocol. In other such embodiments, the components of an interactive controller and an application controller of a skill-based progressive interleaved wagering system may communicate by passing messages, parameters or the like.

Figure 5A:
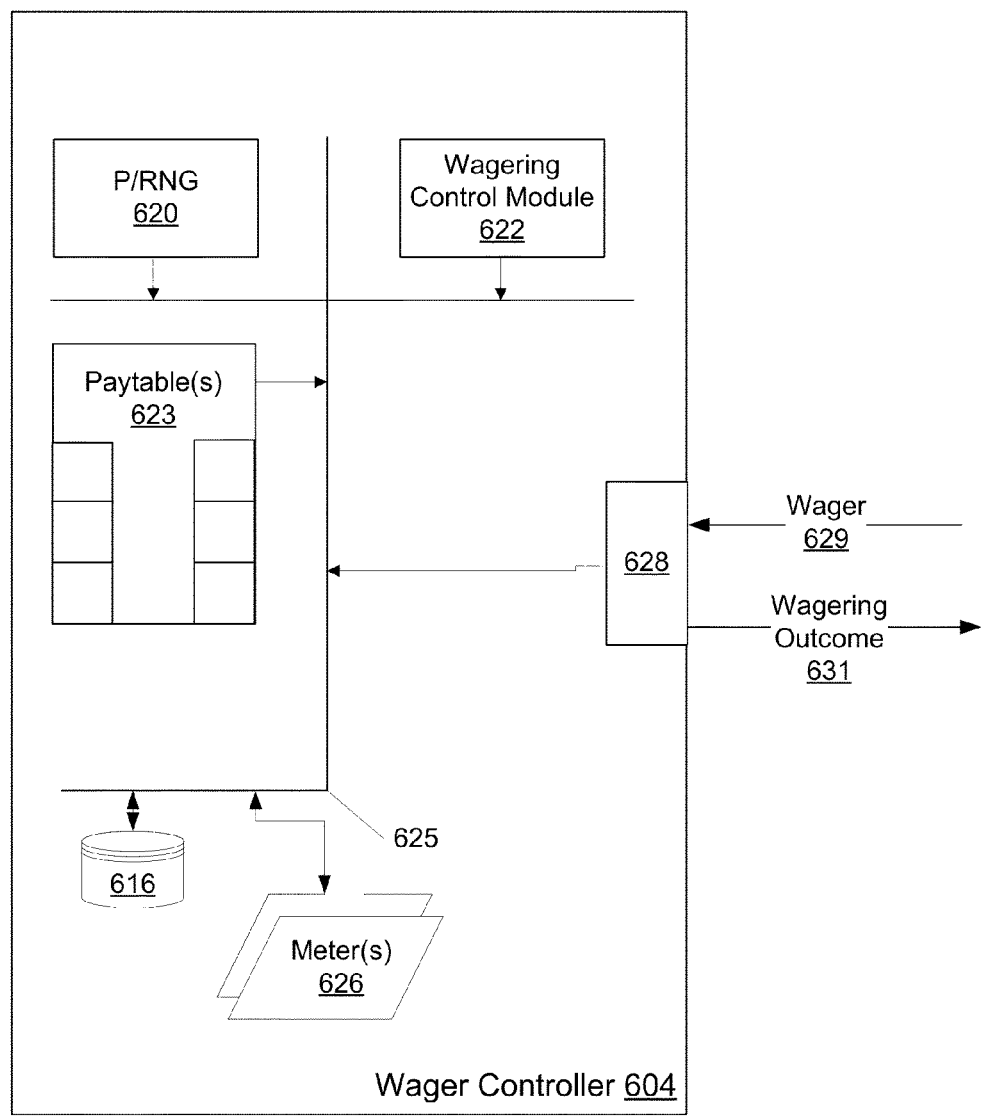
FIGS. 5A and 5B are diagrams of a structure of a wager controller of a skill-based progressive interleaved wagering system in accordance with various embodiments of the invention.
Figure 5B:
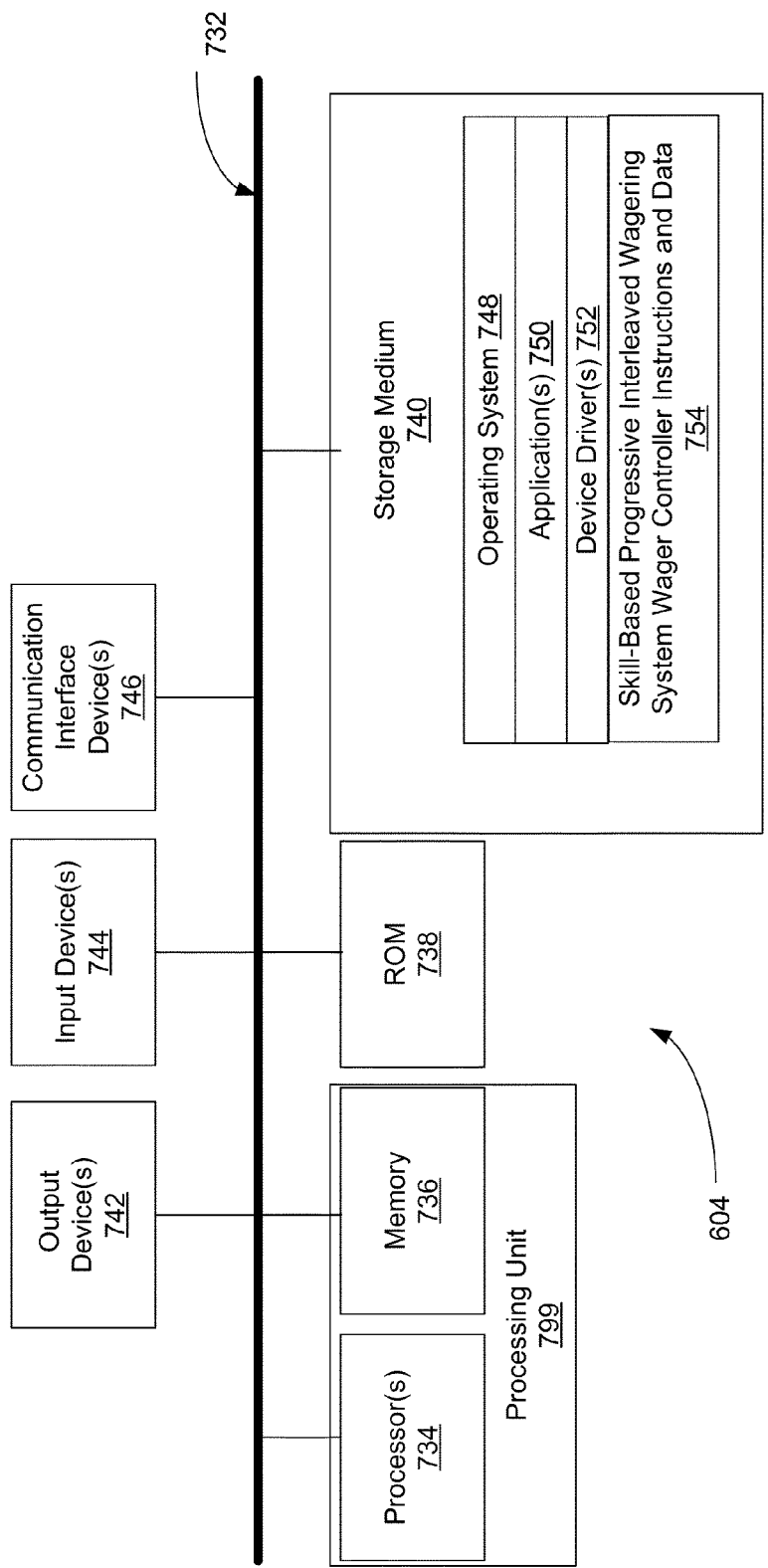

FIGS. 5A and 5B are diagrams of a structure of a wager controller of a skill-based progressive interleaved wagering system in accordance with various embodiments of the invention. A wager controller may be constructed from or configured using one or more processing devices configured to perform the operations of the wager controller. In many embodiments, a wager controller can be constructed from or configured using various types of processing devices including, but not limited to, a mobile device such as a smartphone or the like, a personal digital assistant, a wireless device such as a tablet computer or the like, an electronic gaming machine, a personal computer, a gaming console, a set-top box, a computing device, a controller, or the like.

Referring now to FIG. 5A, in various embodiments, a wager controller 604, suitable for use as wager controller 102 of FIG. 1A, includes a pseudorandom or random number generator (P/RNG) 620 to produce random results or pseudo random results; one or more paytables 623 which includes a plurality of factors indexed by the random result to be multiplied with an amount of Cr, AC, elements, or objects committed in a wager; and a wagering control module 622 whose processes may include, but are not limited to, generating random results, looking up factors in the paytables, multiplying the factors by an amount of Cr, AC, elements, or objects wagered, and administering one or more Cr, AC, element, or object meters 626. The various wager controller components can interface with each other via an internal bus 625 and/or other appropriate communication mechanism.

An interface 628 allows the wager controller 604 to operatively connect to an external device, such as one or more application controllers as described herein. The interface 628 provides for receiving of wager execution instructions 629 from the external device that is used to specify wager parameters and/or trigger execution of a wager by the wager controller 604. The interface 628 may also provide for communicating wager outcome data 631 to an external device. In numerous embodiments, the interface between the wager controller 604 and other systems/devices may be a wide area network (WAN) such as the Internet. However, other methods of communication may be used including, but not limited to, a local area network (LAN), a universal serial bus (USB) interface, and/or some other method by which two electronic devices could communicate with each other.

In various embodiments, a wager controller 604 may use a P/RNG provided by an external system. The external system may be connected to the wager controller 604 by a suitable communication network such as a local area network (LAN) or a wide area network (WAN). In some embodiments, the external P/RNG is a central deterministic system that provides random or pseudo random results to one or more connected wager controllers.

During operation of the wager controller, the external system communicates wager execution instructions 629 to the wager controller 604. The wager controller 604 receives the wager execution instructions and uses the wager execution instructions to trigger execution of a wager in accordance with a wagering proposition. The wager controller 604 executes the wager and determines a wager outcome for the wager. The wager controller communicates wager outcome data 631 of the wager outcome to the external system.

In some embodiments, the wager controller uses the wager execution instructions to select a paytable 628 to use and/or an amount of Cr, AC, elements, or objects to wager.

In some embodiments, the wager outcome data may include, but is not limited to, an amount of Cr, AC, elements, or objects won in the wager.

In various embodiments, the wager outcome data may include, but is not limited to, an amount of Cr, AC, elements, or objects in the one or more meters 626.

In some embodiments, the wager outcome data includes state data for the wagering proposition of the executed wager. The state data may correspond to one or more game states of a gambling game that is associated with the wagering proposition. Examples of state data include, but are not limited to, reel strips in an operation state or a final state for a reel-based gambling game, one or more dice positions for a dice-based gambling game, positions of a roulette wheel and roulette ball, position of a wheel of fortune, or the like.

In various embodiments, the wagering control module 622 determines an amount of a wager and a paytable to use from the one or more paytables 623. In such embodiments, in response to the wager execution instructions triggering execution of the wager, the wager control module 622 executes the wager by requesting a P/RNG result from the P/RNG 620; retrieving a paytable from the one or more paytables 623; adjusting the one or more credit meters 626 for an amount of the wager; applying the P/RNG result to the retrieved paytable; multiplying the resultant factor from the paytable by an amount wagered to determine a wager outcome; updating the one or more meters 626 based on the wager outcome; and communicating the wager outcome to the external device.

In various embodiments, an external system communicates a request for a P/RNG result from the wager controller 604. In response, the wager controller 604 returns a P/RNG result as a function of an internal P/RNG or a P/RNG external to the external system to which the wager controller 604 is operatively connected.

In some embodiments, a communication exchange between the wager controller 604 and an external system relate to the external system support for coupling a P/RNG result to a particular paytable contained in the wager controller 604. In such an exchange, the external system communicates to the wager controller 604 as to which of the one or more paytables 623 to use, and requests a result whereby the P/RNG result would be associated with the requested paytable 623. The result of the coupling is returned to the external system. In such an exchange, no actual Cr, AC, element, or object wager is conducted, but might be useful in coupling certain non-value wagering interactive application behaviors and propositions to the same final resultant wagering return which is understood for the skill-based progressive interleaved wagering system to conduct wagering.

In some embodiments, the wager controller 604 may also include storage for statuses, wagers, wager outcomes, meters and other historical events in a storage device 616.

In some embodiments, an authorization access module provides a process to permit access and command exchange with the wager controller 604 and access to the one or more credit meters 626 for the amount of Cr, AC, elements, or objects being wagered by the user in the skill-based progressive interleaved wagering system.

In numerous embodiments, communication occurs between various types of a wager controller and an external system 630, such as application controller. In some of these embodiments, the purpose of the wager controller is to allocate wagers to pools, detect occurrences of one or more events upon which the wagers were made, and determine the wager outcomes for each individual wager based on the number of winning wagers and the amount paid into the pool.

In some embodiments, the wager controller manages accounts for individual users wherein the users make deposits into the accounts, amounts are deducted from the accounts, and amounts are credited to the users' accounts based on the wager outcomes.

In some embodiments a wager controller is a pari-mutuel wagering system such as used for wagering on an events such as horse races, greyhound races, sporting events and the like. In a pari-mutuel wagering system, user's wagers on the outcome of an event are allocated to a pool. When the event occurs, wager outcomes are calculated by sharing the pool among all winning wagers.

In various embodiments, a wager controller is a central determination system, such as but not limited to a central determination system for a Class II wagering system or a wagering system in support of a "scratch off" style lottery.

In such a wagering system, a player plays against other players and competes for a common prize. In a given set of wager outcomes, there are a certain number of wins and losses. Once a certain wager outcome has been determined, the same wager outcome cannot occur again until a new set of wager outcomes is generated.

In numerous embodiments, communication occurs between various components of a wager controller 604 and an external system, such as an application controller. In some of these embodiments, the purpose of the wager controller 604 is to manage wagering on wagering events and to provide random (or pseudo random) results from a P/RNG.

Referring now to FIG. 5B, wager controller 604 includes a bus 732 that provides an interface for one or more processors 734, random access memory (RAM) 736, read only memory (ROM) 738, machine-readable storage medium 740, one or more user output devices 742, one or more user input devices 744, and one or more communication interface and/or network interface devices 746.

The one or more processors 734 may take many forms, such as, but not limited to, a central processing unit (CPU), a multi-processor unit (MPU), an ARM processor, a controller, a programmable logic device, or the like.

In the example embodiment, the one or more processors 734 and the random access memory (RAM) 736 form a wager controller processing unit 799. In some embodiments, the wager controller processing unit includes one or more processors operatively connected to one or more of a RAM, ROM, and machine-readable storage medium; the one or more processors of the wager controller processing unit receive instructions stored by the one or more of a RAM, ROM, and machine-readable storage medium via a bus; and the one or more processors execute the received instructions. In some embodiments, the wager controller processing unit is an ASIC (Application-Specific Integrated Circuit). In some embodiments, the wager controller processing unit is a SoC (System-on-Chip).

Examples of output devices 742 include, but are not limited to, display screens, light panels, and/or lighted displays. In accordance with particular embodiments, the one or more processors 734 are operatively connected to audio output devices such as, but not limited to speakers, and/or sound amplifiers. In accordance with many of these embodiments, the one or more processors 734 are operatively connected to tactile output devices like vibrators, and/or manipulators.

Examples of user input devices 734 include, but are not limited to, tactile devices including but not limited to, keyboards, keypads, touch screens, and/or trackballs; non-contact devices such as audio input devices; motion sensors and motion capture devices that the wager controller can use to receive inputs from a user when the user interacts with the wager controller 604.

The one or more communication interface and/or network interface devices 746 provide one or more wired or wireless interfaces for exchanging data and commands between the wager controller 604 and other devices that may be included in a skill-based progressive interleaved wagering system. Such wired and wireless interfaces include, but are not limited to: a Universal Serial Bus (USB) interface; a Bluetooth interface; a Wi-Fi interface; an Ethernet interface; a Near Field Communication (NFC) interface; a plain old telephone system (POTS) interface; a cellular or satellite telephone network interface; and the like.

The machine-readable storage medium 740 stores machine-executable instructions for various components of a wager controller, such as but not limited to: an operating system 748; one or more application programs 750; one or more device drivers 752; and skill-based progressive interleaved wagering system wager controller instructions and data 754 for use by the one or more processors 734 to provide the features of a skill-based progressive interleaved wagering system wager controller as described herein.

In various embodiments, the machine-readable storage medium 740 is one of a (or a combination of two or more of) a hard drive, a flash drive, a DVD, a CD, a flash storage, a solid state drive, a ROM, an EEPROM, and the like.

In operation, the machine-executable instructions are loaded into memory 736 from the machine-readable storage medium 740, the ROM 738 or any other storage location. The respective machine-executable instructions are accessed by the one or more processors 734 via the bus 732, and then executed by the one or more processors 734. Data used by the one or more processors 734 are also stored in memory 736, and the one or more processors 734 access such data during execution of the machine-executable instructions. Execution of the machine-executable instructions causes the one or more processors 734 to control the wager controller 604 to provide the features of a skill-based progressive interleaved wagering system wager controller as described herein Although the wager controller 604 is described herein as being constructed from or configured using one or more processors and machine-executable instructions stored and executed by hardware components, the wager controller can be composed of only hardware components in accordance with other embodiments. In addition, although the storage medium 740 is described as being operatively connected to the one or more processors through a bus, those skilled in the art of processing devices will understand that the storage medium can include removable media such as, but not limited to, a USB memory device, an optical CD ROM, magnetic media such as tape and disks. In some embodiments, the storage medium 740 can be accessed by the one or more processors 734 through one of the interfaces or using a communication link. Furthermore, any of the user input devices or user output devices can be operatively connected to the one or more processors 734 via one of the interfaces or using a communication link.

In various embodiments, the wager controller 604 may be used to construct other components of a skill-based progressive interleaved wagering system as described herein.

In some embodiments, components of a wager controller and an application controller of a skill-based progressive interleaved wagering system may be constructed from or configured using a single device using processes that communicate using an interprocess communication protocol. In other such embodiments, the components of a wager controller and an application controller of a skill-based progressive interleaved wagering system may communicate by passing messages, parameters or the like.

It should be understood that there may be many embodiments of a wager controller 604 which could be possible, including forms where many modules and components of the wager controller are located in various servers and locations, so the foregoing is not meant to be exhaustive or all inclusive, but rather provide data on various embodiments of a wager controller 604.

Figure 6A:
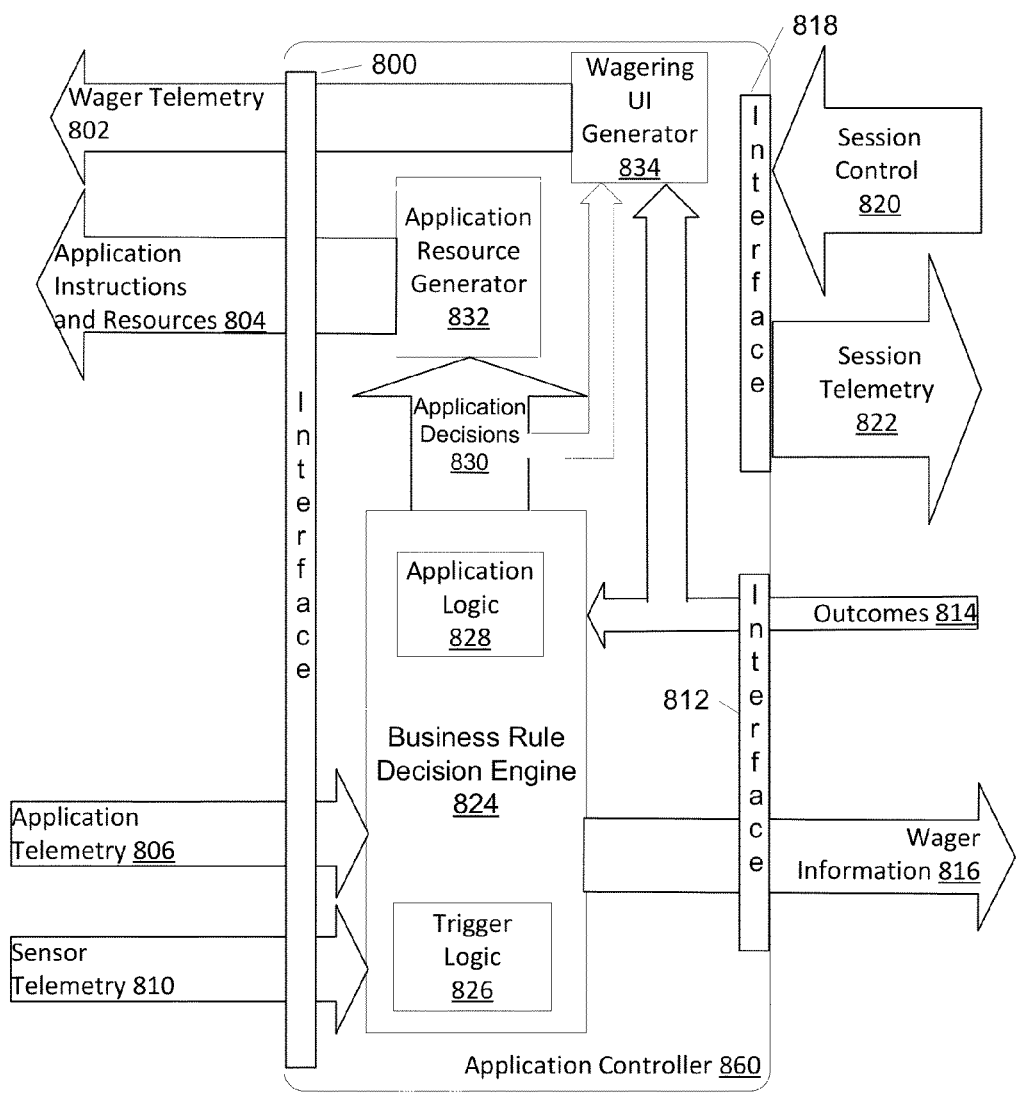
FIGS. 6A and 6B are diagrams of a structure of an application controller of a skill-based progressive interleaved wagering system in accordance with various embodiments of the invention.
Figure 6B:
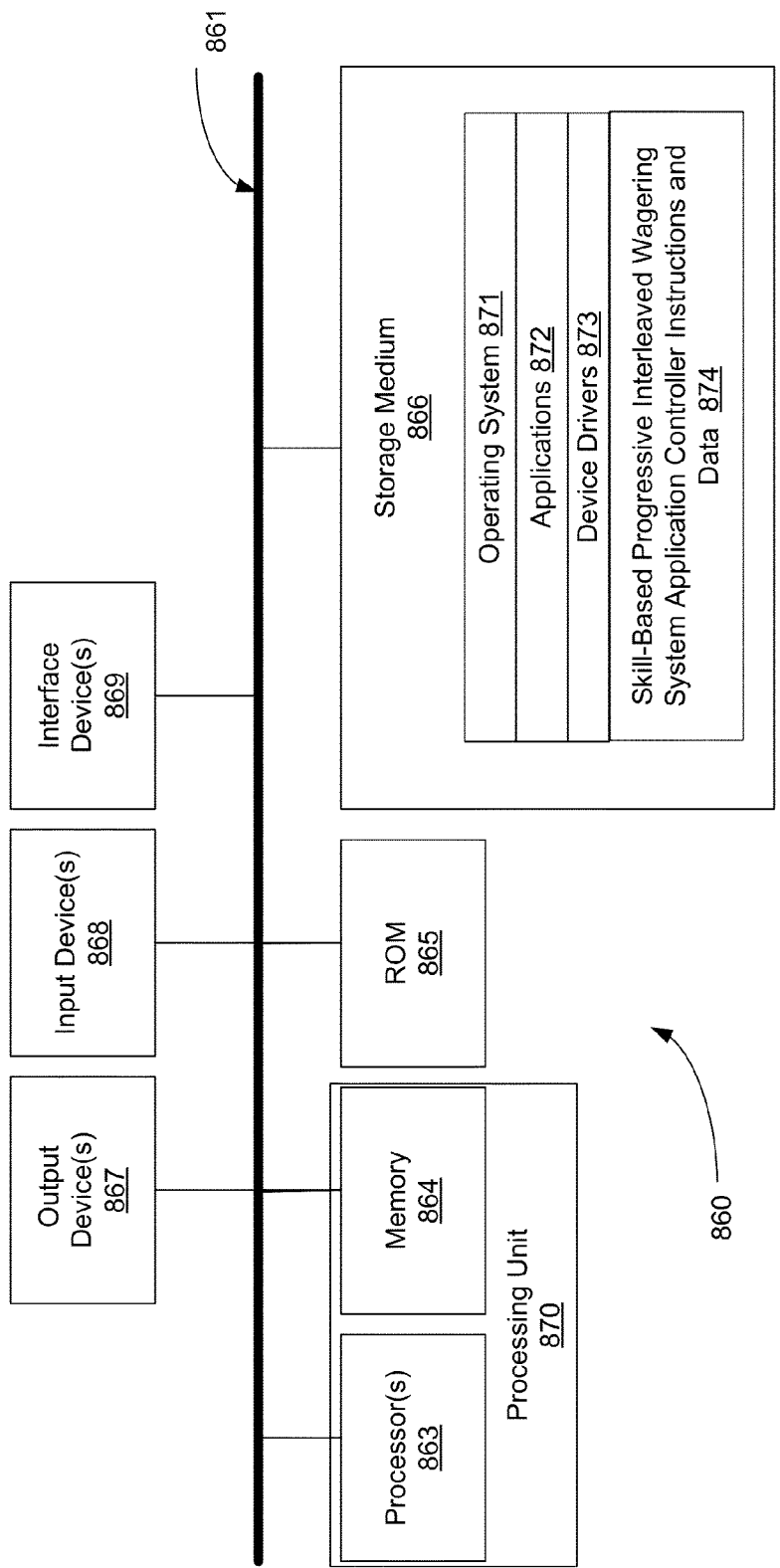

FIGS. 6A and 6B are diagrams of a structure of an application controller of a skill-based progressive interleaved wagering system in accordance with various embodiments of the invention. An application controller may be constructed from or configured using one or more processing devices configured to perform the operations of the application controller. In many embodiments, an application controller can be constructed from or configured using various types of processing devices including, but not limited to, a mobile device such as a smartphone, a personal digital assistant, a wireless device such as a tablet computer or the like, an electronic gaming machine, a personal computer, a gaming console, a set-top box, a computing device, a controller, or the like.

Referring now to FIG. 6A, in many embodiments, an application controller 860, suitable for use as application controller 112 of FIG. 1A, manages operation of a skill-based progressive interleaved wagering system, with a wager controller and an interactive controller being support units to the application controller 860. The application controller 860 provides an interface between the interactive application, provided by an interactive controller, and a wagering proposition, provided by a wager controller.

In some embodiments, the application controller 860 includes an interactive controller interface 800 to an interactive controller. The interactive controller interface 800 provides for communication of data between an interactive controller and the application controller 860, including but not limited to wager telemetry data 802, application instructions and resources 804, application telemetry data 806, and sensor telemetry data 810.

In various embodiments, the application controller 860 includes a wager controller interface 812 to a wager controller. The wager controller interface 812 provides for communication of data between the application controller 860 and a wager controller, including but not limited to wager outcomes 814 and wager execution instructions 816.

In some embodiments, the application controller 860 includes a user management and session controller interface 818 to a user management and session controller. The user management and session controller interface 818 provides for communication of data between the application controller 860 and a user management and session controller, including but not limited to user session control data 820 and user session telemetry data 822.

The application controller 860 includes a rule-based decision engine 824 that receives telemetry data, such as application telemetry data and sensor telemetry data, from an interactive controller. The rule-based decision engine 824 uses the telemetry data, along with trigger logic 826 to generate wager execution instructions used to trigger a wager in a wager controller.

In some embodiments, the application telemetry data includes, but is not limited to, application environment variables that indicate the state of an interactive application being used by a user, interactive controller data indicating a state of an interactive controller, and user actions and interactions between a user and an interactive application provided by an interactive controller. The wagering and/or wager execution instructions may include, but is not limited to, an amount and type of the wager, a trigger of the wager, and a selection of a paytable to be used when executing the wager.

In some embodiments, the rule-based decision engine 824 also receives wager outcome data from a wager controller. The decision engine 824 uses the wager outcome data, in conjunction with telemetry data and application logic 828 to generate application decisions 830 communicated to an application resource generator 832. The application resource generator 832 receives the application decisions and uses the application decisions to generate application instructions and application resources to be communicated to an interactive application.

In many embodiments, the application controller 860 includes a pseudo random or random result generator used to generate random results that are communicated to the application resource generator 832. The application resource generator uses the random results to generate application instructions and application resources to be communicated to an interactive controller for use by an interactive application.

In various embodiments, the rule-based decision engine 824 also determines an amount of AC to award to a user based at least in part on the user's use of an interactive application of the skill-based progressive interleaved wagering system as determined from application telemetry data. In some embodiments, wager outcome data may also be used to determine the amount of AC that should be awarded to the user.

In numerous embodiments, an interactive application is a skill-based interactive game and the AC is awarded to the user for the user's skillful play of the skill-based interactive game.

In some embodiments, the application decisions and wager outcome data are communicated to a wagering user interface generator 834. The wagering user interface generator 834 receives the application decisions and wager outcome data and generates wager telemetry data describing the state of wagering and credit accumulation and loss for the skill-based progressive interleaved wagering system. In some embodiments, the wager telemetry data 146 may include, but is not limited to, amounts of AC and elements earned, lost or accumulated by the user through use of the interactive application as determined from the application decisions, and Cr amounts won, lost or accumulated as determined from the wager outcome data and the one or more credit meters.

In some embodiments, the wager outcome data 814 also includes data about one or more game states of a gambling game executed in accordance with a wagering proposition by a wager controller. In various such embodiments, the wagering user interface generator 834 generates a gambling game process display and/or gambling game state display using the one or more game states of the gambling game. The gambling game process display and/or gambling game state display is included in wager telemetry data that is communicated to an interactive controller. The gambling game process display and/or a gambling game state display is displayed by a wagering user interface of the interactive controller to a user. In other such embodiments, the one or more game states of the gambling game are communicated to an interactive controller and a wagering user interface of the interactive controller generates a gambling game process display and/or gambling game state display using the one or more game states of the gambling game for display to a user.

The application controller 860 can further operatively connect to a wager controller to determine an amount of credit or elements available and other wagering metrics of a wagering proposition. Thus, the application controller 860 may potentially affect an amount of Cr in play for participation in the wagering events of a gambling game provided by the wager controller. The application controller 860 may additionally include various audit logs and activity meters. In some embodiments, the application controller 860 can also couple to a centralized server for exchanging various data related to the user and the activities of the user during game play of a skill-based progressive interleaved wagering system.

In some embodiments, the operation of the application controller 860 does not affect the provision of a wagering proposition by a wager controller except for user choice parameters that are allowable in accordance with the wagering proposition. Examples of user choice parameters include, but are not limited to: wager terms such as but not limited to a wager amount; speed of game play (for example, by pressing a button or pulling a handle of a slot machine); and/or agreement to wager into a bonus round.

In a number of embodiments, communication of wager execution instructions between a wager controller and the application controller 860 can further be used to communicate various wagering control factors that the wager controller uses as input. Examples of wagering control factors include, but are not limited to, an amount of Cr, AC, elements, or objects consumed per wagering event, and/or the user's election to enter a jackpot round.

In some embodiments, the application controller 860 utilizes a wagering user interface to communicate certain interactive application data to the user, including but not limited to, club points, user status, control of the selection of user choices, and messages which a user can find useful in order to adjust the interactive application experience or understand the wagering status of the user in accordance with the wagering proposition in the wager controller.

In some embodiments, the application controller 860 utilizes a wagering user interface to communicate aspects of a wagering proposition to the user including, but not limited to, odds of certain wager outcomes, amount of Cr, AC, elements, or objects in play, and amounts of Cr, AC, elements, or objects available.

In a number of embodiments, a wager controller can accept wager proposition factors including, but not limited to, modifications in the amount of Cr, AC, elements, or objects wagered on each individual wagering event, a number of wagering events per minute the wager controller can resolve, entrance into a bonus round, and other factors. In several embodiments, the application controller 860 can communicate a number of factors back and forth to the wager controller, such that an increase/decrease in a wagered amount can be related to the change in user profile of the user in the interactive application. In this manner, a user can control a wager amount per wagering event in accordance with the wagering proposition with the change mapping to a parameter or component that is applicable to the interactive application experience.

Referring now to FIG. 6B, application controller 860 includes a bus 861 providing an interface for one or more processors 863, random access memory (RAM) 864, read only memory (ROM) 865, machine-readable storage medium 866, one or more user output devices 867, one or more user input devices 868, and one or more communication interface and/or network interface devices 869.

The one or more processors 863 may take many forms, such as, but not limited to: a central processing unit (CPU); a multi-processor unit (MPU); an ARM processor; a programmable logic device; or the like.

Examples of output devices 867 include, include, but are not limited to: display screens; light panels; and/or lighted displays. In accordance with particular embodiments, the one or more processors 863 are operatively connected to audio output devices such as but not limited to: speakers; and/or sound amplifiers. In accordance with many of these embodiments, the one or more processors 863 are operatively connected to tactile output devices like vibrators, and/or manipulators.

In the example embodiment, the one or more processors 863 and the random access memory (RAM) 864 form an application controller processing unit 870. In some embodiments, the application controller processing unit includes one or more processors operatively connected to one or more of a RAM, ROM, and machine-readable storage medium; the one or more processors of the application controller processing unit receive instructions stored by the one or more of a RAM, ROM, and machine-readable storage medium via a bus; and the one or more processors execute the received instructions. In some embodiments, the application controller processing unit is an ASIC (Application-Specific Integrated Circuit). In some embodiments, the application controller processing unit is a SoC (System-on-Chip).

Examples of user input devices 868 include, but are not limited to: tactile devices including but not limited to, keyboards, keypads, foot pads, touch screens, and/or trackballs; non-contact devices such as audio input devices; motion sensors and motion capture devices that the application controller can use to receive inputs from a user when the user interacts with the application controller 860.

The one or more communication interface and/or network interface devices 869 provide one or more wired or wireless interfaces for exchanging data and commands between the application controller 860 and other devices that may be included in a skill-based progressive interleaved wagering system. Such wired and wireless interfaces include, but are not limited to: a Universal Serial Bus (USB) interface; a Bluetooth interface; a Wi-Fi interface; an Ethernet interface; a Near Field Communication (NFC) interface; a plain old telephone system (POTS), cellular, or satellite telephone network interface; and the like.

The machine-readable storage medium 866 stores machine-executable instructions for various components of the application controller 860 such as, but not limited to: an operating system 871; one or more applications 872; one or more device drivers 873; and skill-based progressive interleaved wagering system application controller instructions and data 874 for use by the one or more processors 863 to provide the features of an application controller as described herein.

In various embodiments, the machine-readable storage medium 870 is one of a (or a combination of two or more of) a hard drive, a flash drive, a DVD, a CD, a flash storage, a solid state drive, a ROM, an EEPROM, and the like.

In operation, the machine-executable instructions are loaded into memory 864 from the machine-readable storage medium 866, the ROM 865 or any other storage location. The respective machine-executable instructions are accessed by the one or more processors 863 via the bus 861, and then executed by the one or more processors 863. Data used by the one or more processors 863 are also stored in memory 864, and the one or more processors 863 access such data during execution of the machine-executable instructions. Execution of the machine-executable instructions causes the one or more processors 863 to control the application controller 860 to provide the features of a skill-based progressive interleaved wagering system application controller as described herein.

Although the application controller 860 is described herein as being constructed from or configured using one or more processors and instructions stored and executed by hardware components, the application controller can be composed of only hardware components in accordance with other embodiments. In addition, although the storage medium 866 is described as being operatively connected to the one or more processors through a bus, those skilled in the art of application controllers will understand that the storage medium can include removable media such as, but not limited to, a USB memory device, an optical CD ROM, magnetic media such as tape and disks. Also, in some embodiments, the storage medium 866 may be accessed by processor 863 through one of the interfaces or using a communication link. Furthermore, any of the user input devices or user output devices may be operatively connected to the one or more processors 863 via one of the interfaces or using a communication link.

In various embodiments, the application controller 860 may be used to construct other components of a skill-based progressive interleaved wagering system as described herein.

In some embodiments, components of an interactive controller and an application controller of a skill-based progressive interleaved wagering system may be constructed from or configured using a single device using processes that communicate using an interprocess communication protocol. In other such embodiments, the components of an interactive controller and an application controller of a skill-based progressive interleaved wagering system may communicate by passing messages, parameters or the like.

Figure 7A:
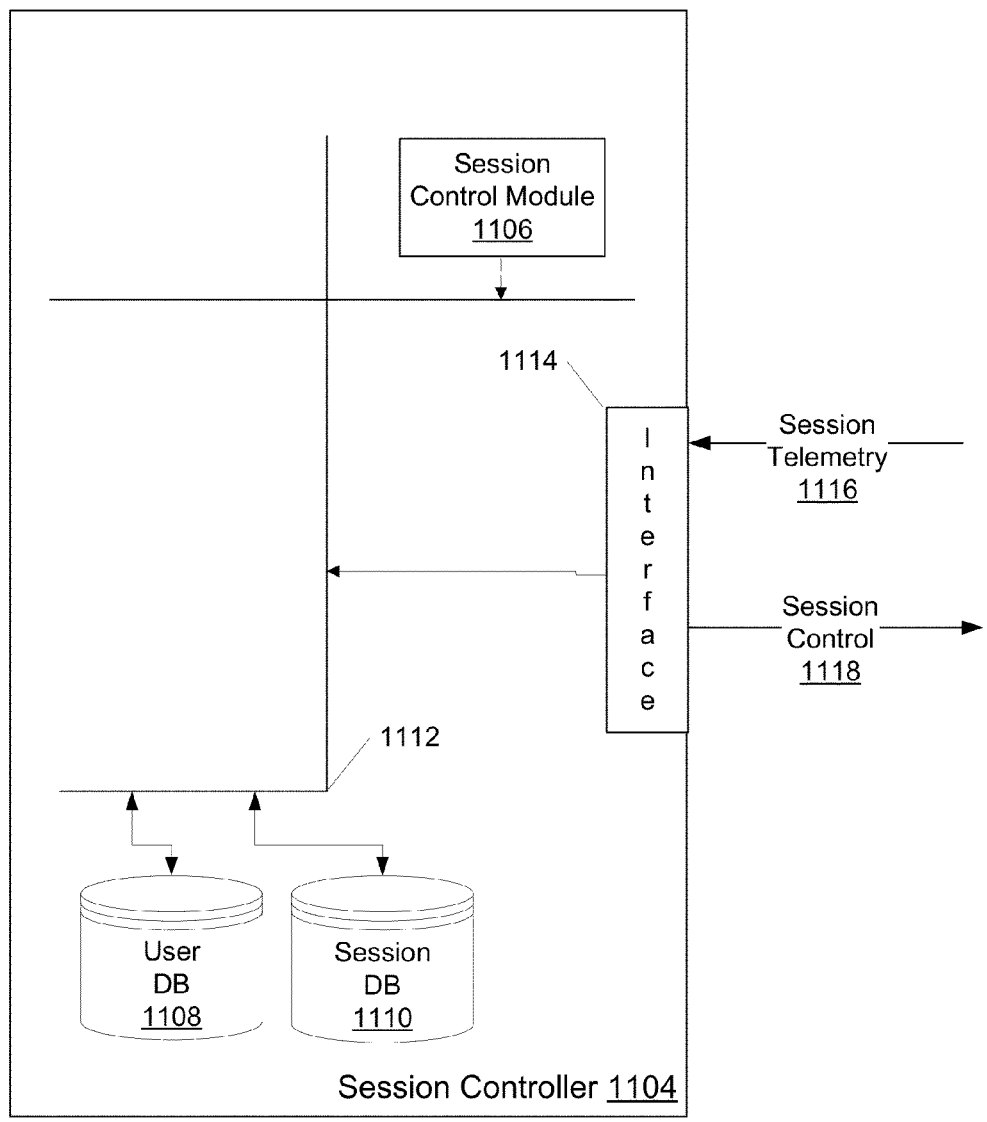
FIGS. 7A and 7B are diagrams of a structure of a user management and session controller of a skill-based progressive interleaved wagering system in accordance with various embodiments of the invention.
Figure 7B:
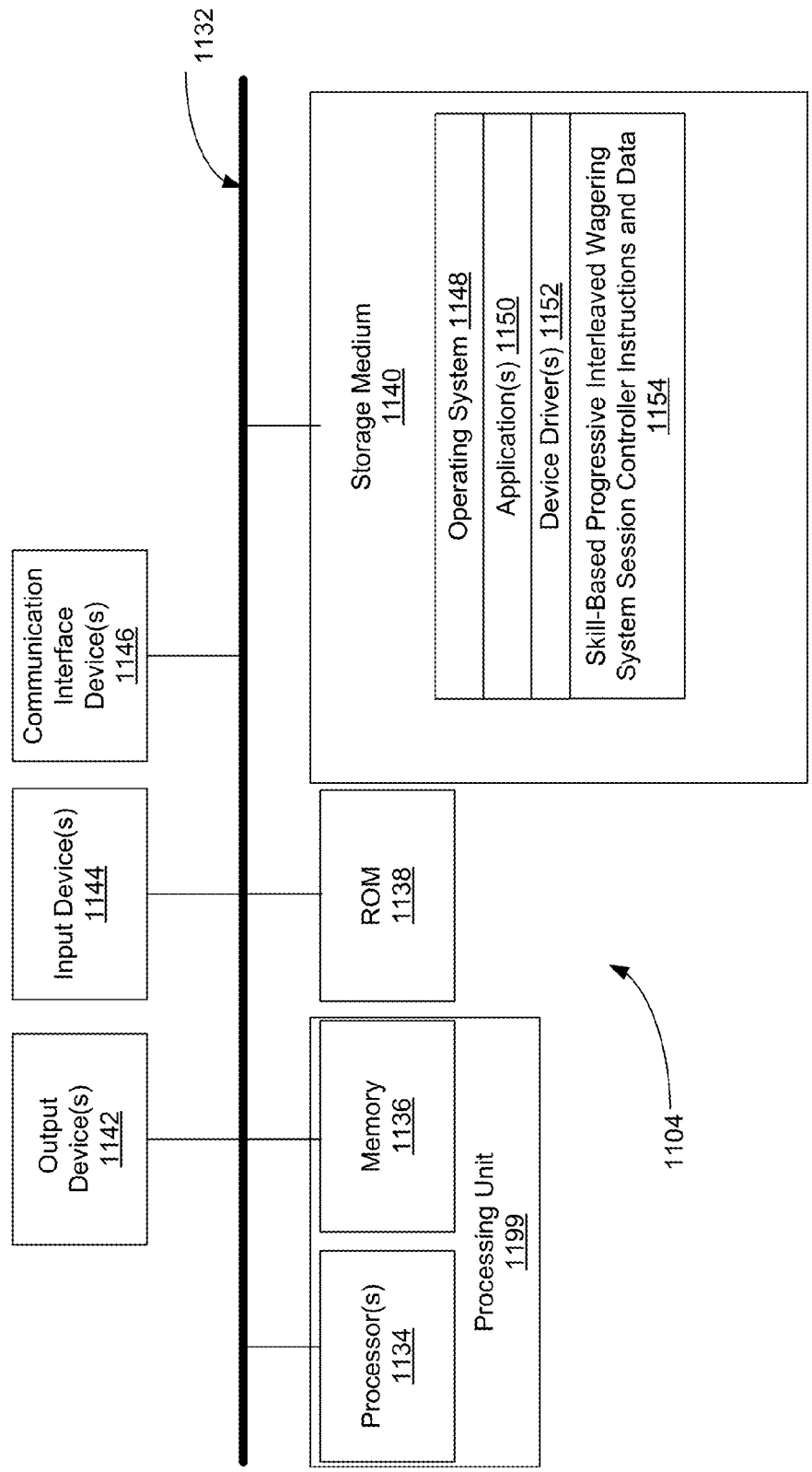

FIGS. 7A and 7B are diagrams of a structure of a user management and session controller of a skill-based progressive interleaved wagering system in accordance with various embodiments of the invention. A user management and session controller may be constructed from or configured using one or more processing devices configured to perform the operations of the user management and session controller. In many embodiments, a wager user session can be constructed from or configured using various types of processing devices including, but not limited to, a mobile device such as a smartphone or the like, a personal digital assistant, a wireless device such as a tablet computer or the like, an electronic gaming machine, a personal computer, a gaming console, a set-top box, a computing device, a controller, a server, or the like.

Referring now to FIG. 7A, in various embodiments, a user management and session controller 1104, suitable for use as user management and session controller 150 of FIG. 1A, includes a user management and session control module 1106 whose processes may include, but are not limited to, registering users of a skill-based progressive interleaved wagering system, validating users of a skill-based progressive interleaved wagering system using user registration data, managing various types of user sessions for users of the skill-based progressive interleaved wagering system, and the like.

The user management and session controller 1104 may further include a datastore 1108 storing user data used to manage user registration and validation. The user management and session controller 1104 may further include a datastore 1110 storing user session data used to manage one or more user sessions.

The various user management and session controller components can interface with each other via an internal bus 1112 and/or other appropriate communication mechanism.

An interface 1114 allows the user management and session controller 1104 to operatively connect to one or more external devices, such as one or more application controllers, wager controllers and/or interactive controllers as described herein. The interface provides for receiving session telemetry data 1116 from the one more external devices. The user session telemetry data includes, but is not limited to, amounts of AC earned by one or more users, requests for entering into a user session as described herein, and telemetry data regarding the progress of one or more users during a user session. The interface 1114 may also provide for communicating secession control data 1118 used to manage a user session.

In numerous embodiments, the interface between the user management and session controller and other systems/devices may be a wide area network (WAN) such as the Internet. However, other methods of communication may be used including, but not limited to, a local area network (LAN), a universal serial bus (USB) interface, and/or some other method by which two electronic devices could communicate with each other.

During operation of the user management and session controller, the external system communicates user session telemetry data to the user management and session controller. The user management and session controller receives the user session telemetry data and uses the user session telemetry data to generate user session control data as described herein. The user management and session controller communicates the user session control data to the external system.

Referring now to FIG. 7B, user management and session controller 1104 includes a bus 1132 that provides an interface for one or more processors 1134, random access memory (RAM) 1136, read only memory (ROM) 1138, machine-readable storage medium 1140, one or more user output devices 1142, one or more user input devices 1144, and one or more communication interface and/or network interface devices 1146.

The one or more processors 1134 may take many forms, such as, but not limited to, a central processing unit (CPU), a multi-processor unit (MPU), an ARM processor, a controller, a programmable logic device, or the like.

In the example embodiment, the one or more processors 1134 and the random access memory (RAM) 1136 form a user management and session controller processing unit 1199. In some embodiments, the user management and session controller processing unit includes one or more processors operatively connected to one or more of a RAM, ROM, and machine-readable storage medium; the one or more processors of the user management and session controller processing unit receive instructions stored by the one or more of a RAM, ROM, and machine-readable storage medium via a bus; and the one or more processors execute the received instructions. In some embodiments, the user management and session controller processing unit is an ASIC (Application-Specific Integrated Circuit). In some embodiments, the user management and session controller processing unit is a SoC (System-on-Chip).

Examples of output devices 1142 include, but are not limited to, display screens, light panels, and/or lighted displays. In accordance with particular embodiments, the one or more processors 1134 are operatively connected to audio output devices such as, but not limited to speakers, and/or sound amplifiers. In accordance with many of these embodiments, the one or more processors 1134 are operatively connected to tactile output devices like vibrators, and/or manipulators.

Examples of user input devices 1144 include, but are not limited to, tactile devices including but not limited to, keyboards, keypads, touch screens, and/or trackballs; non-contact devices such as audio input devices; motion sensors and motion capture devices that the user management and session controller can use to receive inputs from a user when the user interacts with the user management and session controller 1104.

The one or more communication interface and/or network interface devices 1146 provide one or more wired or wireless interfaces for exchanging data and commands between the user management and session controller 1104 and other devices that may be included in a skill-based progressive interleaved wagering system. Such wired and wireless interfaces include, but are not limited to: a Universal Serial Bus (USB) interface; a Bluetooth interface; a Wi-Fi interface; an Ethernet interface; a Near Field Communication (NFC) interface; a plain old telephone system (POTS) interface; a cellular or satellite telephone network interface; and the like.

The machine-readable storage medium 1140 stores machine-executable instructions for various components of a user management and session controller, such as but not limited to: an operating system 1148; one or more application programs 1150; one or more device drivers 1152; and skill-based progressive interleaved wagering system user management and session controller instructions and data 1154 for use by the one or more processors 1134 to provide the features of a skill-based progressive interleaved wagering system user management and session controller as described herein.

In various embodiments, the machine-readable storage medium 1140 is one of a (or a combination of two or more of) a hard drive, a flash drive, a DVD, a CD, a flash storage, a solid state drive, a ROM, an EEPROM, and the like.

In operation, the machine-executable instructions are loaded into memory 736 from the machine-readable storage medium 1140, the ROM 1138 or any other storage location. The respective machine-executable instructions are accessed by the one or more processors 1134 via the bus 1132, and then executed by the one or more processors 1134. Data used by the one or more processors 1134 are also stored in memory 1136, and the one or more processors 1134 access such data during execution of the machine-executable instructions. Execution of the machine-executable instructions causes the one or more processors 1134 to control the user management and session controller 1104 to provide the features of a skill-based progressive interleaved wagering system user management and session controller as described herein Although the user management and session controller 1104 is described herein as being constructed from or configured using one or more processors and machine-executable instructions stored and executed by hardware components, the user management and session controller can be composed of only hardware components in accordance with other embodiments. In addition, although the storage medium 1140 is described as being operatively connected to the one or more processors through a bus, those skilled in the art of processing devices will understand that the storage medium can include removable media such as, but not limited to, a USB memory device, an optical CD ROM, magnetic media such as tape and disks. In some embodiments, the storage medium 1140 can be accessed by the one or more processors 1134 through one of the interfaces or using a communication link. Furthermore, any of the user input devices or user output devices can be operatively connected to the one or more processors 1134 via one of the interfaces or using a communication link.

In various embodiments, the user management and session controller 1104 may be used to construct other components of a skill-based progressive interleaved wagering system as described herein.

In some embodiments, components of a user management and session controller and an application controller of a skill-based progressive interleaved wagering system may be constructed from or configured using a single device using processes that communicate using an interprocess communication protocol. In other such embodiments, the components of a user management and session controller and an application controller of a skill-based progressive interleaved wagering system may communicate by passing messages, parameters or the like.

In some embodiments, components of a user management and session controller and a wager controller of a skill-based progressive interleaved wagering system may be constructed from or configured using a single device using processes that communicate using an interprocess communication protocol. In other such embodiments, the components of a user management and session controller and an application controller of a skill-based progressive interleaved wagering system may communicate by passing messages, parameters or the like.

It should be understood that there may be many embodiments of a user management and session controller 1104 which could be possible, including forms where many modules and components of the user management and session controller are located in various servers and locations, so the foregoing is not meant to be exhaustive or all inclusive, but rather provide data on various embodiments of a user management and session controller 1104.

In numerous embodiments, any of a wager controller, an application controller, an interactive controller, or a user management and session controller as described herein can be constructed from or configured using multiple processing devices, whether dedicated, shared, or distributed in any combination thereof, or can be constructed from or configured using a single processing device. In addition, while certain aspects and features of skill-based progressive interleaved wagering system processes described herein have been attributed to a wager controller, an application controller, an interactive controller, or a user management and session controller, these aspects and features can be provided in a distributed form where any of the features or aspects can be provided by any of a user management and session controller, a wager controller, an application controller, and/or an interactive controller within a skill-based progressive interleaved wagering system without deviating from the spirit of the invention.

Although various components of skill-based progressive interleaved wagering systems are discussed herein, skill-based progressive interleaved wagering systems can be configured with any component as appropriate to the specification of a specific application in accordance with embodiments of the invention. In certain embodiments, components of a skill-based progressive interleaved wagering system, such as a user management and session controller, an application controller, a wager controller, and/or an interactive controller, can be configured in different ways for a specific skill-based progressive interleaved wagering system.

In some embodiments, components of a user management and session controller, an interactive controller, an application controller, and/or a wager controller of a skill-based progressive interleaved wagering system may be constructed from or configured using a single device using processes that communicate using an interprocess communication protocol. In many embodiments, the components of a user management and session controller, an interactive controller, an application controller and a wager controller of a skill-based progressive interleaved wagering system may communicate by passing messages, parameters or the like.

In addition, while certain aspects and features of skill-based progressive interleaved wagering system processes described herein have been attributed to a user management and session controller, a wager controller, an application controller, or an interactive controller, these aspects and features can be provided in a distributed form where any of the features or aspects can be provided by any of a user management and session controller, a wager controller, an application controller, and/or an interactive controller within a skill-based progressive interleaved wagering system.

Operation of Skill-Based Progressive Interleaved Wagering Systems

Figure 8:
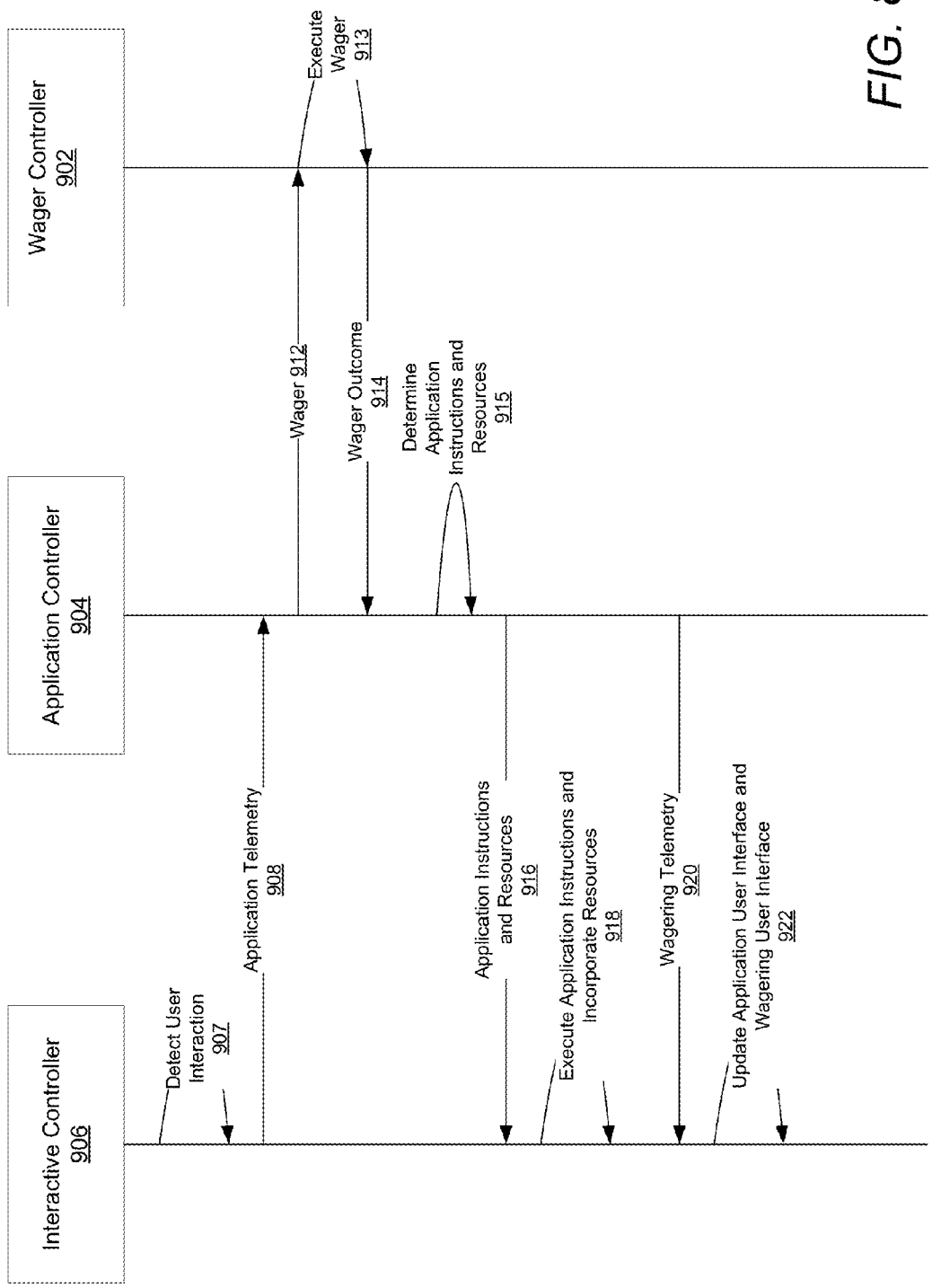
FIG. 8 is a sequence diagram of interactions between components of a skill-based progressive interleaved wagering system in accordance with various embodiments of the invention.

FIG. 8 is a sequence diagram of interactions between components of a skill-based progressive interleaved wagering system in accordance with various embodiments of the invention. The components of the skill-based progressive interleaved wagering system include a wager controller 902, such as wager controller 102 of FIG. 1A, an application controller 904, such as application controller 112 of FIG. 1A, and an interactive controller 906, such as interactive controller 120 of FIG. 1A. The process begins with the interactive controller 906 detecting a user performing a user interaction in a user interface of an interactive application provided by the interactive controller 906. The interactive controller 906 communicates application telemetry data 908 to the application controller 904. The application telemetry data includes, but is not limited to, the user interaction detected by the interactive controller 906.

The application controller 904 receives the application telemetry data 908. Upon determination by the application controller 904 that the user interaction indicates a wagering event, the application controller 904 generates wager execution instructions including a wager request 912 that the application controller 904 uses to instruct the wager controller 902 to execute a wager. The request for a wager event may include wager terms associated with a wagering proposition. The application controller 904 communicates the wager execution instructions to the wager controller 902.

The wager controller 902 receives the wager execution instructions 912 and uses the wager execution instructions to execute (913) a wager in accordance with a wagering proposition. The wager controller 902 communicates a wager outcome 914 of the executed wager to the application controller 904.

The application controller 904 receives the wager outcome and generates (915) interactive application instructions and resources 916 for the interactive application. The application controller 904 uses the interactive application instructions and resources 916 to instruct the interactive controller. The application controller communicates the interactive application instructions and resources 916 to the interactive controller 906. The application controller also communicates wagering telemetry data 920 including the wager outcome to the interactive controller 906.

The interactive controller 906 receives the interactive application instructions and resources 916 and wagering telemetry data 918. The interactive controller 906 incorporates the received interactive application resources and executes the received interactive application instructions (918). The interactive controller updates (922) an application user interface of the interactive application provided by the interactive controller using the interactive application instructions and the resources, and updates (922) a wagering user interface using the wagering telemetry data.

In several embodiments, a user can interact with a skill-based progressive interleaved wagering system by using Cr for wagering in accordance with a wagering proposition along with AC and elements in interactions with an interactive application. Wagering can be executed by a wager controller while an interactive application can be executed by an interactive controller and managed with an application controller.

Figure 9:
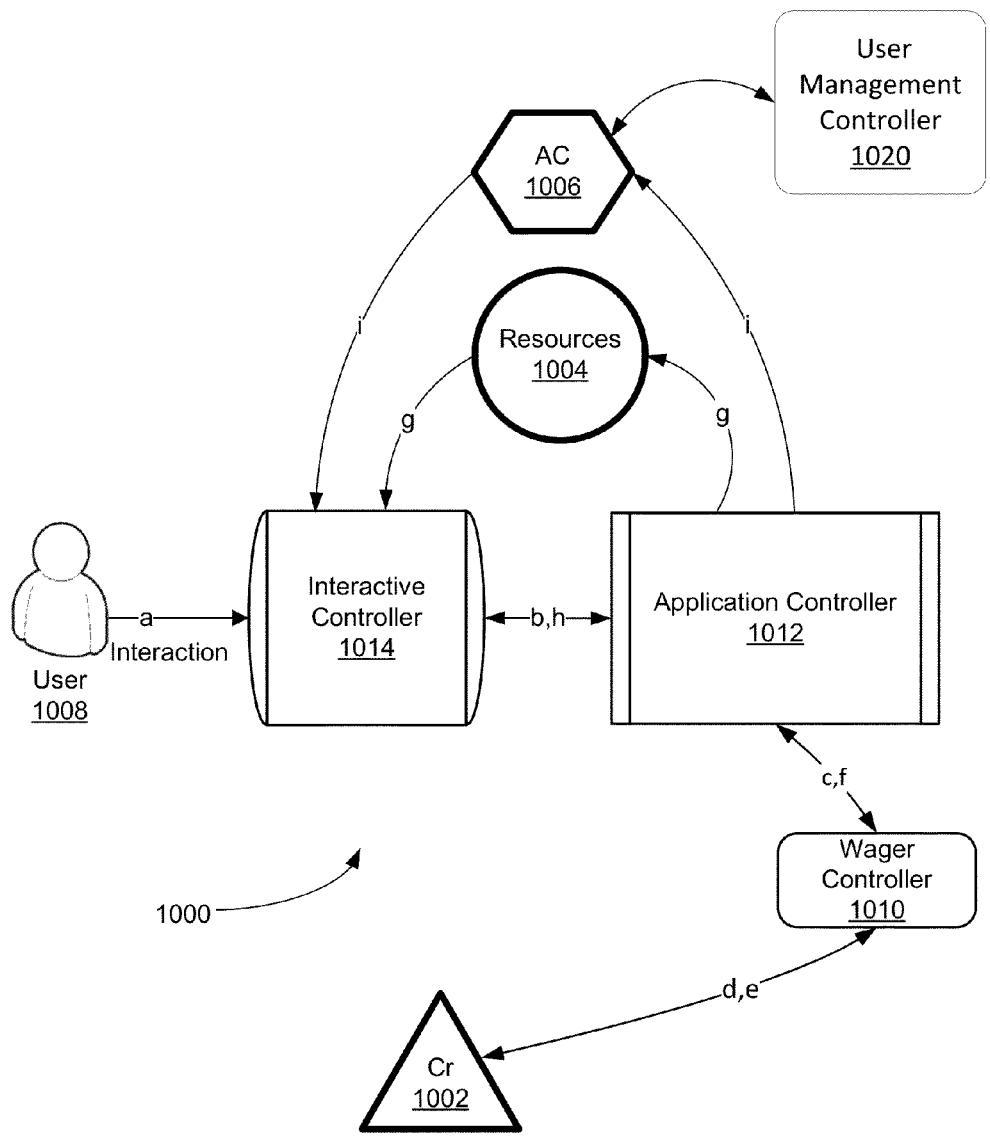
FIG. 9 is a collaboration diagram for components of a skill-based progressive interleaved wagering system in accordance with various embodiments of the invention.

FIG. 9 is a collaboration diagram that illustrates how resources such as AC, Cr, elements, and objects are utilized in a skill-based progressive interleaved wagering system in accordance with various embodiments of the invention. The collaboration diagram 1000 illustrates that Cr 1002, interactive application resources including elements and objects 1004 and AC 1006 can be utilized by a user 1008 in interactions with a wager controller 1010, such as wager controller 102 of FIG. 1A, an application controller 1012, such as wager controller 112 of FIG. 1, and an interactive controller 1014, such as interactive controller 120 of FIG. 1A, of a skill-based progressive interleaved wagering system. The contribution of elements and objects such as included in resources 1004, can be linked to a user's access to credits, such as Cr 1002 and/or AC 1006. Electronic receipt of these credits can come via a smart card, voucher or other portable media, or as received using a communication link from a server. In some embodiments, these credits can be drawn on demand from a user profile located in a database locally on a skill-based progressive interleaved wagering system or in a remote server.

A user's actions and/or decisions can affect an interactive application of interactive controller 1014 that consume and/or accumulate AC 1004 and/or resources 1004 in an interactive application executed by an interactive controller 1014, a wager controller 101 and an application controller 1012. The application controller 1012 can monitor the activities taking place within an interactive application executed by an interactive controller 1014 for wagering event occurrences. The application controller 1012 can also communicate the wagering event occurrences to the wager controller 1010 that triggers a wager of Cr 1002 in accordance with a wagering proposition executed by the wager controller 1010.

In several embodiments, the user commences interaction with the skill-based progressive interleaved wagering system by contributing credit to a skill-based progressive interleaved wagering system such as, but not limited to, Cr 1002 that may be credit in a real currency or may be credit in a virtual currency that is not fungible with a real currency, AC 1006 that may be application environment credits, and specified types of interactive application elements and/or objects 1004. One or more of these contributions may be provided directly as currency and/or transferred in electronically. Electronic transfer may come via a smart card, voucher or other portable media, or as transferred in using a communication link from a user data server or skill-based progressive interleaved wagering system user management and session controller. In many embodiments, contributions may be drawn on demand from user accounts located in servers residing on the network or in the cloud on a real time basis as the credits, elements and/or object are committed or consumed by the skill-based progressive interleaved wagering system. Generally, Cr is utilized and accounted for by the wager controller 1010; and the resources 1004 and AC 1006 are utilized and accounted for by the application controller 1012 and/or the interactive controller 1014.

The user interacts (a) with an interactive application provided by the interactive controller 1014 with the interaction representing an action by the user within the context of the interactive application. The interactive controller 1014 receives the user interaction and communicates (b) the interaction to the application controller 1012. The application controller 1012 receives the interaction and determines from the interaction whether or not a wager should be triggered. If a wager should be triggered, the application controller 1012 instructs (c) the wager controller 1010 to execute a wager in accordance with a wagering proposition associated with the interaction and thereby triggers a wager. The wager controller receives the wager execution instructions and executes the wager in accordance with the wagering proposition, and consumes (d) an appropriate amount of Cr 1002 for the wager. The wager controller 1010 adjusts (e) the Cr 1002 based upon a wager outcome of the wager and communicates (f) the wager outcome to the application controller 1012 as to the outcome of the wager triggered by the application controller 1012. The application controller 1012 receives the wager outcome. The application controller determines what resources 1004 should be provided to the interactive controller, generates the resources 1004 and application instructions and instructs (g) the interactive controller 1014 using the resources 1004 and application instructions. The interactive controller receives the resources 1004 and application instructions from the application controller 1012 and integrates them into the execution of the interactive application provided by the interactive controller 1014.

In some embodiments, the application controller 1012 communicates (h) data about the wager outcome to the interactive controller. The interactive controller receives the wager outcome and displays the wager outcome to the user 1008.

In some embodiments, the application controller 1012 determines what resources and instructions to provide to the interactive controller 1014 for use by the interactive application provided by the interactive controller 1014 partially on the basis of the wager outcome. In some such embodiments, resources are provided in a case that the wager was a winning wager for the user. In other such embodiments, fewer or no resources are provided in a case of a losing wager.

In some embodiments, the application controller 1012 determines what resources to provide based on internal logic of the application controller 1012. In some such embodiments, the application controller 1012 employs a random result generator, such as a P/RNG, to generate a random result and the random result is used to determine what resources are provided to the interactive controller 1014.

In several embodiments, the application controller 1012 determines an increment or a decrement of an amount of AC 1006 using the interactions received from the interactive controller. The increment or decremented amount is communicated (i) to the interactive controller for display to the user.

In some embodiments, the application controller 1012 executes a wager of Cr as a virtual currency, AC, elements or objects. In some such embodiments, the application controller 1012 employs a random result generator, such as a P/RNG, to generate a random result and the random result is used to determine a wager outcome in Cr as a virtual currency, AC, elements or objects.

The following is description of an embodiment of the described collaboration where an interactive application provided by an interactive controller of a skill-based progressive interleaved wagering system is a first person shooter game. The process begins by a user selecting a machine gun to use in the game and then fires a burst of bullets at an opponent. The interactive controller can communicate to the application controller of the user's choice of weapon, that a burst of bullets was fired, and/or the outcome of the burst. The application controller communicates to the wager controller that 3 credits (Cr) are to be wagered on the outcome of a wagering event to match the three bullets consumed. The wager controller then performs the wagering event and determines the result of the wager and may determine the winnings from a paytable. The wager controller consumes 3 credits of Cr for the wager and executes the specified wager. By way of example, the wager controller may determine that the user hit a jackpot of 6 credits and returns the 6 credits to the Cr and communicates to the application controller that 3 net credits were won by the user.

The application controller communicates to the interactive controller to add 3 bullets to an ammunition clip. The interactive controller adds 3 bullets back to the ammo clip. The ammunition may be added by directly adding the ammunition to the clip or by allowing the user to find extra ammunition during use. The application controller logs the new user score (AC) in the game (as a function of the successful hit on the opponent) based on the interactive controller communication, and adds 2 extra points to the user score since a jackpot has been won. The application controller then adds 10 points to the user score (AC) given the success of the hit which in this example is worth 8 points, plus the 2 extra point. Note that this example is only intended to provide an illustration of how credits flow in a skill-based progressive interleaved wagering system, but is not intended to be exhaustive and only lists only one of numerous possibilities of how a skill-based progressive interleaved wagering system may be configured to manage its fundamental credits.

In many embodiments, user management and session controller 1020, such as user account controller 150 of FIG. 1A, of a skill-based progressive interleaved wagering system is used to store AC for use of the user. In such an embodiment, AC is generated by the application controller based on the user's use of the skill-based progressive interleaved wagering system and an amount of the AC is communicated to the user management and session controller 1020. The user management and session controller stores the amount of AC between user sessions. In some embodiments, the user management and session controller communicates an amount of AC to the application controller at the start of a user session for use by the user during a user session.

Figure 10:
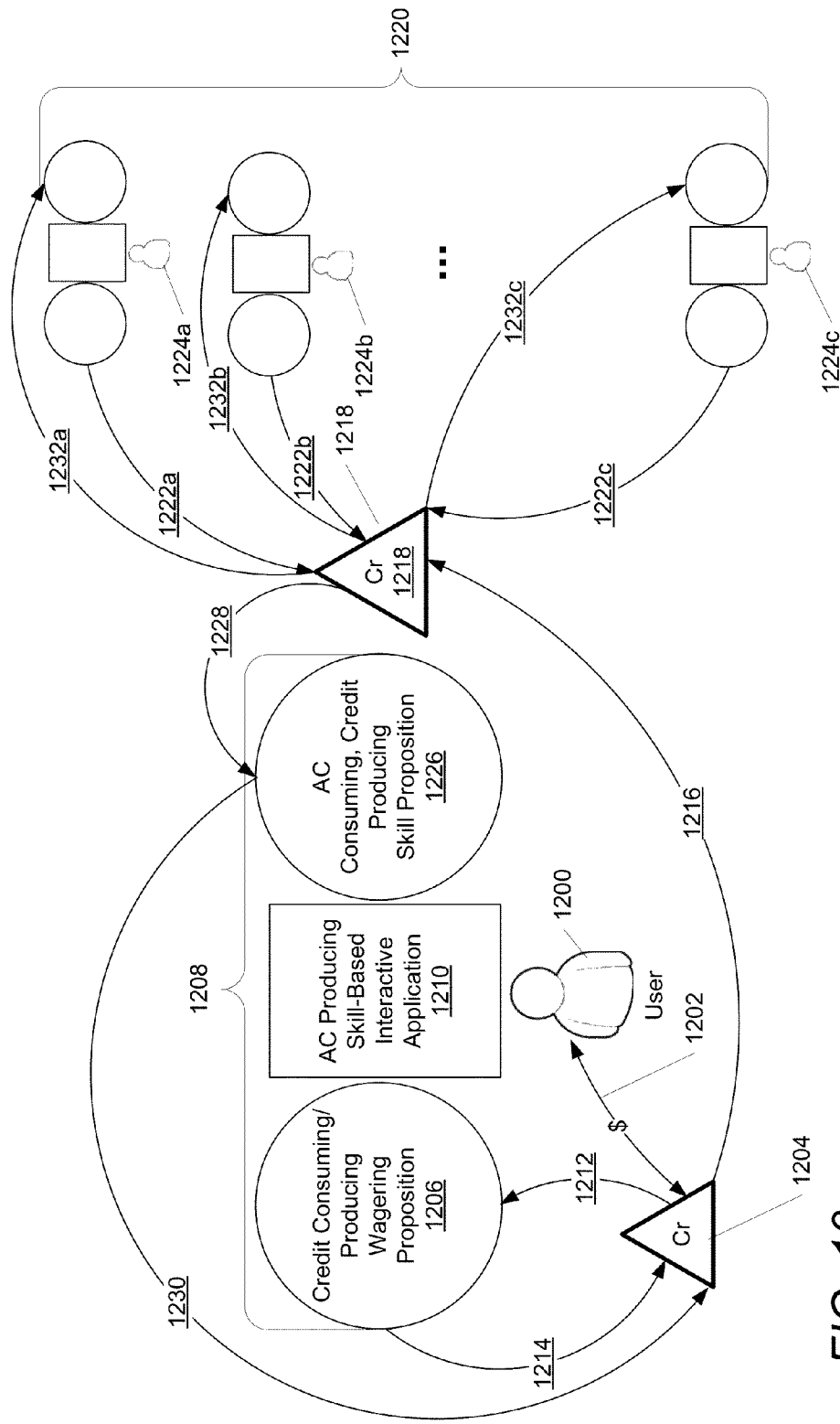
FIG. 10 illustrates credit flows within a skill-based progressive interleaved wagering system in accordance with some embodiments of the invention.

FIG. 10 illustrates credit flows within a skill-based progressive interleaved wagering system in accordance with some embodiments of the invention. In a skill-based progressive interleaved wagering system, a user 1200 provides value 1202 for credits 1204 to be wagered in accordance with a credit consuming and producing wagering proposition 1206 of a skill-based progressive interleaved wagering system subsystem 1208. The credits may or may not be available for the user to cash out for value. If the credits can be cashed out for value, the credits are credits in a real currency or the like, and if the credits cannot be cashed out for value, the credits are credits in a virtual currency or the like. As the user interacts with the skill-based progressive interleaved wagering system subsystem 1208, the user interacts with a skill-based interactive application 1210.

As the user interacts with the skill-based interactive application 1210, wagers of credits are triggered in response to the user's interactions with the skill-based interactive application 1210 in accordance with the wagering proposition 1206. Wagers consume 1212 credits in accordance with the wagering proposition. If a wager is successful, then credits are produced 1214 in accordance with the wagering proposition. If wagers are unsuccessful, then no credits are produced. In addition, during the user's interactions with the skill-based interactive application 1210, application credit (AC) is earned by the user for the user's skillful interaction with the skill-based interactive application 1210. As the user interacts with the skill-based interactive application 1210, the user accrues AC over time, thus the skill-based interactive application 1210 produces AC as earned by the user.

As each wager is made, a portion of each wager is provided 1216 to a progressive pool of credits 1218. In a similar manner, one or more additional skill-based progressive interleaved wagering subsystems 1220 provide (1222a, 1222b, and 1222c) portions of wagers made by respective one or more additional users (1224a, 1224b, and 1224c) of the one or more skill-based progressive interleaved wagering subsystems 1220.

During a session in which the user is interacting with the progressive interleaved wagering subsystem 1208, a skill proposition 1226 is presented to one or more users, such as user 1200. An amount of credits associated with the skill proposition is provided 1228 as all or a portion of the progressive pool of credits 1218. The skill proposition 1226 includes a skill-based challenge presented to the user within the context of the skill-based interactive application 1210. If the user accomplishes the challenge, all or a portion of the amount of credits associated with the skill proposition 1226 are awarded 1230 to the user and added to the user's credits 1204.

Accordingly, in several embodiments, a skill-based progressive interleaved wagering system provides for a progressive pool of credits to be funded by wagers made in accordance with a wagering proposition of a skill-based progressive interleaved wagering system, and provides an opportunity for one or more users to be awarded all or a portion of the progressive pool of credits by meeting a skill-based challenge within an interactive skill-based interactive application of the skill-based progressive interleaved wagering system.

In some embodiments, the user 1200 provides AC earned in the skill-based interactive application 1210 in order to have an opportunity at the skill proposition. Accordingly, in such embodiments, the skill proposition can be considered as consuming AC and producing credits for the user.

In various embodiments, the skill-based interactive application 1210 is constructed so as to provide AC at a higher rate to a user, the more skillful the user is at the skill-based interactive application 1210. In some embodiments, the skill-based interactive application 1210 provides AC at an increased rate in proportion to a magnitude of a period of time that the user interacts with the skill-based interactive application 1210. In various embodiments, the skill-based interactive application 1210 is constructed to provide AC at an increased rate in direct proportion to an amount of credits committed by the user to wagers in accordance with the wagering proposition 1206.

In many embodiments, a skill proposition is provided to two or more users. In such embodiments, it is possible for two or more of the users to meet a skill challenge included in the skill propositions. Accordingly, an amount of credits from the progressive pool of credits 1218 is allocated (1232a, 1232b and 1232c) to the two or more users who have met the skill challenge.

In several embodiments, a skill proposition is generated on the basis of a determined skill level of one or more users.

Figure 11:
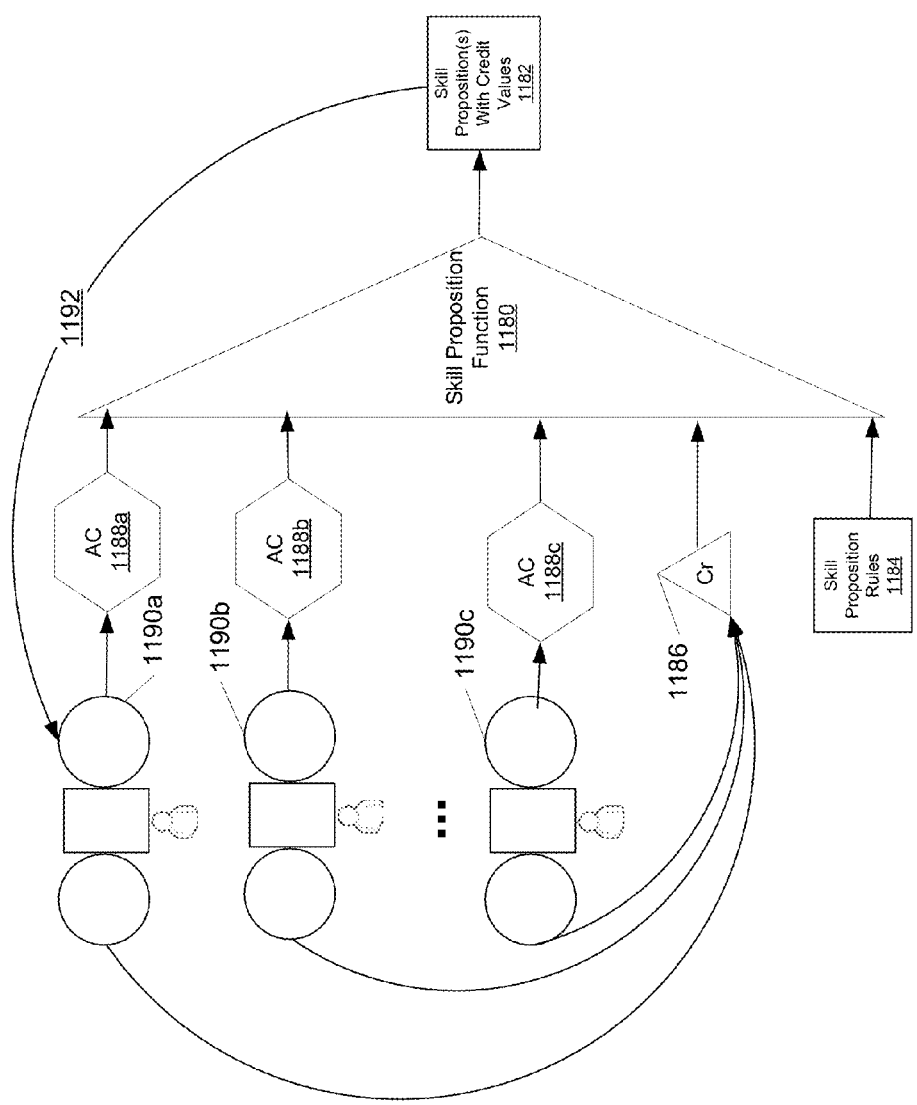
FIG. 11 is a process flow diagram of a process of determining an AC-based skill proposition within a skill-based progressive interleaved wagering system in accordance with some embodiments of the invention.

FIG. 11 is a process flow diagram of a process of determining an AC-based skill proposition within a skill-based progressive interleaved wagering system in accordance with some embodiments of the invention. As illustrated, a skill proposition function 1180 generates a skill proposition 1182 with associated credit values. The skill proposition function 1180 receives as inputs, one or more skill proposition rules 1184, an amount of a progressive pool of credits 1186, and amounts of application credit (1188a, 1188b and 1188c) from respective user subsystems (1190a, 1190b and 1190c). In operation, credits from a plurality of wagers of credits wagered in accordance with a wagering proposition of the user subsystems are received from the user subsystems and pooled in the progressive pool of credits. The wagers of credits are made by users of the user subsystems while interacting with the interactive applications of the user subsystems.

The skill proposition function 1180 receives, from the user subsystems, the respective application credits earned by users through skillful interaction with a skill-based interactive application of the user subsystems where the respective application credits are earned by the plurality of users during wagering of the wagers of credits. The skill proposition function generates the skill proposition 1182. The skill proposition 1182 includes a skill-based challenge of the interactive application of the user subsystems and an amount of the progressive pool of credits. The skill proposition provides 1192 the skill proposition to one or more of the plurality of user subsystems based on the plurality of respective application credits.

Figure 12A:
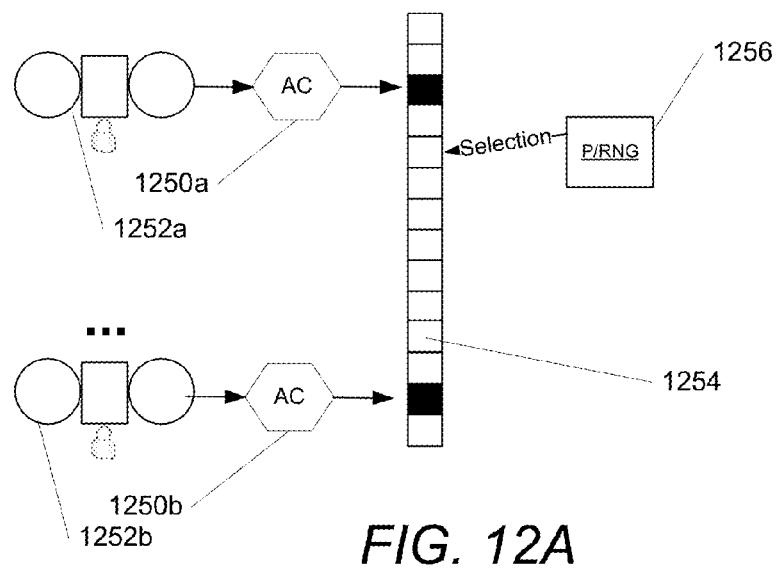
FIGS. 12A, 12B and 12C illustrate aspects of a skill-based progressive interleaved wagering system in accordance with some embodiments of the invention.
Figure 12B:
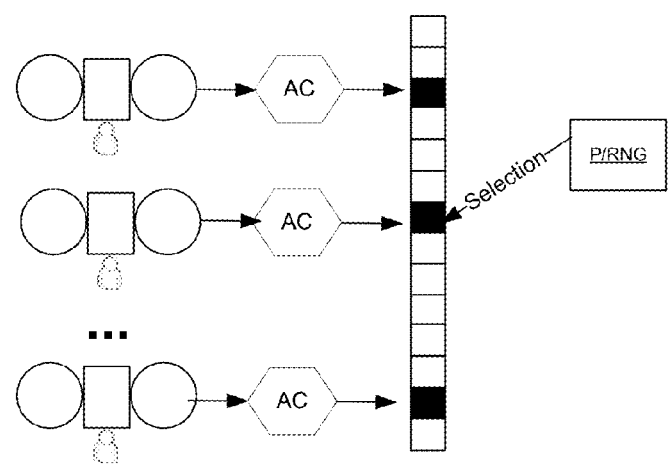
Figure 12C:
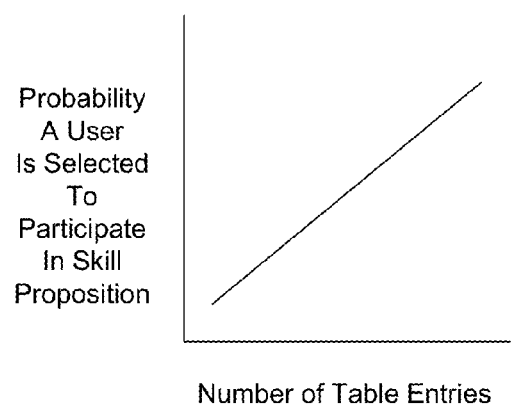

FIGS. 12A, 12B and 12C illustrate aspects of a process of determining an AC-based skill proposition within a skill-based progressive interleaved wagering system in accordance with some embodiments of the invention. In some embodiments of a skill-based progressive interleaved wagering system, an allocation of opportunities for one or more users to participate in a skill-based proposition is determined using respective application credits for the one or more users. One or more skill-based progressive interleaved wagering system user subsystems are randomly selected from the allocation of opportunities to receive a skill-based proposition.

Referring to FIG. 12A, in accordance with various embodiments of a skill-based progressive interleaved wagering system, users are allocated opportunities to participate in a skill proposition based on an amount of application credits (AC) provided by the users. Users are selected to participate in the skill proposition by random selection between the allocated opportunities. As illustrated, a skill-based progressive interleaved wagering system receives respective amounts of application credit (1250a and 1250b) from respective one or more skill-based progressive interleaved wagering system user subsystems (1252a and 1252b). Each amount of AC provides an allocation of an opportunity for a respective user to participate in skill proposition, as indicated by a table of allocated opportunities 1254. As the skill-based progressive interleaved wagering system receives additional amounts of AC from the skill-based progressive skill wagering interleaved games, more and more additional allocated opportunity entries are made into the table. The additional allocated opportunities may be for unique users, or may be additional opportunities for a single user, that is, a user may exchange multiple amounts of AC for additional opportunities to participate in the skill proposition. In order to determine which users will participate in the skill proposition, the skill-based progressive interleaved wagering system uses a pseudo random or random number generator, or the like, 1256 to generate a random outcome that is used to randomly select one or more table locations. If the selected table location does not correspond to an entry of an allocated opportunity, the skill proposition may not be provided to any of the users.

In some embodiments, entry of allocations of opportunities is restricted so that a single entry of an allocated opportunity is allowed for each table location. That is, a skill-based proposition will only be offered to a single user. In other embodiments, multiple entries of allocated opportunities are allowed. That is, one or more users may be presented with a skill-based proposition. In such a case, if more than one user meets the skill-based challenged of the skill-based proposition, the users share in the credits allocated to the skill-based proposition.

FIG. 12B illustrates an example embodiment wherein an additional amount of AC has been received from a skill-based progressive interleaved wagering system user subsystem, and an additional allocated opportunity entry has been made into the table of allocated opportunities for a respective user. A further random selection of a table location in the table of allocated opportunities yields an allocated opportunity entry for the additional respective user and a skill proposition is provided to the additional respective user.

FIG. 12C illustrates an attribute of a process of allocating opportunities to users until a user's allocated opportunity is selected. Allocation of opportunities for users to participate in a skill-based proposition in exchange for AC and subsequent attempts to randomly select users to participate in the skill-based proposition may continue until one or more users are selected. In embodiments where the table of allocated opportunities is finite in size, the probability of a user's selection to participate in a skill proposition increases as the number of table entries increases. Such a process also ensures that at least one user will be selected eventually as the table fills to capacity.

In some embodiments of a skill-based progressive interleaved wagering system, determining an allocation of opportunities for users to participate in the skill-based proposition using respective application credits includes receiving respective selections of opportunities from the users. In such embodiments, a display of a table of allocated opportunities is generated for a user with table locations already having an entry of an allocated opportunity being demarked from table locations not having an entry of an allocated opportunity. The user may then select, from the displayed table, a table location for an entry of an allocated opportunity.

In some embodiments, the user is restricted from selecting a table location that already has an allocated opportunity. In other embodiments, no such restriction exists and the user may select a table location that already has an entry for an allocated opportunity. In such embodiments, more than one user may be selected to participate in a skill-based proposition. In such a case, if more than one user meets the challenge of the skill-based proposition, the users are allocated portions of the credits associated with the skill-based opportunity on a basis of the number of opportunities that each user acquired through exchange of application credit.

Figure 13:
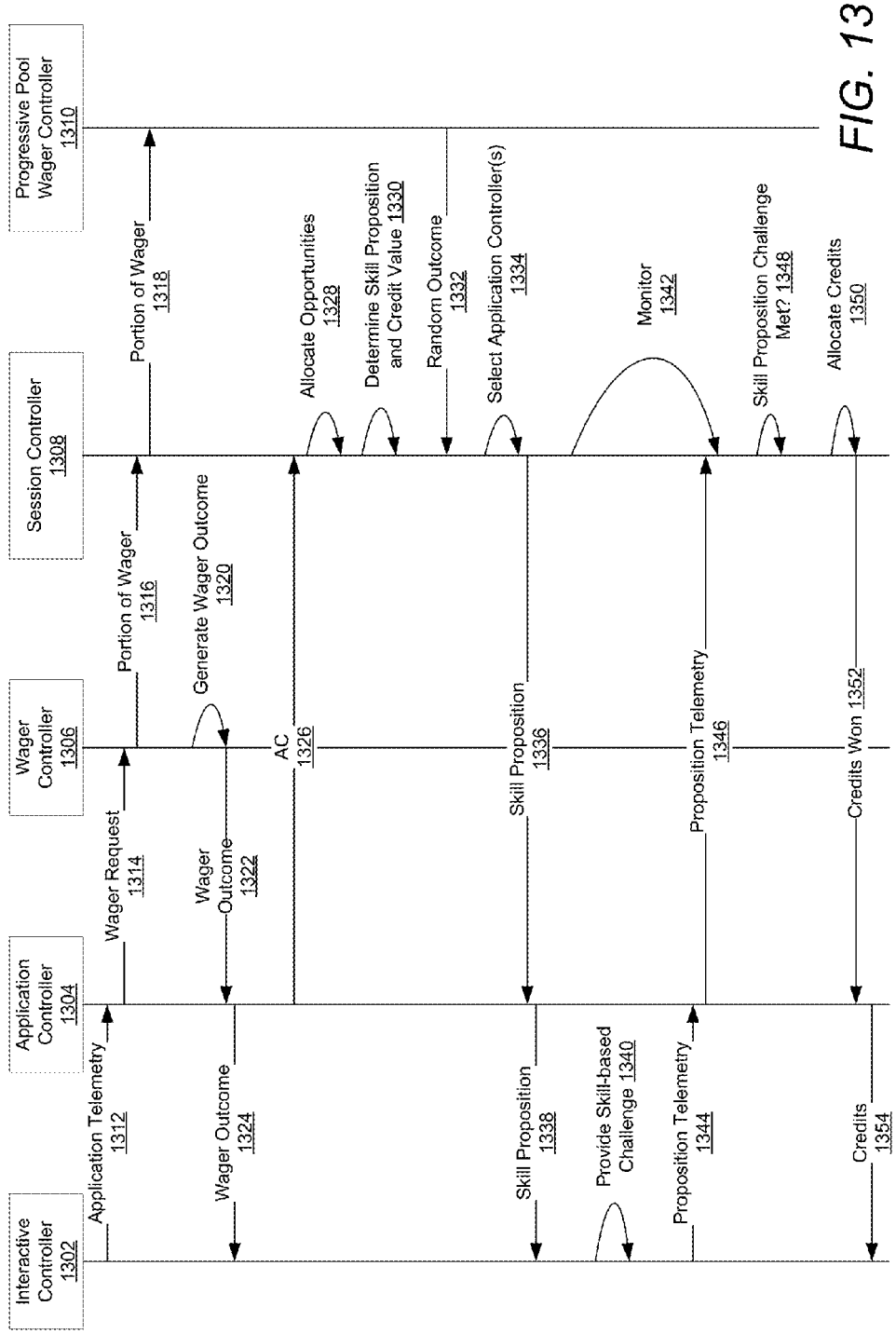
FIG. 13 is a sequence diagram of a process of determining an AC-based skill proposition within a skill-based progressive interleaved wagering system in accordance with some embodiments of the invention.

FIG. 13 is a sequence diagram of a process of determining an AC-based skill proposition within a skill-based progressive interleaved wagering system in accordance with some embodiments of the invention. In some embodiments, the system includes an interactive controller 1302, an application controller 1304, a wager controller 1306, a session controller 1308, and a progressive pool wager controller 1310. In some embodiments, the interactive controller 1302 provides an interactive application. In some embodiments, the interactive application is an interactive game. In some embodiments, the interactive game is a skill-based game. In some embodiments, the interactive game is a chance-based game.

In some embodiments, the interactive controller 1302, the application controller 1304, and the wager controller 1306 are associated with a user and form a subsystem operatively connected to the session controller 1308 and the progressive pool wager controller 1310, and one or more other subsystems associated with one or more other users are operatively connected to the session controller 1308 and the progressive pool wager controller 1310. In some embodiments, the application controller and wager controller of each subsystem are operatively connected to the session controller 1308 and the progressive pool wager controller 1310 via a network.

The interactive controller 1302 communicates, to the application controller 1304, application telemetry (1312). In some embodiments, the application telemetry is generated by the interactive controller 1302 based on actions or events in the interactive application. In some embodiments, the application telemetry follows an application telemetry protocol. In some embodiments, the application telemetry protocol comprises an identification of the user. In some embodiments, the application telemetry protocol comprises an identification of the interactive application. In some embodiments, the application telemetry protocol comprises actions or events in the interactive application. In some embodiments, the application telemetry protocol is an array of the elements making up the application telemetry. In some embodiments, the application telemetry protocol is a string. In some embodiments, the application telemetry protocol is a concatenation of the data of elements making up the application telemetry.

The application controller 1304 receives, from the interactive controller 1302, the application telemetry (1312). The application controller 1304 scans the application telemetry to determine whether to trigger a wager request. The application controller 1304 generates wager request instructions. The application controller 1304 instructs the wager controller 1306 by communicating the wager request instructions to the wager controller 1306 (1314). In some embodiments, the wager request instructions follows a wager request instructions protocol. In some embodiments, the wager request instructions protocol comprises an identification of the user. In some embodiments, the wager request instructions protocol comprises an identification of the interactive application. In some embodiments, the wager request instructions protocol comprises an identification of the wagering mechanic and/or paytable. In some embodiments, the wager request instructions protocol comprises an amount to be wagered. In some embodiments, the wager request instructions protocol is an array of the elements making up the wager request instructions. In some embodiments, the wager request instructions protocol is a string. In some embodiments, the wager request instructions protocol is a concatenation of the data of elements making up the wager request instructions.

The wager controller 1306 receives, from the application controller 1304, the wager request instructions (1314). The wager controller 1306 determines a wager to be made based on the wager request instructions and communicates, to the session controller 1308, a portion of the wager to be made (1316). The session controller 1308 receives, from the wager controller 1306, the portion of the wager to be made (1316). The session controller 1308 communicates the portion of the wager to the progressive pool wager controller 1310. In some embodiments, the progressive pool wager controller 1310 pools wager portions from one or more other subsystems associated with one or more other users to form a progressive pool.

The wager controller 1306 determines a wager outcome based on the wager request instructions (1320). The wager controller 1306 communicates, to the application controller 1304, wager outcome data comprising the wager outcome (1322).

The application controller 1304 receives, from the wager controller 1306, the wager outcome data (1322). The application controller 1304 scans the wager outcome data to determine the wager outcome. The application controller 1304 generates wager outcome display instructions based on the wager outcome. The application controller 1304 instructs the interactive controller 1302 by communicating the wager outcome display instructions to the interactive controller 1302 (1324). In some embodiments, the wager outcome display instructions follows a wager outcome display instructions protocol. In some embodiments, the wager outcome display instructions protocol comprises an identification of the user. In some embodiments, the wager outcome display instructions protocol comprises an identification of the interactive application. In some embodiments, the wager outcome display instructions protocol comprises an identification of the wagering mechanic and/or paytable. In some embodiments, the wager outcome display instructions protocol comprises an amount awarded or lost. In some embodiments, the wager outcome display instructions protocol is an array of the elements making up the wager outcome display instructions. In some embodiments, the wager outcome display instructions protocol is a string. In some embodiments, the wager outcome display instructions protocol is a concatenation of the data of elements making up the wager outcome display instructions.

The interactive controller 1302 receives, from the application controller 1304, the wager outcome display instructions (1324). The interactive controller 1302 displays the wager outcome based on the wager outcome display instructions.

The application controller 1304 generates application credit communication instructions. The application controller 1304 instructs the session controller 1308 by communicating the application credit communication instructions to the session controller 1308 (1326). In some embodiments, the application credit communication instructions follows an application credit communication instructions protocol. In some embodiments, the application credit communication instructions protocol comprises an identification of the user. In some embodiments, the application credit communication instructions protocol comprises an identification of the interactive application. In some embodiments, the application credit communication instructions protocol comprises an amount of application credits. In some embodiments, the application credit communication instructions protocol is an array of the elements making up the application credit communication instructions. In some embodiments, the application credit communication instructions protocol is a string. In some embodiments, the application credit communication instructions protocol is a concatenation of the data of elements making up the application credit communication instructions.

The session controller 1308 receives, from the application controller 1304, the application credit communication instructions (1326). The session controller 1308 allocates opportunities to respective users of the one or more subsystems based on the received amounts of application credit as described herein (1328).

The session controller 1308 generates a skill proposition and credit value (1330). In some embodiments, the skill-based proposition includes a skill-based challenge in the interactive application provided by the interactive controller 1302 and an amount of credits from the progressive pool of credits. In some embodiments, the session controller 1308 determines the amount of credits from the progressive pool of credits and requests the amount from the progressive pool wager controller 1310. In some embodiments, requesting the amount of credits from the progressive pool of credits includes instructing the progressive pool wager controller 1310 which application controller of the one or more subsystem application controllers to communicate the amount of credits to.

The progressive pool wager controller 1310 communicates a random outcome to the session controller 1308 (1332). The session controller 1308 receives, from the progressive pool wager controller 1310, the random outcome (1332).

The session controller 1308 selects one or more application controllers from the one or more subsystems based on the received random outcome (1334). The session controller 1308 communicates skill proposition data including the skill proposition, to the application controller 1304, the application controller 1304 being one of the one or more selected application controllers (1336). In some embodiments, the selected one or more of the one or more application controllers are selected on the basis of the allocated opportunities determined from the respective one or more amounts of application credit and on the basis of the random outcome.

The application controller 1304 receives, from the session controller 1308, the skill proposition data (1336). The application controller 1304 scans the skill proposition data to determine the skill proposition. The application controller 1304 generates skill proposition instructions using the skill proposition. The application controller 1304 instructs the interactive controller 1302 by communicating the skill proposition instructions to the interactive controller 1302 (1338). In some embodiments, the skill proposition instructions follows a skill proposition instructions protocol. In some embodiments, the skill proposition instructions protocol comprises an identification of the user. In some embodiments, the skill proposition instructions protocol comprises an identification of the interactive application. In some embodiments, the skill proposition instructions protocol comprises an identification of the skill proposition. In some embodiments, the skill proposition instructions protocol is an array of the elements making up the skill proposition instructions. In some embodiments, the skill proposition instructions protocol is a string. In some embodiments, the skill proposition instructions protocol is a concatenation of the data of elements making up the skill proposition instructions.

The interactive controller 1302 receives, from the application controller 1304, the skill proposition instructions (1338). The interactive controller 1302 provides a skill-based challenge to the respective user of the interactive application within the context of the interactive application based on the skill proposition instructions (1340). The session controller 1308 monitors for proposition telemetry (1342).

As the user attempts to meet the skill-based challenge, the interactive controller 1302 communicates, to the application controller 1304, proposition telemetry (1344). In some embodiments, the proposition telemetry includes information about the progress the user is making toward completing the skill-based challenge of the skill proposition. In some embodiments, the proposition telemetry follows a proposition telemetry protocol. In some embodiments, the proposition telemetry protocol comprises an identification of the user. In some embodiments, the proposition telemetry protocol comprises an identification of the interactive application. In some embodiments, the proposition telemetry protocol comprises an identification of the skill proposition. In some embodiments, the proposition telemetry protocol is an array of the elements making up the proposition telemetry. In some embodiments, the proposition telemetry protocol is a string. In some embodiments, the proposition telemetry protocol is a concatenation of the data of elements making up the proposition telemetry.

The application controller 1304 receives, from the interactive controller 1302, the proposition telemetry (1344). The application controller 1304 communicates, to the session controller 1308, the proposition telemetry (1346). The session controller 1308 receives, from the application controller 1304, the proposition telemetry (1346).

The session controller 1308 determines whether the skill-based challenge has been met based on the proposition telemetry (1348). When the challenge has been met, the session controller 1308 allocates an amount of the progressive pool of credits to the user associated with the interactive application (1350). In some embodiments, when one or more other subsystems communicate proposition telemetry to the session controller 1308, the session controller 1308 determines whether a plurality of users have met the challenge and respective amounts of the amount of progressive pool of credits are allocated to the plurality of users that met the skill-based challenge. If only a single user has met the skill-based challenge, the session controller 1308 allocates all of the credits associated with the skill proposition to the single user that has met the challenge. If more than one user of the respective users has met the skill-based challenge, the session controller 1308 allocates credits associated with the skill proposition on the basis of how many users have met the skill-based challenge.

The session controller 1308 communicates, to the application controller 1304, credit data including the amount of credits won by the user associated with the application controller 1304 (1352). The application controller 1304 receives, from the session controller 1308, the credit data (1352).

The application controller 1304 scans the credit data to determine the amount of credit awarded. The application controller 1304 generates credit display instructions based on the amount of credit awarded. The application controller 1304 instructs the interactive controller 1302 by communicating the credit display instructions to the interactive controller 1302 (1354).

The interactive controller 1302 receives, from the application controller 1304, the credit display instructions (1354). The interactive controller 1302 displays the credit awarded based on the credit display instructions.

In some embodiments, the session controller 1308 provides the skill proposition to one or more subsystems on the basis of the plurality of respective application credits by determining an allocation of opportunities for the plurality of users to participate in the skill-based proposition using the respective application credits, and selecting one or more of the plurality of subsystems using a random selection from the allocation of opportunities.

In various embodiments, determining the allocation of opportunities for the plurality of users to participate in the skill-based proposition using the respective application credits further includes receiving a plurality of respective selections of opportunities from the plurality of users.

Figure 14:
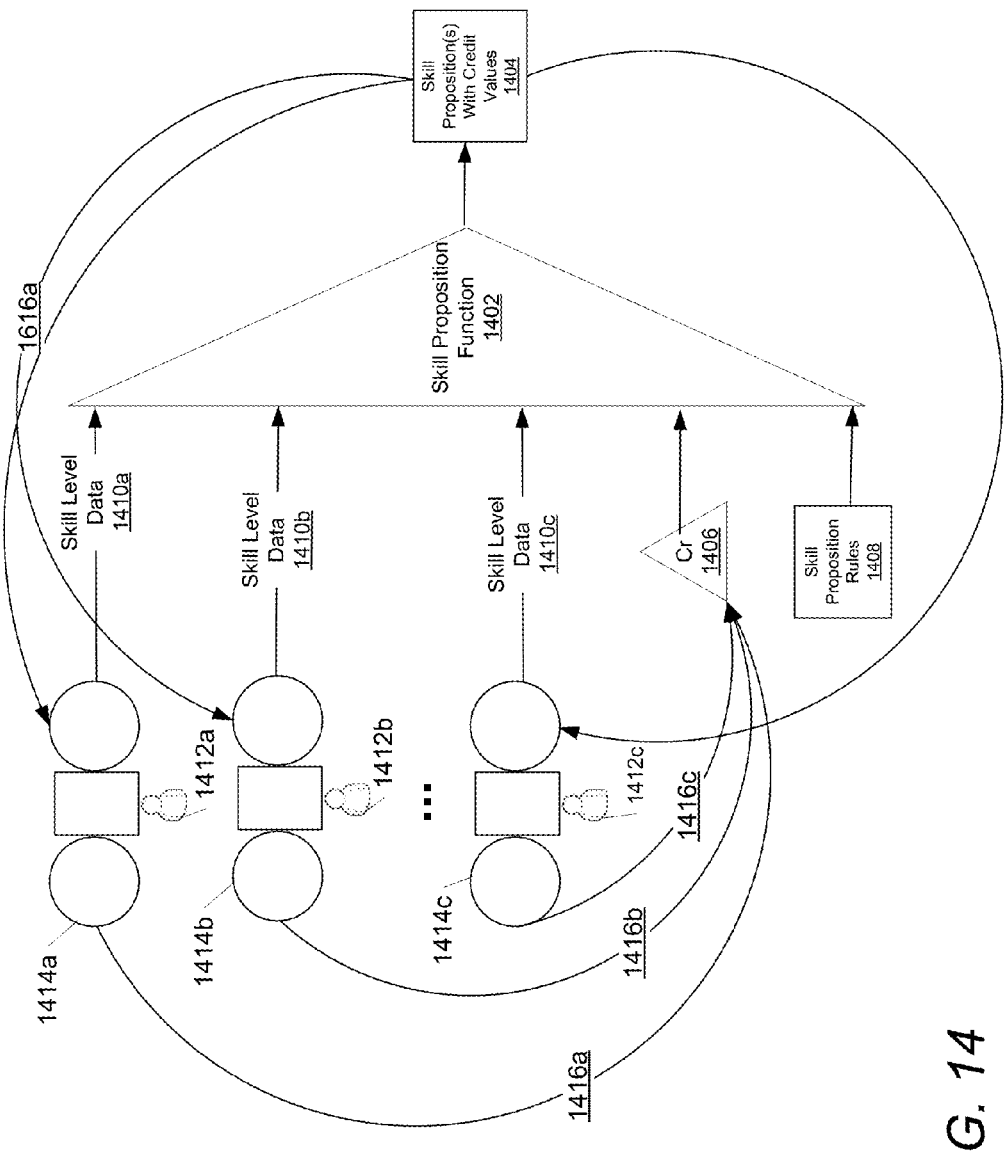
FIG. 14 is a process flow diagram of a process of determining a skill level-based skill proposition within a skill-based progressive interleaved wagering system in accordance with some embodiments of the invention.

FIG. 14 is a process flow diagram of a process of determining a skill level-based skill proposition within a skill-based progressive interleaved wagering system in accordance with some embodiments of the invention. As illustrated, a skill proposition function 1402 generates a skill proposition 1404 with associated credit values. The skill proposition function 1402 receives as inputs, one or more skill proposition rules 1408, an amount of a progressive pool of credits 1406, and amounts of skill level data (1410*a*, 1410*b* and 1410*c*) from respective user subsystems. The skill data includes information on skill levels achieved by respective users of each of the subsystems. In operation, credits from a plurality of wagers of credits wagered in accordance with a wagering proposition of the user subsystems are received from the user subsystems and pooled in the progressive pool of credits. The wagers of credits are made by users (1412*a*, 1412*b*, 1412*c*) of the user subsystems (1414*a*, 1414*b*, 1414*c*) while interacting with the interactive applications of the user subsystems.

The skill proposition function 1402 receives, from the user subsystems, the skill level data of users, the skill level data associated with a skill-based interactive application of the user subsystems. In some embodiments, the skill level data is based on performance metrics taken during skillful interaction of a skill-based interactive application of the subsystems by the users during wagering of the wagers of credits. The skill proposition function generates the skill proposition 1404 using the skill level data and the skill proposition rules. The skill proposition 1404 includes a skill-based challenge of the interactive application of the user subsystems and an amount of the progressive pool of credits. The skill proposition provides the skill proposition to one or more of the plurality of user subsystems based on the plurality of respective skill level data. The user subsystems (1414*a*, 1414*b*, 1414*c*) also provide (1416*a*, 1416*b*, 1416*c*) credits to the progressive pool of credits 1406 during execution.

Figure 15A:
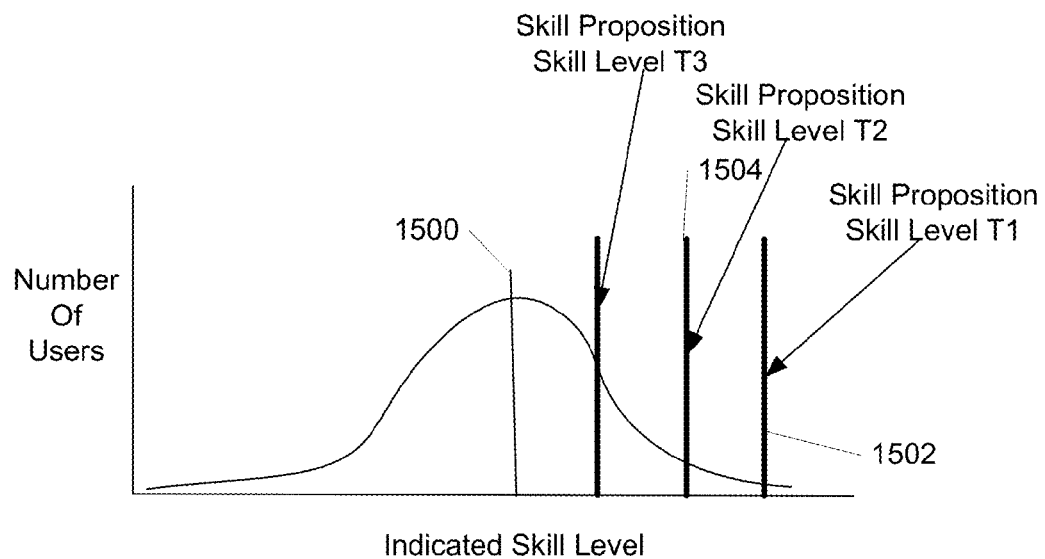
FIGS. 15A and 15B illustrate aspects of a skill-based progressive interleaved wagering system in accordance with some embodiments of the invention
Figure 15B:
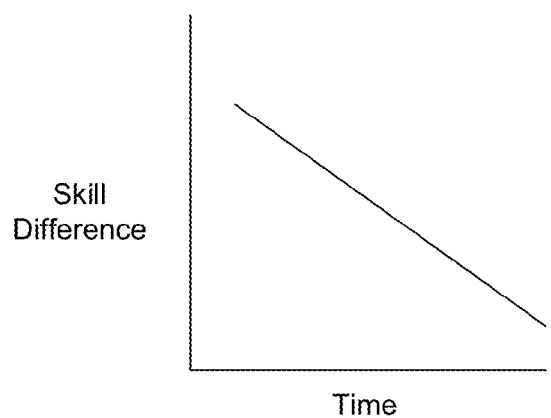

FIGS. 15A and 15B illustrate aspects of a process of determining a skill level-based skill proposition within a skill-based progressive interleaved wagering system in accordance with some embodiments of the invention.

FIG. 15A illustrates a number of users associated with an indicated skill level may resemble a distribution. In some embodiments, the distribution is a normal distribution. In some embodiments, the distribution is a triangular distribution. In some embodiments, the distribution is an exponential distribution. In some embodiments, the distribution is a beta distribution. In some embodiments, the distribution is a Cauchy distribution. In some embodiments, skill level thresholds are determined in order to classify users for the purpose of determining whether a user is eligible for the skill proposition.

In some embodiments, generating a skill proposition on the basis of the plurality of respective skill levels of the plurality of users and the progressive pool of credits includes determining an average skill level and a standard deviation for the plurality of respective skill levels of the plurality of users. A difficulty skill level is determined for the skill skill-based challenge using the average skill level and the standard deviation, and the skill-based challenge of the skill proposition is generated in accordance with the determined difficulty skill level.

Once skill level data is collected for a plurality of users, an average skill level for the users 1500 may be calculated for the collected skill level data. At a first time, a difficulty skill level 1502 for a skill-based challenge of a skill proposition may be determined that is much higher than the average skill level of the users. Consequently, the skill-based challenge will be very difficult for the average user to meet and that it is highly probable that none of the users currently playing the skill wagering interleaved games will be able to meet the skill-based challenge. If at a later time, it is determined that no users have been able to achieve the skill-based challenge, then a subsequent difficulty skill level 1504 for a subsequent skill-based challenge of a subsequent skill proposition may be determined having a difficulty skill level closer to the average user's skill level 1500. Consequently, the subsequent skill-based challenge will be easier to meet by more users. Such a process of generating subsequent skill propositions where each subsequent skill proposition has a skill-based challenge having a difficulty skill level closer to the average skill level of the users can be repeated indefinitely until one or more of the users meets a skill-based challenge of a skill proposition.

In some embodiments, a process of determining an appropriate difficulty skill level for a skill-based challenge includes calculating a standard deviation of the average skill level and using the standard deviation to determine the appropriate difficulty skill level.

In some embodiments, determining a difficulty skill level of a skill-based challenge of a skill proposition further includes determining an elapsed time from a start of pooling credits into a progressive pool of credits and determining the difficulty skill level of the skill-based challenge of the skill proposition using the elapsed time, whereby a magnitude of the difficulty skill level is inversely proportional to the elapsed time.

In various embodiments, generating the skill proposition further includes determining an elapsed time from a start of pooling credits into a progressive pool of credits, determining a difficulty skill level for a skill skill-based challenge of the skill proposition using the elapsed time, wherein a magnitude of the difficulty skill level is inversely proportional to the elapsed time, and generating the skill-based proposition in accordance with the difficulty skill level.

FIG. 15B illustrates an inversely proportional relationship of a skill level difference between a difficulty skill level of a skill-based challenge and an average skill level of users and time.

Figure 16:
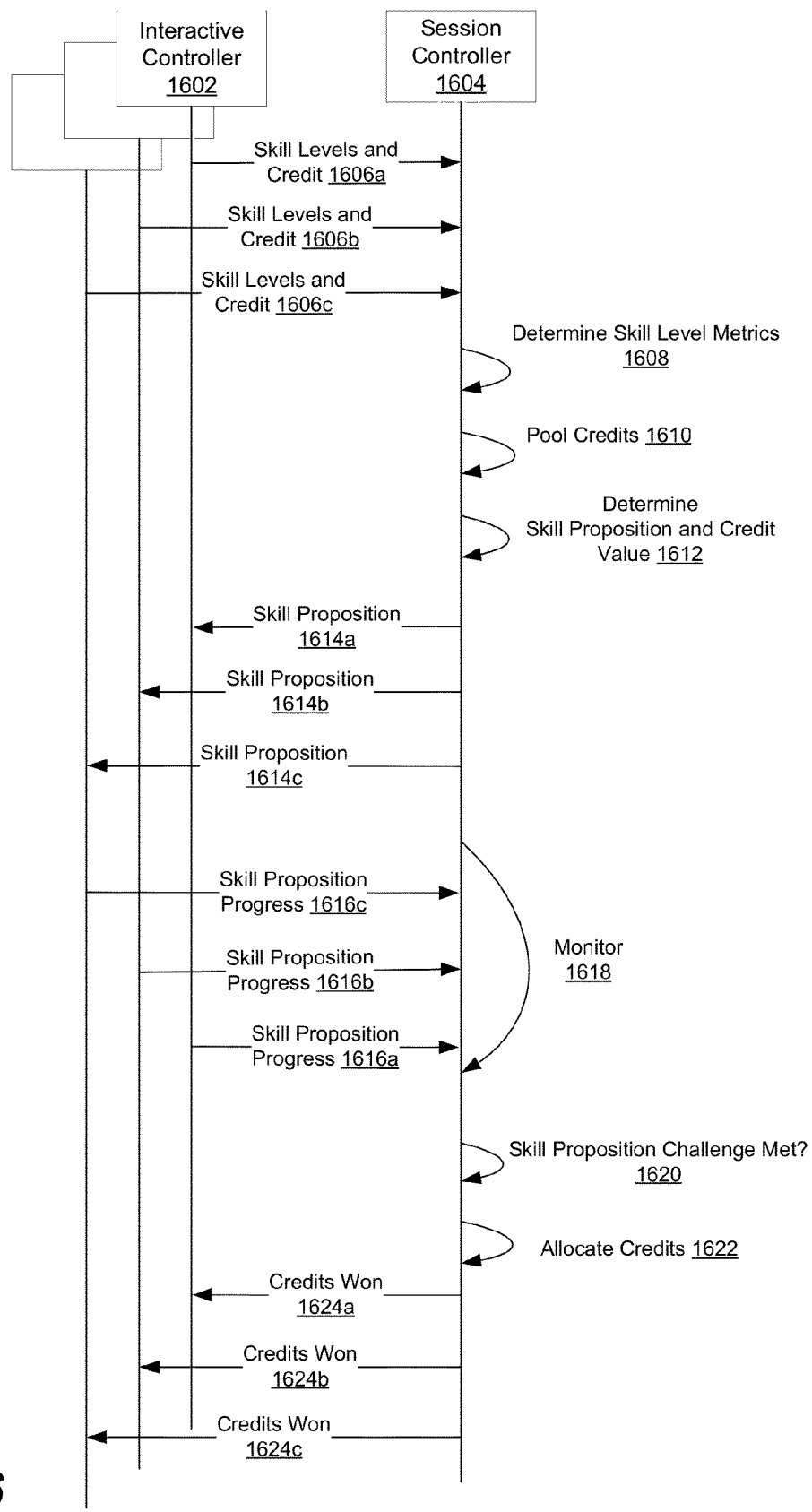
FIG. 16 is a sequence diagram of a process of determining a skill level-based skill proposition within a skill-based progressive interleaved wagering system in accordance with some embodiments of the invention.

FIG. 16 is a sequence diagram of a process of determining a skill level-based skill proposition within a skill-based progressive interleaved wagering system in accordance with some embodiments of the invention.

In some embodiments, the system includes one or more interactive controllers 1602, and a session controller 1604. In some embodiments, each interactive controller 1602 provides an interactive application. In some embodiments, the interactive application is an interactive game. In some embodiments, the interactive game is a skill-based game. In some embodiments, the interactive game is a chance-based game.

In some embodiments, each interactive controller 1602 is associated with a user. The interactive controller 1602 communicates, to the session controller 1604, skill level and credit information associated with the user (1606a).

In some embodiments, one or more other interactive controllers communicate, to the session controller 1604, skill level and credit information associated with one or more other users (1606b, 1606c).

The session controller 1604 receives, from the interactive controller 1602, the skill level and credit information associated with the user (1606a). The session controller 1604 scans the skill level and credit information to determine skill level metrics (1608). The session controller 1604 pools credits based on the skill level and credit information received (1610). The session controller 1604 determines a skill proposition and credit value based on the skill level and credit information associated with the user (1612).

In some embodiments, the session controller 1604 determines skill level metrics, pools credits, and determines the skill proposition and credit value based on the skill level and credit information associated with the one or more other users.

The session controller 1604 generates skill proposition instructions based on the determined skill proposition and credit value. The session controller 1604 instructs the interactive controller 1602 by communicating the skill proposition instructions to the interactive controller 1602 (1614a). In some embodiments, the session controller 1604 instructs the one or more other interactive controllers associated with the one or more other users by communicating the skill proposition instructions to the one or more other interactive controllers associated with the one or more other users (1614b, 1614c).

The interactive controller 1602 and the one or more other interactive controllers associated with the one or more other users provide the skill proposition to their respective users. The session controller 1604 monitors for skill proposition progress from the interactive controller 1602 and the one or more other interactive controllers associated with the one or more other users (1618).

As the user attempts to meet the skill-based challenge, the interactive controller 1602 communicates, to the session controller 1604, skill proposition progress information (1616a). In some embodiments, the one or more other interactive controllers associated with the one or more other users communicates skill proposition progress information to the session controller 1604 (1616b, 1616c).

The session controller 1604 receives, from the interactive controller 1602, the skill proposition progress information (1616a). In some embodiments, the session controller 1604 receives skill proposition progress information from the one or more other interactive controllers associated with the one or more other users (1616b, 1616c). The session controller 1604 determines whether the skill-based challenge has been met based on the skill proposition progress information (1620). When the challenge has been met, the session controller 1604 allocates an amount of the progressive pool of credits to one or more users (1622).

In some embodiments, when one or more interactive controllers communicate skill proposition progress information to the session controller 1604, the session controller 1604 determines whether a plurality of users have met the challenge and respective amounts of the amount of progressive pool of credits are allocated to the plurality of users that met the skill-based challenge. If only a single user has met the skill-based challenge, the session controller 1604 allocates all of the credits associated with the skill proposition to the single user that has met the challenge. If more than one user of the respective users has met the skill-based challenge, the session controller 1604 allocates credits associated with the skill proposition on the basis of how many users have met the skill-based challenge.

The session controller 1604 communicates, to the interactive controller 1602, credit data including the amount of credits won by the user (1624*a*). In some embodiments, when one or more other users associated with the one or more other interactive controllers has met the challenge, the session controller 1604 communicates credit data to the one or more other interactive controllers (1624*b*, 1624*c*).

The interactive controller 1602 receives, from the session controller 1604, the credit data (1624*a*). In some embodiments, the one or more other interactive controllers receive, from the session controller 1604, credit data (1624*b*, 1624*c*).

The interactive controller 1602 scans the credit data to determine the amount of credit awarded. The interactive controller 1602 displays the credit awarded.

A skill-based challenge of a skill proposition may take many forms. In some embodiments, where the interactive application of an interleaved wagering system is a racing game, the skill-based challenge of the skill proposition includes one or more racing challenges. In an example embodiment, racing challenges include, but are not limited to, completing one or more laps of a specified course within a specified elapsed time, completing a race within a specified placing, such as third or better, passing a specified number of racing opponents, etc. The difficulty skill level of the skill-based challenge may be adjusted to make the skill-based challenge easier or more difficult. In an example embodiment, an elapsed time requirement may be reduced to make completing one or more laps of a specified course more difficult, thus raising a skill difficulty level of a skill-based challenge, or an elapsed time may be increased to make completing one or more laps of a specified course less difficult, thus lowering a skill difficulty level of a skill-based challenge. In another example embodiment, lowering a required finish position in a race increases a skill difficulty level of a skill-based challenge of a skill-proposition, and increasing a required finish position lowers a skill difficulty level of a skill-based challenge of a skill-proposition. In another example embodiment, increasing a required number of passes in a race increases a skill difficulty level of a skill-based challenge of a skill-proposition, and decreasing a required number of passes in a race lowers a skill difficulty level of a skill-based challenge of a skill-proposition.

In some embodiments, where the interactive application of an interleaved wagering system is a role playing game, the skill-based challenge of the skill proposition includes one or more quest challenges. In an example embodiment, quest challenges include, but are not limited to, completing a specified quest within a specified elapsed time, accumulating a specified number of in-game items within a specified amount of time, achieving a leveling up of a character to a specified level, defeating a specific non-user character in battle, etc. In each example, the difficulty skill level of the skill-based challenge may be adjusted to make the skill-based challenge easier or more difficult. In another example embodiment, an elapsed time requirement may be reduced to make completing a quest within the elapsed time more difficult, thus raising a skill difficulty level of a skill-based challenge, or an elapsed time may be increased to make completing a quest within the elapsed time less difficult thus lowering a skill difficulty level of a skill-based challenge. In another example embodiment, increasing an amount of damage a non-user character may withstand increases a skill difficulty level of a skill-based challenge of a skill-proposition, and decreasing an amount of damage a non-user character may withstand lowers a skill difficulty level of a skill-based challenge of a skill-proposition. In another example embodiment, increasing a required number of levels while leveling up of a character increases a skill difficulty level of a skill-based challenge of a skill-proposition, and decreasing a required number of levels while leveling up of a character lowers a skill difficulty level of a skill-based challenge of a skill-proposition.

Figure 17:
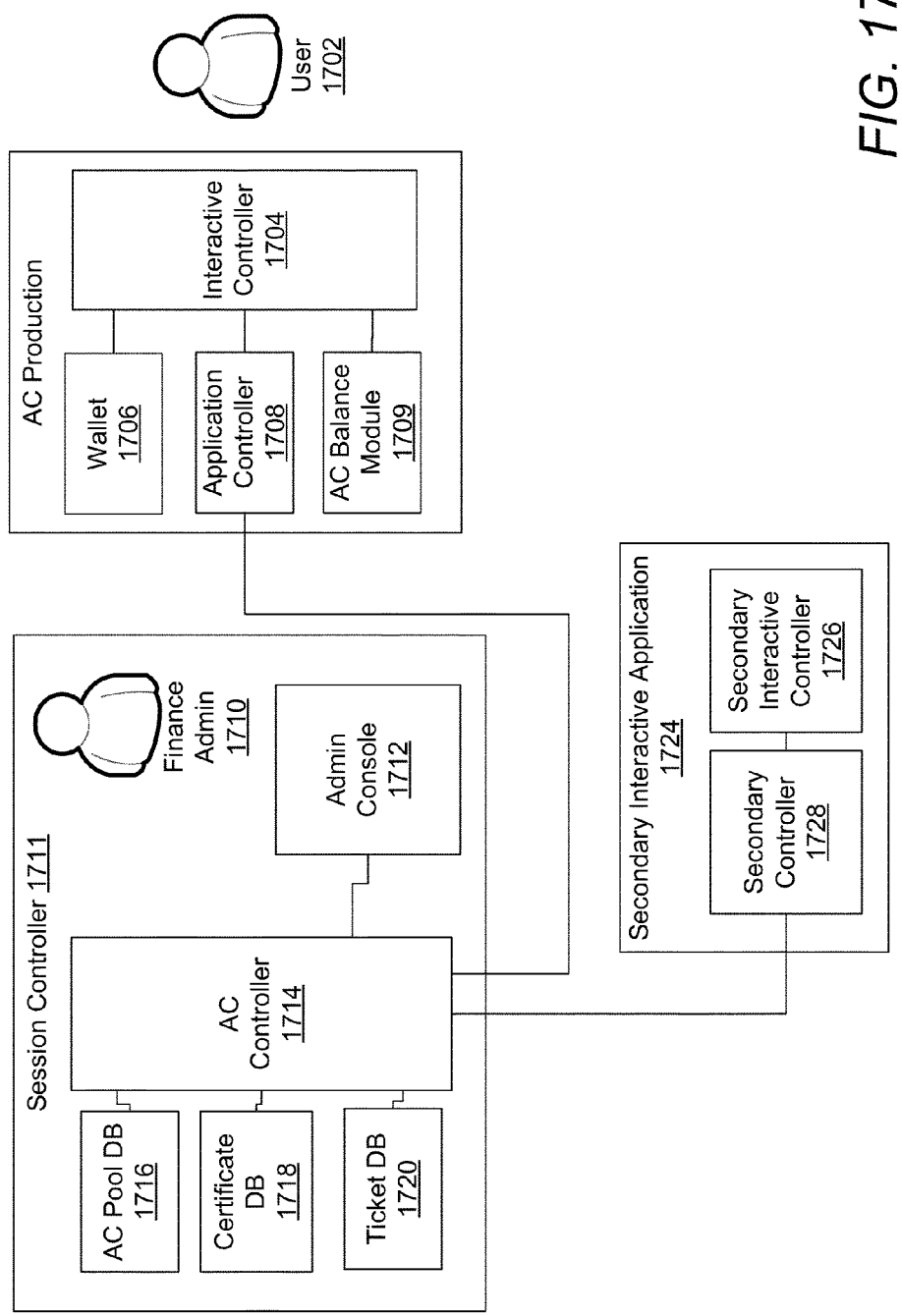
FIG. 17 illustrates elements of a skill-based progressive interleaved wagering system in accordance with some embodiments of the invention.

FIG. 17 illustrates elements of a skill-based progressive interleaved wagering system in accordance with some embodiments of the invention.

A user 1702 interacts with an interactive controller 1704 of the system, as described herein. The interactive controller 1704 is operatively connected to an application controller 1708, a wallet 1706, and an AC balance module 1709. The wallet 1706 manages credits associated with the user 1702, including real credits and virtual credits. In some embodiments, the wallet 1706 is managed by a wager controller. The AC balance module 1709 manages the balance of AC associated with the user 1702.

The user 1702 interacts with an interactive application provided by the interactive controller 1704. The interactive controller 1704 communicates application telemetry to the application controller 1708. The application controller 1708 receives, from the interactive controller 1704, the application telemetry. The application controller 1708 scans the application telemetry to determine whether to award AC to the user. In some embodiments, the application controller 1708 compares the application telemetry, or portions thereof, to a table associated with the interactive application to determine whether AC should be awarded.

In some embodiments, the application telemetry follows an application telemetry protocol. In some embodiments, the application telemetry protocol comprises an identification of the user. In some embodiments, the application telemetry protocol comprises an identification of the interactive application. In some embodiments, the application telemetry protocol comprises an action or event occurring in the interactive application. In some embodiments, the application telemetry protocol is a string. In some embodiments, the application telemetry protocol is an array of the elements making up the application telemetry. In some embodiments, the application telemetry protocol is a concatenation of the data of elements making up the application telemetry.

In an example embodiment, a table associated with an interactive application that is a racing game may indicate that 10 units of AC should be awarded when a car associated with the user completes a lap on a racing track. In the example embodiment, when the application telemetry indicates that a lap has been completed, the application controller determines, based on the table, that 10 units of AC should be awarded to the user.

When AC is awarded to the user 1702, the application controller 1708 communicates, to the interactive controller 1704, AC information associated with the awarded AC. In some embodiments, the application controller 1708 also communicates, to the interactive controller 1704, wager outcome information generated from a wager controller. The application controller 1704 communicates, to the AC balance module 1709, AC balance instructions based on the awarded AC. The AC balance module 1709 receives, from the application controller 1708, the AC balance instructions. The AC balance module 1709 increases an AC account associated with the user 1702 based on the AC balance instructions.

In some embodiments, the AC balance instructions follows an AC balance instructions protocol. In some embodiments, the AC balance instructions protocol comprises an identification of the user. In some embodiments, the AC balance instructions protocol comprises an identification of the interactive application. In some embodiments, the AC balance instructions protocol comprises an amount of AC to increase or decrease. In some embodiments, the AC balance instructions protocol is a string. In some embodiments, the AC balance instructions protocol is an array of the elements making up the AC balance instructions. In some embodiments, the AC balance instructions protocol is a concatenation of the data of elements making up the AC balance instructions.

The system includes a session controller 1711 which may be managed by a finance administrator 1710 and includes an admin console 1712, an AC controller 1714, a certificate database 1718, an AC pool database 1716, and a ticket database 1720.

The admin console 1712 is an interface for receiving input from the finance administrator 1710 for management of the session controller and the components therein. The admin console 1712 may provide a display of information regarding the amount of AC in the AC pool database 1716, the outstanding award certificates recoded in the certificate database 1718, and the ticket database 1720.

In some embodiments, AC is added to the AC pool database 1716 when the user 1702 deposits funds into the skill-based progressive interleaved wagering system. In some embodiments, when AC is awarded by the application controller 1708, to the user 1702, AC is added to the AC pool database 1716.

The application controller 1708 generates AC deposit instructions and instructs the AC controller 1714 by communicating, to the AC controller 1714, the AC deposit instructions. In some embodiments, the AC deposit instructions follows an AC deposit instructions protocol. In some embodiments, the AC deposit instructions protocol comprises an identification of the user. In some embodiments, the AC deposit instructions protocol comprises an identification of the interactive application. In some embodiments, the AC deposit instructions protocol comprises an amount of AC to increase. In some embodiments, the AC deposit instructions protocol is a string. In some embodiments, the AC deposit instructions protocol is an array of the elements making up the AC deposit instructions. In some embodiments, the AC deposit instructions protocol is a concatenation of the data of elements making up the AC deposit instructions.

The AC controller 1714 receives, from the application controller 1708, the AC deposit instructions. The AC controller 1714 communicates an indication to the AC pool database 1716 to increase the AC amount in the pool. The AC pool database 1716 receives the indication. In some embodiments, the indication to increase the AC amount includes an identification associated with the user 1702, and an amount of AC to contribute to the AC pool. The AC pool database 1716 stores AC acquired from one or more users, and increases or decreases the amount of AC in the pool based on instructions received from the AC controller 1714.

In some embodiments, the user 1702 may purchase a ticket for entry into a contest based on a secondary application. When the user 1702 purchases the ticket using AC balance associated with the user 1702 stored in the AC balance module 1709, the application controller 1708 communicates, to the AC controller 1714, a ticket purchase instruction. The application controller 1708 communicates, to the AC balance module 1709, AC balance modification instructions. The AC balance module 1709 receives, from the application controller 1708, the AC balance modification instructions. In some embodiments, when a ticket is received in exchange for AC, the AC balance modification instructions include instructions to decrease AC based on the communicating of the ticket purchase instruction.

The AC controller 1714 receives, from the application controller 1708, the ticket purchase instruction. The AC controller 1714 instructs the ticket database 1720 to generate a ticket associated with the user, based on the AC received from the user 1702. The ticket database 1720 receives the instruction from the AC controller 1714 and the ticket database 1720 generates the ticket based on the instructions received from the AC controller 1714. The ticket database 1720 communicates the ticket to the AC controller 1714, which communicates the ticket to the application controller 1708. The application controller 1708 receives, from the AC controller 1714, the ticket. The application controller 1708 scans the ticket to determine ticket information. The application controller 1708 generates ticket display instructions based on the ticket information. The application controller 1708 instructs the interactive controller 1704 by communicating the ticket display instructions to the interactive controller 1704. The interactive controller 1704 receives, from the application controller 1708, the ticket display instructions. The interactive controller 1704 displays ticket information based on the ticket display instructions. In some embodiments, the ticket is associated with the user, with a jurisdiction, an interactive application, or an operator.

In some embodiments, the ticket information follows a ticket information protocol. In some embodiments, the ticket information protocol comprises an identification of the user. In some embodiments, the ticket information protocol comprises an identification of the interactive application. In some embodiments, the ticket information protocol comprises an operator associated with the ticket. In some embodiments, the ticket information protocol is a string. In some embodiments, the ticket information protocol is an array of the elements making up the ticket information. In some embodiments, the ticket information protocol is a concatenation of the data of elements making up the ticket information.

The system also includes a secondary application subsystem 1724, which provides the user 1702 with a secondary interactive application for an opportunity to be awarded the AC pool or a portion of the AC pool managed by the AC pool database 1716. In some embodiments, the secondary interactive application is similar or identical in theme to the interactive application provided by the interactive controller 1704. In some embodiments, the secondary interactive application is different in theme and appearance to the interactive application provided by the interactive controller 1704.

The secondary interactive application is provided by the secondary interactive controller 1726. The secondary interactive controller 1726 is operatively connected to the secondary application controller 1728, which is operatively connected to the AC controller 1714 of the session controller 1711.

The secondary interactive controller application controller 1728 receives, from the AC controller 1714, an indication of one or more tickets available to the user 1702, based on the ticket database 1720. In some embodiments, the secondary application controller 1728 communicates, to the AC controller 1714, a ticket information request. The AC controller 1714 receives, from the secondary application controller 1728, the ticket information request. The AC controller 1714 communicates, to the ticket database 1720, the ticket information request. The ticket database 1720 receives, from the AC controller 1714, the ticket information request. The ticket database 1720 generates ticket information associated with the user 1702, which may include the number of tickets associated with the user 1702, and communicates the ticket information to the AC controller 1714. The AC controller 1714 receives, from the ticket database 1720, the ticket information, and communicates the ticket information to the secondary application controller 1728.

The secondary application controller 1728 receives, from the AC controller 1714, the ticket information. The secondary application controller 1728 scans the ticket information to determine the number of tickets associated with the user 1702. The secondary application controller 1728 generates ticket display instructions based on the number of tickets associated with the user 1702, and instructs the secondary interactive controller 1726 by communicating the ticket display instructions to the secondary interactive controller 1726. The secondary interactive controller 1726 displays the ticket information based on the ticket display instructions.

When the user 1702 would like to participate in a secondary application session, the user 1702 communicates, to the secondary interactive controller 1726, an indication to use a ticket. The secondary interactive controller 1726 receives, from the user 1702, the indication to use a ticket. The secondary interactive controller 1726 communicates, to the secondary application controller 1728, the indication to use the ticket. The secondary application controller 1728 receives, from the secondary interactive controller 1726, the indication to use the ticket. The secondary application controller 1728 communicates, to the AC controller 1714, the indication to use the ticket.

The AC controller 1714 receives, from the secondary application controller 1728, the indication to use the ticket. The AC controller 1714 generates ticket consumption instructions based on the indication to use the ticket. The AC controller 1714 instructs the ticket database 1720 by communicating the ticket consumption instructions to the ticket database 1720. The ticket database 1720 receives, from the AC controller 1714, the ticket consumption instructions. The ticket database 1720 decrements the number of tickets associated with the user 1702 based on the ticket consumption instructions. In some embodiments, each ticket has a unique ticket identifier, and the ticket consumption instructions include the ticket identifier associated with the ticket selected for use by the user 1702. The particular ticket is marked as being consumed, in the ticket database 1720. The secondary interactive controller 1726 provides, to the user, the secondary interactive application.

The secondary interactive controller 1726 receives input from the user 1702 and communicates, to the secondary application controller 1728, secondary telemetry. In some embodiments, the secondary telemetry follows a secondary telemetry protocol. In some embodiments, the secondary telemetry protocol comprises an identification of the user. In some embodiments, the secondary telemetry protocol comprises an identification of the interactive application. In some embodiments, the secondary telemetry protocol comprises an action or event occurring in the secondary interactive application. In some embodiments, the secondary telemetry protocol is a string. In some embodiments, the secondary telemetry protocol is an array of the elements making up the secondary telemetry. In some embodiments, the secondary telemetry protocol is a concatenation of the data of elements making up the secondary telemetry.

The secondary application controller 1728 receives, from the secondary interactive controller 1726, the secondary telemetry. The secondary application controller 1728 scans the secondary telemetry to determine whether AC should be awarded to the user 1702 from the AC pool database 1716. In some embodiments, the determination is made based on a predetermined threshold of values achieved by the user being met. In some embodiments, whether the values are met are based on the secondary telemetry.

When the secondary application controller 1728 determines AC should be awarded, the secondary application controller 1728 generates certificate creation instructions. The secondary application controller 1728 instructs the AC controller 1714 by communicating the certificate creation instructions to the AC controller 1714.

The AC controller 1714 receives, from the secondary application controller 1728, the certificate creation instructions. The AC controller 1714 communicates, to the certificate database 1718, the certificate creation instructions. The certificate database 1718 receives, from the AC controller 1714, the certificate creation instructions. The certificate database 1718 generates a certificate based on the certificate creation instructions. The certificate database 1718 communicates the certificate to the AC controller 1714.

The AC controller 1714 receives, from the certificate database 1718, the certificate. The AC controller 1714 communicates, to the application controller 1708, the certificate. The application controller 1708 receives, from the AC controller 1714, the certificate. The application controller 1708 scans the certificate to determine certificate information. In some embodiments, the application controller 1708 instructs the wallet 1706 to adjust value based on the certificate information. In some embodiments, the application controller 1708 instructs the AC balance module to adjust value based on the certificate information.

In some embodiments, the AC controller 1714 communicates, to the secondary application controller 1728, the certificate. The secondary application controller 1728 receives, from the AC controller 1714, the certificate. The secondary application controller 1728 scans the certificate to determine certificate information. The secondary application controller 1728 generates certificate display instructions based on the certificate information. The secondary application controller 1728 instructs the secondary interactive controller 1726 by communicating the certificate display instructions.

The secondary interactive controller 1726 receives, from the secondary application controller 1728, the certificate display instructions. The secondary interactive controller 1726 displays certificate information based on the certificate display instructions.

There may be multiple types of credits for use by the user. In some embodiments, the credits include wagered credits, loyalty points, and performance credits. In some embodiments, wagered credits include virtual credits and/or real currency credits. In some embodiments, loyalty points include points earned based on participation in a service or system. In some embodiments, performance points include application credits, as described herein.

In some embodiments, wagered credits are fungible credits responsible for wager return to player (RTPw). In some embodiments, value may be exchanged for wagered credits. In some embodiments, wagered credits may not be exchanged for value. In some embodiments, loyalty points are rewarded for wagering volume. In some embodiments, performance credits, such as AC, are a type of user point awarded for performance in an interactive application and can produce a return to player in the skill domain, if allowable.

In some embodiments, AC provides a unification methodology over different wagering formats, math, and territories. In some embodiments, these may include online real money gaming, online virtual currency play, on-premises mobile wagering, class-3 on-premises real money gaming, on-premises server based gaming, class-2 on premises real money gaming.

In some embodiments, the skill-based progressive interleaved wagering system is a combination of skill and chance. In some embodiments, the balance between skill and chance is adjustable and the user wagering domain is a spectrum between skill and chance. In some embodiments, a system may be heavily chance-based. In some embodiments, a system may be more skill-based. In some embodiments, the return to player may be precisely known in both domains and a blend of the two. In some embodiments, hold on a banked skill game may be precisely determined.

In some embodiments, in jurisdictions where skill impact on return to player (RTP) is not allowed, AC are funded out of non-gaming revenue for fixed and pre-determined prizes; AC are treated as the same type of credit as a promotional point (or loyalty point); and AC provide a perceived return through skill, albeit in a low hit frequency high volatility basis. In some embodiments, in jurisdictions where skill impact on RTP is allowed, AC are funded as a skill progressive; AC are involved in the RTP; there are 2 segments to RTP: RTP on the random chance proposition, and RTP on a skill challenge; and progressive funding allows for larger, flexed prizes related to wagering volume and can allow for more frequent returns through skill in the interactive application.

Figure 18:
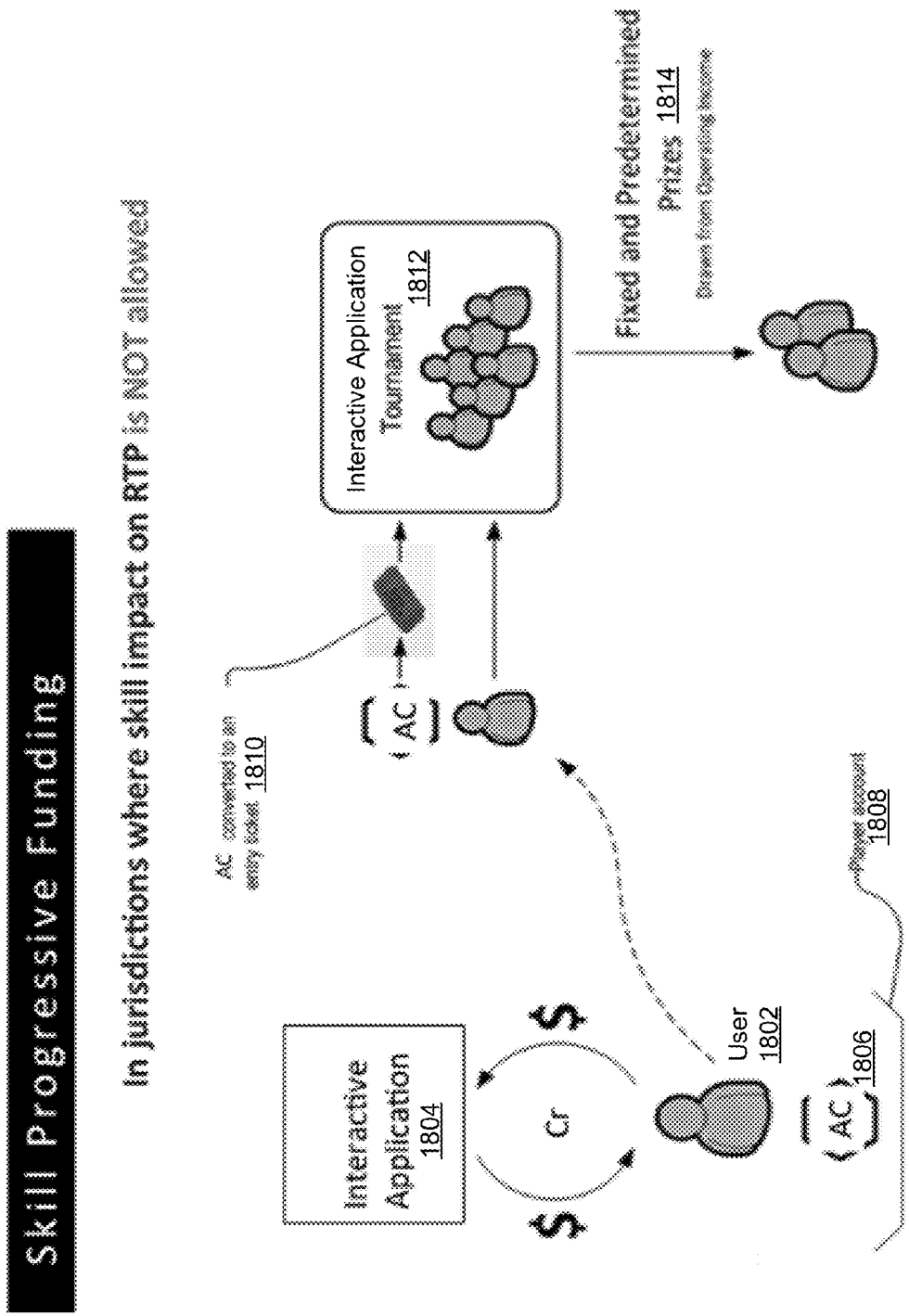
FIG. 18 illustrates features of a skill-based progressive interleaved wagering system in accordance with some embodiments of the invention.

FIG. 18 illustrates features of a skill-based progressive interleaved wagering system in accordance with some embodiments of the invention. The system operates in a jurisdiction where skill impact on RTP is not allowed. A user 1802 may be associated with a user account 1808 containing AC 1806. The user 1802 interacts with an interactive application 1804 and earns AC. The user 1802 may convert earned AC into an entry ticket 1810. The entry ticket 1810 may be used to gain entry into a tournament 1812. The user 1802 competes in the tournament for fixed and predetermined prizes 1814.

Figure 19:
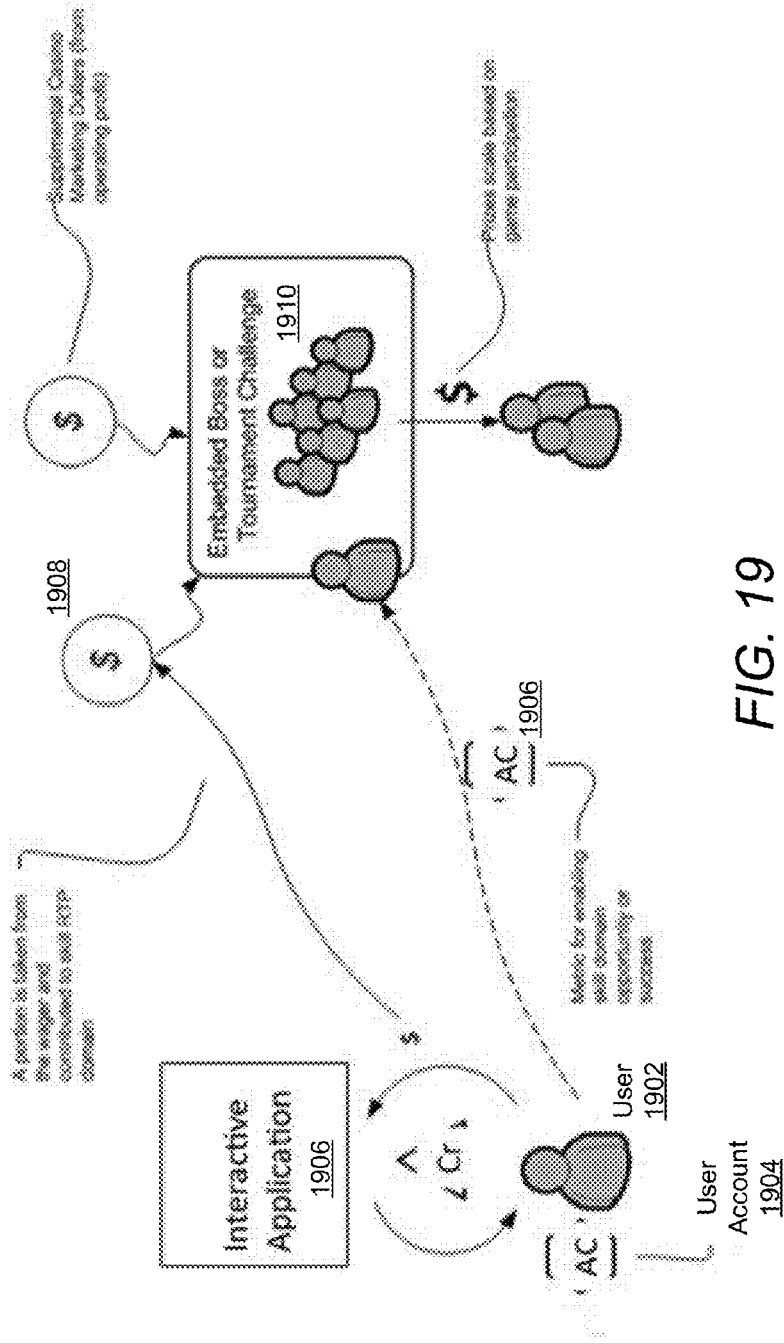
FIG. 19 illustrates features of a skill-based progressive interleaved wagering system in accordance with some embodiments of the invention.

FIG. 19 illustrates features of a skill-based progressive interleaved wagering system in accordance with some embodiments of the invention. The system operates in a jurisdiction where skill impact on RTP is allowed. A user 1902 may be associated with a user account 1904 containing AC. The user 1902 interacts with an interactive application 1906. A portion of each wager is contributed to a progressive pool 1908. The user contributes an amount of AC 1906 in order to participate in a secondary application such as a boss challenge or a tournament challenge 1910.

Figure 20:
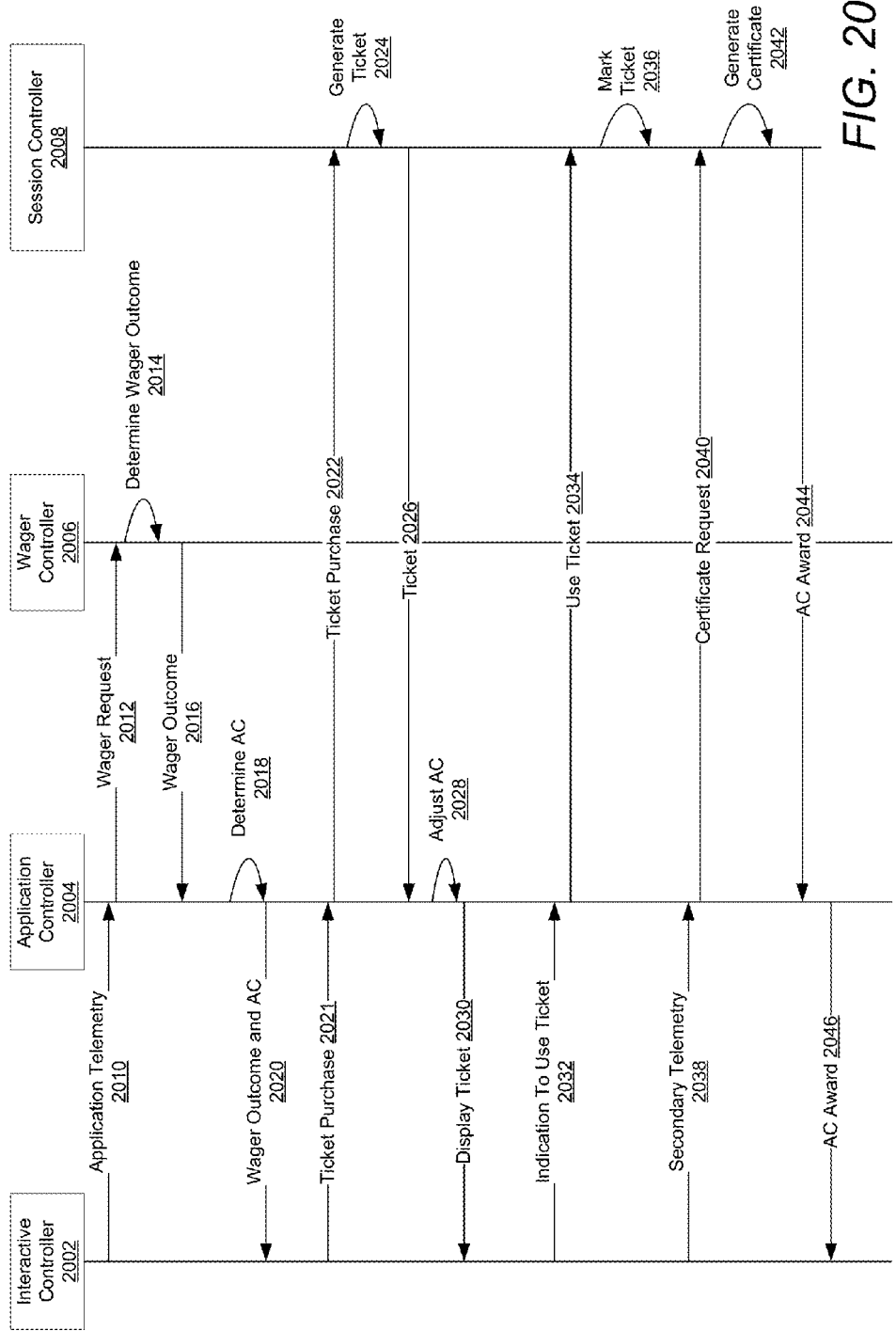
FIG. 20 illustrates elements of a skill-based progressive interleaved wagering system in accordance with some embodiments of the invention.

FIG. 20 illustrates elements of a skill-based progressive interleaved wagering system in accordance with some embodiments of the invention. The system includes an interactive controller 2002, an application controller 2004, a wager controller 2006, and a session controller 2008, each as described herein. In some embodiments, the interactive controller 2002 provides an interactive application. In some embodiments, the interactive application is an interactive game. In some embodiments, the interactive game is a skill-based game. In some embodiments, the interactive game is a chance-based game.

The user interacts with the interactive application provided by the interactive controller 2002. The interactive controller 2002 communicates application telemetry to the application controller 2004 (2010). The application controller 2004 receives, from the interactive controller 2002, the application telemetry (2010).

The application controller 2004 scans the application telemetry to determine whether to trigger a wager. When a wager is triggered, the application controller 2004 generates wager request instructions. The application controller 2004 instructs the wager controller 2006 by communicating the wager request instructions (2012). The wager controller 2006 receives, from the application controller 2004, the wager request instructions (2012). The wager controller 2006 determines a wager outcome based on the wager request instructions (2014). The wager controller 2006 communicates, to the application controller 2004, wager outcome data including the wager outcome (2016). The application controller 2004 receives, from the wager controller 2006, the wager outcome data (2016). The application controller 2004 scans the wager outcome data to determine the wager outcome.

The application controller 2004 scans the application telemetry to determine whether to award AC to the user (2018). In some embodiments, the application controller 2004 compares the application telemetry, or portions thereof, to a table associated with the interactive application to determine whether AC should be awarded. In some embodiments, the application telemetry follows an application telemetry protocol. In some embodiments, the application telemetry protocol comprises an identification of the user. In some embodiments, the application telemetry protocol comprises an identification of the interactive application. In some embodiments, the application telemetry protocol comprises an action or event occurring in the interactive application. In some embodiments, the application telemetry protocol is a string. In some embodiments, the application telemetry protocol is an array of the elements making up the application telemetry. In some embodiments, the application telemetry protocol is a concatenation of the data of elements making up the application telemetry.

When AC is awarded to the user, the application controller 2004 communicates, to the interactive controller 2002, AC information associated with the awarded AC (2020). In some embodiments, the application controller 2004 also communicates, to the interactive controller 2002, the wager outcome. The interactive controller 2002 receives, from the application controller 2004, the wager outcome and AC information (2020).

The user may purchase a ticket for entry into a contest based on a secondary application. When the user purchases the ticket using AC balance associated with the user, the interactive controller 2002 communicates, to the application controller 2004, an indication to purchase the ticket (2021). The application controller 2004 receives, from the interactive controller 2002, the indication to purchase the ticket (2021).

The application controller 2004 scans the indication to purchase a ticket to determine ticket purchase information. The application controller 2004 generates ticket purchase instructions based on the ticket purchase information. The application controller 2004 instructs the session controller 2008 by communicating the ticket purchase instructions to the session controller 2008 (2022).

The session controller 2008 receives, from the application controller 2004, the ticket purchase instructions (2022). The session controller 2008 generates the ticket based on the ticket purchase instructions (2024). The session controller 2008 communicates the ticket to the application controller 2004 (2026). The application controller 2004 receives, from the session controller 2008, the ticket (2026).

The application controller 2004 scans the ticket to determine ticket information. The application controller 2004 updates AC information associated with the user based on the ticket information (2028). In some embodiments, an AC value associated with the ticket is deducted from an AC value associated with the user.

The application controller 2004 generates ticket display instructions based on the ticket information. The application controller 2004 instructs the interactive controller 2002 by communicating the ticket display instructions to the interactive controller 2002 (2030). The interactive controller 2002 receives, from the application controller 2004, the ticket display instructions (2030). The interactive controller 2002 displays ticket information based on the ticket display instructions. In some embodiments, the ticket is associated with the user, with a jurisdiction, an interactive application, or an operator.

In some embodiments, the ticket information follows a ticket information protocol. In some embodiments, the ticket information protocol comprises an identification of the user. In some embodiments, the ticket information protocol comprises an identification of the interactive application. In some embodiments, the ticket information protocol comprises an operator associated with the ticket. In some embodiments, the ticket information protocol is a string. In some embodiments, the ticket information protocol is an array of the elements making up the ticket information. In some embodiments, the ticket information protocol is a concatenation of the data of elements making up the ticket information.

When the user would like to participate in a secondary application session, the user communicates, to the interactive controller 2002, an indication to use a ticket. The interactive controller 2002 receives, from the user, the indication to use the ticket. The interactive controller 2002 communicates, to the application controller 2004, the indication to use the ticket (2032). The application controller 2004 receives, from the interactive controller 2002, the indication to use the ticket (2032). The application controller 2004 scans the indication to use the ticket to determine ticket consumption information. The application controller 2004 generates ticket consumption instructions based on the ticket consumption information. The application controller 2004 instructs the session controller 2008 by communicating, to the session controller 2008, ticket consumption instructions (2034).

The session controller 2008 receives, from the application controller 2004, the ticket consumption instructions (2034). The session controller 2008 decrements the number of tickets associated with the user based on the ticket consumption instructions (2036). In some embodiments, each ticket has a unique ticket identifier, and the ticket consumption instructions include the ticket identifier associated with the ticket selected for use by the user. The particular ticket is marked as being consumed, in a ticket database. The interactive controller 2002 provides, to the user, the secondary application.

The interactive controller 2002 receives input from the user and communicates, to the application controller 2004, secondary telemetry (2038). In some embodiments, the secondary telemetry follows a secondary telemetry protocol. In some embodiments, the secondary telemetry protocol comprises an identification of the user. In some embodiments, the secondary telemetry protocol comprises an identification of the interactive application. In some embodiments, the secondary telemetry protocol comprises an action or event occurring in the secondary interactive application. In some embodiments, the secondary telemetry protocol is a string. In some embodiments, the secondary telemetry protocol is an array of the elements making up the secondary telemetry. In some embodiments, the secondary telemetry protocol is a concatenation of the data of elements making up the secondary telemetry.

The application controller 2004 receives, from the interactive controller 2002, the secondary telemetry (2038). The application controller 2004 scans the secondary telemetry to determine whether AC should be awarded to the user from a progressive pool of AC. In some embodiments, one or more users contribute to the progressive pool of AC. In some embodiments, a sponsor contributes AC to the progressive pool of AC. In some embodiments, the determination of whether AC should be awarded to the use is made based on a predetermined threshold of values achieved by the user being met. In some embodiments, whether the values are met are based on the secondary telemetry.

When the application controller 2004 determines AC should be awarded from the progressive pool of AC, the application controller 2004 generates certificate creation instructions. The application controller 2004 instructs the session controller 2008 by communicating the certificate creation instructions to the session controller 2008 (2040).

The session controller 2008 receives, from the application controller 2004, the certificate creation instructions (2040). The session controller 2008 generates a certificate based on the certificate creation instructions (2042). The session controller 2008 communicates, to the application controller 2004, the certificate (2044). In some embodiments, the certificate follows a certificate protocol. In some embodiments, the certificate protocol comprises an identification of the user. In some embodiments, the certificate protocol comprises an identification of the interactive application. In some embodiments, the certificate protocol comprises an amount of AC awarded. In some embodiments, the certificate protocol is a string. In some embodiments, the certificate protocol is an array of the elements making up the certificate. In some embodiments, the certificate protocol is a concatenation of the data of elements making up the certificate.

The application controller 2004 receives, from the session controller 2008, the certificate (2044). The application controller 2004 scans the certificate to determine certificate information. In some embodiments, the application controller 2004 adjusts AC value associated with the user based on the certificate information.

The application controller 2004 generates certificate display instructions based on the certificate information. The application controller 2004 instructs the interactive controller 2002 by communicating the certificate display instructions (2046).

The interactive controller 2002 receives, from the application controller 2004, the certificate display instructions (2046). The interactive controller 2002 displays certificate information based on the certificate display instructions.

While the above description may include many specific embodiments of the invention, these should not be construed as limitations on the scope of the invention, but rather as examples of embodiments thereof. It is therefore to be understood that the present invention can be practiced otherwise than specifically described, without departing from the scope and spirit of the present invention. Thus, embodiments of the present invention described herein should be considered in all respects as illustrative and not restrictive.

What is claimed:

1. A skill-based progressive interleaved wagering system, comprising:
an interactive controller operatively connected to an application controller, the interactive controller configured to:
accept input from a user via an input device;
distribute, to the application controller, application telemetry associated with an interactive application provided by the interactive controller, the application telemetry associated with the user;
receive, from the application controller, application credit (AC) information and a wager outcome, wherein AC is awarded based on the application telemetry, and wherein determining of the wager outcome is triggered by the application telemetry;
distribute, to the application controller, an indication to purchase a ticket, wherein the ticket is associated with an AC value and redeemable for a secondary application session;
receive, from the application controller, ticket display instructions;
display ticket information associated with the ticket based on the ticket display instructions via an output device;
distribute, to the application controller, an indication to use the ticket;
provide, to the user, a secondary application;
distribute, to the application controller, secondary telemetry associated with the secondary application;
receive, from the application controller, certificate display instructions, wherein a certificate is associated with an AC award based on the secondary telemetry; and
display certificate information based on the certificate display instructions via the output device;
a wager controller operatively connected to the application controller, the wager controller constructed to:
receive, from the application controller, wager request instructions;
determine the wager outcome based on the wager request instructions request using a random number generator;
distribute, to the application controller, wager outcome data comprising the wager outcome; and
the application controller operatively connecting the interactive controller and the wager controller, and operatively connected to a session controller, the application controller constructed to:
receive, from the interactive controller, the application telemetry;
scan the application telemetry to determine whether to trigger a wager;
when a wager is triggered, generate wager request instructions;
instruct the wager controller by distributing the wager request instructions to the wager controller;
receive, from the wager controller, the wager outcome data;
scan the wager outcome data to determine the wager outcome;
scan the application telemetry to determine whether to award AC to the user;
when AC is awarded to the user, communicate, to the interactive controller, the AC information and the wager outcome;
receive, from the interactive controller, the indication to purchase the ticket;
scan the indication to purchase the ticket to determine ticket purchase information;
generate ticket purchase instructions based on the ticket purchase information;
instruct the session controller by distributing the ticket purchase instructions to the session controller;
receive, from the session controller, the ticket;
scan the ticket to determine ticket information;
generate the ticket display instructions based on the ticket information;
instruct the interactive controller by distributing the ticket display instructions to the interactive controller;
receive, from the interactive controller, the indication to use the ticket;
scan the indication to use the ticket to determine ticket consumption information;
generate ticket consumption instructions based on the ticket consumption information;
instruct the session controller by distributing, to the session controller, ticket consumption instructions;
receive, from the interactive controller, the secondary telemetry;
scan the secondary telemetry to determine whether AC should be awarded to the user from a progressive pool of AC;
when AC should be awarded from the progressive pool of AC, generate certificate creation instructions;
instruct the session controller by distributing the certificate creation instructions to the session controller;
receive, from the session controller, the certificate;
scan the certificate to determine certificate information;
generate certificate display instructions based on the certificate information; and
instruct the interactive controller by distributing the certificate display instructions to the interactive controller.

2. The skill-based progressive interleaved wagering system of claim 1,
wherein the interactive controller and the application controller are constructed from the same device, and
wherein the application controller is operatively connected to the wager controller using a communication link.

3. The skill-based progressive interleaved wagering system of claim 1,
wherein the wager controller and the application controller are constructed from the same device, and
wherein the application controller is operatively connected to the interactive controller using a communication link.

4. The skill-based progressive interleaved wagering system of claim 1, wherein one or more users contribute to the progressive pool of AC.

5. The skill-based progressive interleaved wagering system of claim 4, wherein the one or more users contribute a portion of AC awarded based on application telemetry, to the progressive pool of AC by distributing the portion to the session controller.

6. The skill-based progressive interleaved wagering system of claim 1, wherein a sponsor contributes AC to the progressive pool of AC.

7. The skill-based progressive interleaved wagering system of claim 1, wherein the ticket is associated with a jurisdiction.

8. The skill-based progressive interleaved wagering system of claim 1, wherein the ticket is associated with an operator.

9. A skill-based progressive interleaved wagering system, comprising:
a wager controller of the skill-based progressive interleaved wagering system operatively connected to an application controller, the wager controller constructed to:
receive, from the application controller, wager request instructions;
determine a wager outcome based on the wager request instructions using a random number generator;
distribute, to the application controller, wager outcome data comprising the wager outcome; and
the application controller of the skill-based progressive interleaved wagering system operatively connecting the wager controller to an interactive controller using a communication link, and operatively connected to a session controller, the application controller constructed to:
receive, from the interactive controller, application telemetry associated with an interactive application provided by the interactive controller, the application telemetry associated with a user;
scan the application telemetry to determine whether to trigger a wager;
when a wager is triggered, generate wager request instructions;
instruct the wager controller by distributing the wager request instructions to the wager controller;
receive, from the wager controller, the wager outcome data;
scan the wager outcome data to determine the wager outcome;
scan the application telemetry to determine whether to award application credit (AC) to the user based on the application telemetry;
when AC is awarded to the user, communicate, to the interactive controller, the AC information and the wager outcome;
receive, from the interactive controller, an indication to purchase a ticket, wherein the ticket is associated with an AC value and redeemable for a secondary application session;
scan the indication to purchase the ticket to determine ticket purchase information;
generate ticket purchase instructions based on the ticket purchase information;
instruct the session controller by distributing the ticket purchase instructions to the session controller;
receive, from the session controller, the ticket;
scan the ticket to determine ticket information;
generate ticket display instructions based on the ticket information;
instruct the interactive controller by distributing the ticket display instructions to the interactive controller;
receive, from the interactive controller, an indication to use the ticket;
scan the indication to use the ticket to determine ticket consumption information;
generate ticket consumption instructions based on the ticket consumption information;
instruct the session controller by distributing, to the session controller, ticket consumption instructions;
receive, from the interactive controller, secondary telemetry associated with a secondary application provided by the interactive controller;
scan the secondary telemetry to determine whether AC should be awarded to the user from a progressive pool of AC;
when AC should be awarded from the progressive pool of AC, generate certificate creation instructions;
instruct the session controller by distributing the certificate creation instructions to the session controller;
receive, from the session controller, the certificate;
scan the certificate to determine certificate information;
generate certificate display instructions based on the certificate information; and
instruct the interactive controller by distributing the certificate display instructions to the interactive controller.

10. The skill-based progressive interleaved wagering system of claim 9, wherein one or more users contribute to the progressive pool of AC.

11. The skill-based progressive interleaved wagering system of claim 10, wherein the one or more users contribute a portion of AC awarded based on application telemetry, to the progressive pool of AC by distributing the portion to the session controller.

12. The skill-based progressive interleaved wagering system of claim 9, wherein a sponsor contributes AC to the progressive pool of AC.

13. The skill-based progressive interleaved wagering system of claim 9, wherein the ticket is associated with a jurisdiction.

14. The skill-based progressive interleaved wagering system of claim 9, wherein the ticket is associated with an operator.

15. A skill-based progressive interleaved wagering system, comprising:
an interactive controller of the skill-based progressive interleaved wagering system operatively connected to an application controller, the interactive controller configured to:
accept input from a user via an input device;
distribute, to the application controller, application telemetry associated with an interactive application provided by the interactive controller, the application telemetry associated with the user;
receive, from the application controller, application credit (AC) information and a wager outcome, wherein AC is awarded based on the application telemetry, and determining of the wager outcome is triggered by the application telemetry;
distribute, to the application controller, an indication to purchase a ticket, wherein the ticket is associated with an AC value and redeemable for a secondary application session;
receive, from the application controller, ticket display instructions;
display ticket information associated with the ticket based on the ticket display instructions via an output device;
distribute, to the application controller, an indication to use the ticket;
provide, to the user, the secondary application;
distribute, to the application controller, secondary telemetry associated with the secondary application;

receive, from the application controller, certificate display instructions, wherein a certificate is associated with an AC award based on the secondary telemetry; and display certificate information based on the certificate display instructions via the output device; and the application controller of the skill-based progressive interleaved wagering system operatively connecting the interactive controller to a wager controller, and operatively connected to a session controller, the application controller constructed to:

receive, from the interactive controller, the application telemetry;

scan the application telemetry to determine whether to trigger a wager;

when a wager is triggered, generate wager request instructions;

instruct the wager controller by distributing the wager request instructions to the wager controller;

receive, from the wager controller, the wager outcome data outcome generated using a random number generator;

scan the wager outcome data to determine the wager outcome;

scan the application telemetry to determine whether to award AC to the user;

when AC is awarded to the user, distribute, to the interactive controller, the AC information and the wager outcome;

receive, from the interactive controller, the indication to purchase the ticket;

scan the indication to purchase the ticket to determine ticket purchase information;

generate ticket purchase instructions based on the ticket purchase information;

instruct the session controller by distributing the ticket purchase instructions to the session controller;

receive, from the session controller, the ticket;

scan the ticket to determine ticket information;

generate ticket display instructions based on the ticket information;

instruct the interactive controller by distributing the ticket display instructions to the interactive controller;

receive, from the interactive controller, the indication to use the ticket;

scan the indication to use the ticket to determine ticket consumption information;

generate ticket consumption instructions based on the ticket consumption information;

instruct the session controller by distributing, to the session controller, ticket consumption instructions;

receive, from the interactive controller, the secondary telemetry;

scan the secondary telemetry to determine whether AC should be awarded to the user from a progressive pool of AC;

when AC should be awarded from the progressive pool of AC, generate certificate creation instructions;

instruct the session controller by distributing the certificate creation instructions to the session controller;

receive, from the session controller, the certificate;

scan the certificate to determine certificate information;

generate certificate display instructions based on the certificate information; and instruct the interactive controller by distributing the certificate display instructions to the interactive controller.

16. The skill-based progressive interleaved wagering system of claim 15, wherein one or more users contribute to the progressive pool of AC.

17. The skill-based progressive interleaved wagering system of claim 16, wherein the one or more users contribute a portion of AC awarded based on application telemetry, to the progressive pool of AC by distributing the portion to the session controller.

18. The skill-based progressive interleaved wagering system of claim 15, wherein a sponsor contributes AC to the progressive pool of AC.

19. The skill-based progressive interleaved wagering system of claim 15, wherein the ticket is associated with a jurisdiction.

20. The skill-based progressive interleaved wagering system of claim 15, wherein the ticket is associated with an operator.

* * * * *